(12) United States Patent
Lu et al.

(10) Patent No.: US 12,349,361 B2
(45) Date of Patent: Jul. 1, 2025

(54) FERROELECTRIC MEMORY DEVICE AND METHOD OF FORMING THE SAME

(71) Applicant: Taiwan Semiconductor Manufacturing Company, Ltd., Hsin-Chu (TW)

(72) Inventors: Chun-Chieh Lu, Taipei (TW); Sai-Hooi Yeong, Zhubei (TW); Yu-Ming Lin, Hsinchu (TW); Mauricio Manfrini, Zhubei (TW); Georgios Vellianitis, Heverlee (BE)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 236 days.

(21) Appl. No.: 18/077,558

(22) Filed: Dec. 8, 2022

(65) Prior Publication Data

US 2023/0106816 A1    Apr. 6, 2023

Related U.S. Application Data

(63) Continuation of application No. 17/130,609, filed on Dec. 22, 2020, now Pat. No. 11,527,552.

(Continued)

(51) Int. Cl.
*H10B 51/20*    (2023.01)
*H10B 51/00*    (2023.01)
(Continued)

(52) U.S. Cl.
CPC ............ *H10B 51/20* (2023.02); *H10B 51/00* (2023.02); *H10B 51/10* (2023.02); *H10B 51/30* (2023.02);

(Continued)

(58) Field of Classification Search
CPC ........ H10B 51/00; H10B 51/10; H10B 51/20; H10B 51/30; H01L 29/516; H01L 29/6684; H10D 30/0415; H10D 64/689
See application file for complete search history.

(56) References Cited

U.S. PATENT DOCUMENTS

| | | |
|---|---|---|
| 10,403,631 B1 | 9/2019 | Lu et al. |
| 2016/0071860 A1 | 3/2016 | Kai et al. |

(Continued)

FOREIGN PATENT DOCUMENTS

| | | |
|---|---|---|
| KR | 20180059271 A | 6/2018 |
| WO | 02091473 A1 | 11/2002 |
| WO | 2018236256 A1 | 12/2018 |

OTHER PUBLICATIONS

Notice of Allowance dated Jul. 27, 2022 for U.S. Appl. No. 17/130,609.

(Continued)

*Primary Examiner* — Matthew E Warren
(74) *Attorney, Agent, or Firm* — Eschweiler & Potashnik, LLC

(57) ABSTRACT

A ferroelectric memory device includes a multi-layer stack, a channel layer and a III-V based ferroelectric layer. The multi-layer stack is disposed on a substrate and includes a plurality of conductive layers and a plurality of dielectric layers stacked alternately. The channel layer penetrates through the plurality of conductive layers and the plurality of dielectric layers of the multi-layer stack. The III-V based ferroelectric layer is disposed between the channel layer and the multi-layer stack, and includes at least one element selected from Group III elements, at least one element selected from Group V elements, and at least one element selected from transition metal elements.

20 Claims, 55 Drawing Sheets

Related U.S. Application Data

(60) Provisional application No. 63/031,049, filed on May 28, 2020.

(51) Int. Cl.
  *H10B 51/10*  (2023.01)
  *H10B 51/30*  (2023.01)
  *H10D 30/01*  (2025.01)
  *H10D 64/68*  (2025.01)

(52) U.S. Cl.
  CPC ....... *H10D 30/0415* (2025.01); *H10D 64/689* (2025.01)

(56) References Cited

U.S. PATENT DOCUMENTS

| | | | |
|---|---|---|---|
| 2016/0181259 A1* | 6/2016 | Van Houdt | H10B 51/30 257/295 |
| 2018/0350940 A1 | 12/2018 | Yoo | |
| 2020/0075631 A1 | 3/2020 | Dong et al. | |
| 2021/0242240 A1 | 8/2021 | Young et al. | |
| 2021/0327888 A1* | 10/2021 | Wang | H01L 28/55 |
| 2021/0391355 A1 | 12/2021 | Lill et al. | |

OTHER PUBLICATIONS

Fichtner et al. "AlScN: A II-V semiconductor based ferroelectric" J. Appl. Phys. 125, 114103 (2019), published on Mar. 18, 2019.
Fichtner et al. "Supplementary Material—AlScN: A III-V semiconductor based ferroelectric" J. Appl. Phys. 125, 114103 (2019), published on Mar. 18, 2019.

* cited by examiner

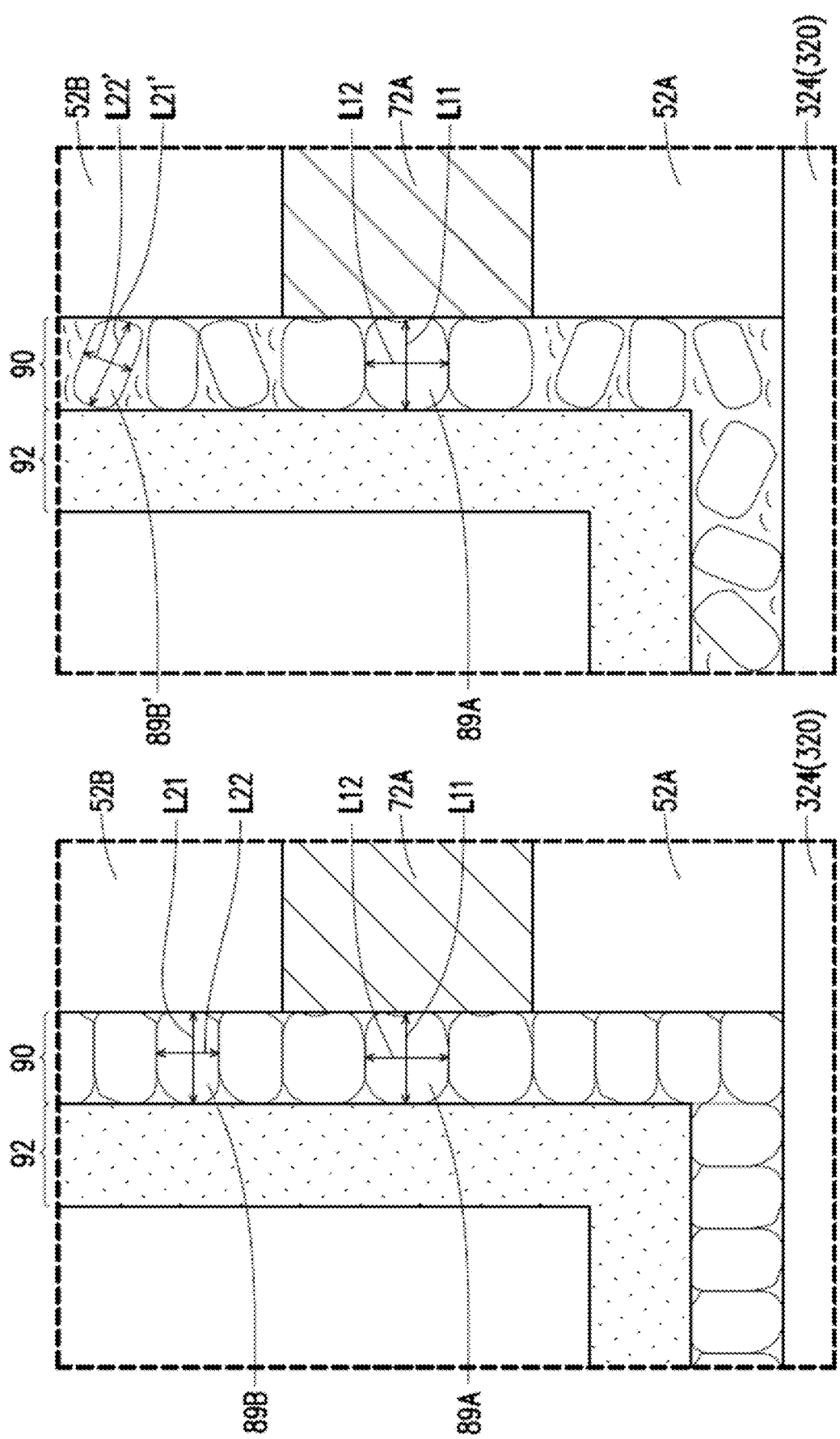

FERROELECTRIC MEMORY DEVICE AND METHOD OF FORMING THE SAME

CROSS-REFERENCE TO RELATED APPLICATIONS

This Application is a Continuation of U.S. application Ser. No. 17/130,609, filed on Dec. 22, 2020, which claims the benefit of U.S. Provisional Application No. 63/031,049, filed on May 28, 2020. The contents of the above-referenced Patent Applications are hereby incorporated by reference in their entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, 8, 9, 10, 11, 12, 13, 14, 15, 16A, 16B, 17A, 17B, 18A, 18B, 19A, 19B, 19C, 19D, 19E, 20A, 20B, 20C, 20D, 20E, 22, 23, 24, 25A, 25B, 26A, 26B, 27A, 27B, 28A, 28B, 29A, 29B, 30A, 30B, 30C, 30D and 30E illustrate varying views of manufacturing a ferroelectric memory device in accordance with some embodiments.

DETAILED DESCRIPTION

Figure 1A:
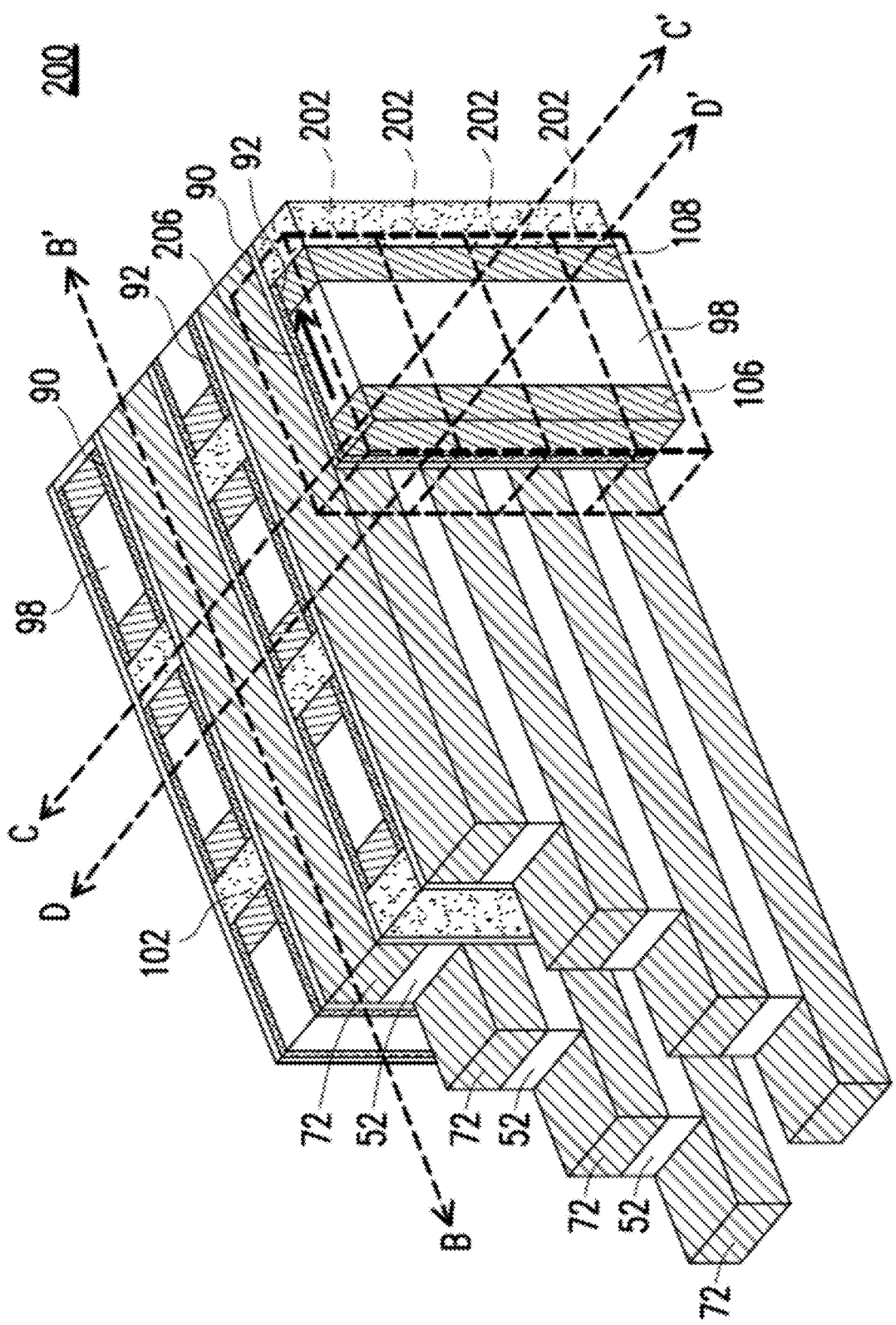
FIGS. 1A, 1B, and 1C illustrate a simplified perspective view, a circuit diagram, and a top down view of a ferroelectric memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a memory device such as a 3D memory array. In some embodiments, the 3D memory array is a ferroelectric field effect transistor (FeFET) memory including a plurality of vertically stacked memory cells. In some embodiments, respective memory cells are regarded as a FeFET that includes a word line region acting as a gate electrode, a bit line region acting as a first source/drain electrode, and a source line region acting as a second source/drain electrode, a ferroelectric material as a gate dielectric, and an oxide semiconductor (OS) as a channel region. In some embodiments, respective memory cells are regarded as a thin film transistor (TFT).

Figure 1B:
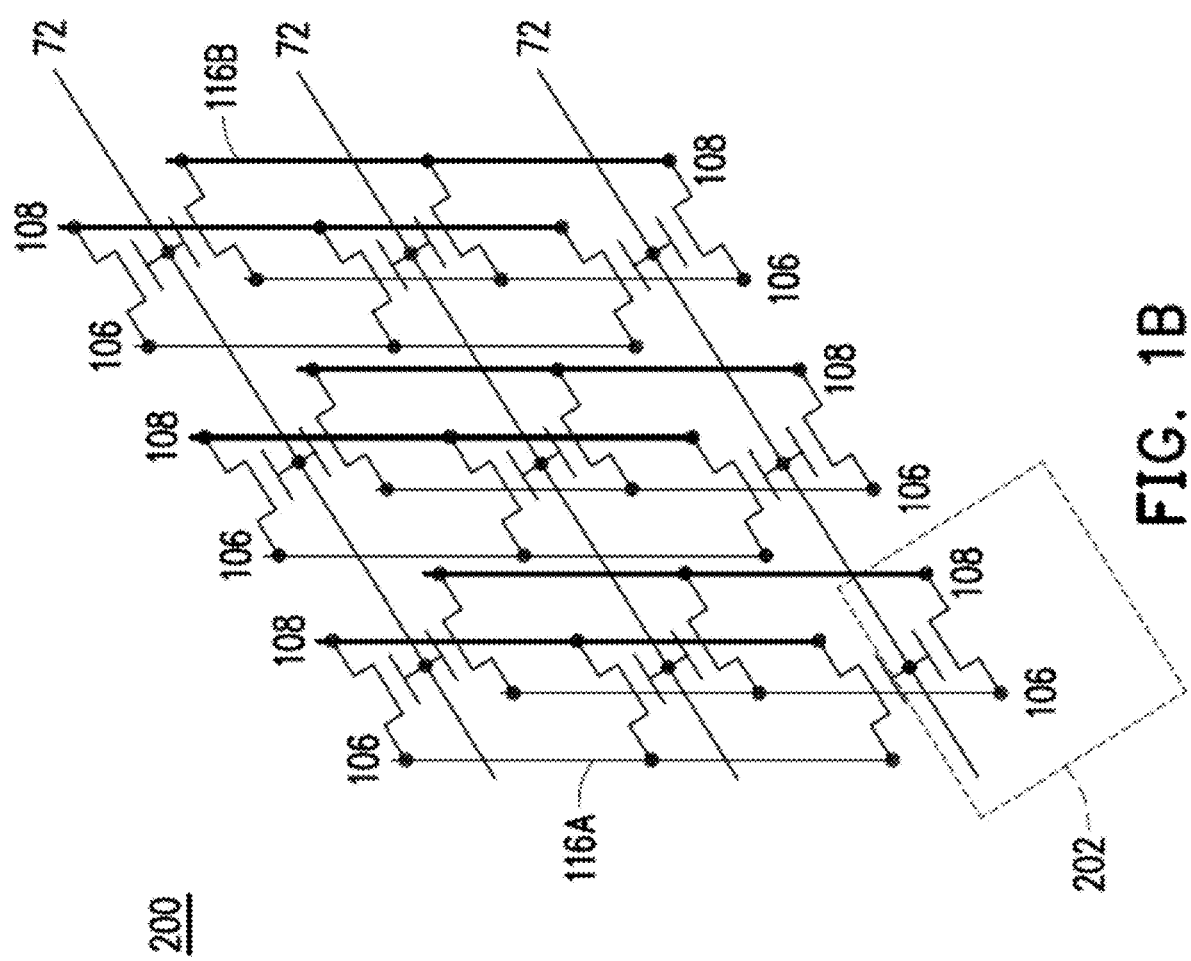
Figure 1C:
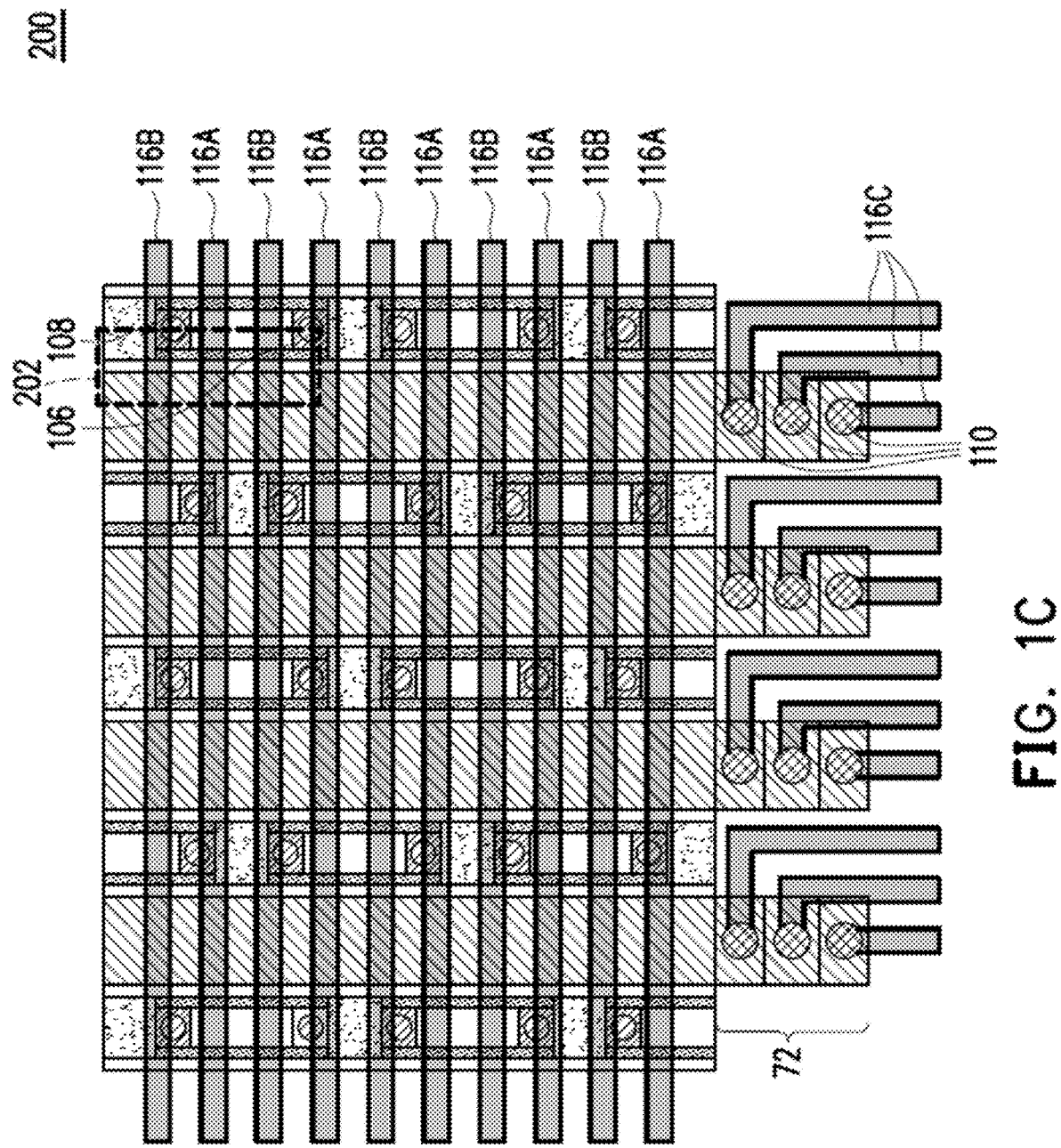

FIGS. 1A, 1B, and 1C illustrate examples of a memory array according to some embodiments. FIG. 1A illustrates an example of a portion of a simplified ferroelectric memory device 200 in a partial three-dimensional view; FIG. 1B illustrates a circuit diagram of the ferroelectric memory device 200; and FIG. 1C illustrates a top down view of the ferroelectric memory device 200 in accordance with some embodiments. The ferroelectric memory device 200 includes a plurality of memory cells 202, which may be arranged in a grid of rows and columns. The memory cells 202 may further be stacked vertically to provide a three dimensional memory array, thereby increasing device density. The ferroelectric memory device 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the ferroelectric memory device 200 is a memory array, such as a NOR memory array, or the like. In some embodiments, a gate of each memory cell 202 is electrically coupled to a respective word line (e.g., conductive line 72), a first source/drain region of each memory cell 202 is electrically coupled to a respective bit line (e.g., conductive line 116B), and a second source/drain region of each memory cell 202 is electrically coupled to a respective source line (e.g., conductive line 116A), which electrically couples the second source/drain region to ground. The memory cells 202 in a same horizontal row of the ferroelectric memory device 200 may share a common word line while the memory cells 202 in a same vertical column of the ferroelectric memory device 200 may share a common source line and a common bit line.

The ferroelectric memory device 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the ferroelectric memory device 200, and conductive contacts may be made to contact exposed portions of the conductive lines 72, respectively.

The ferroelectric memory device 200 further includes conductive pillars 106 (e.g., electrically connected to bit lines) and conductive pillars 108 (e.g., electrically connected to source lines) arranged alternately. The conductive pillars 106 and 108 may each extend in a direction perpendicular to the conductive lines 72. A dielectric material 98 is disposed between and isolates adjacent ones of the conductive pillars 106 and the conductive pillars 108.

Pairs of the conductive pillars 106 and 108 along with an intersecting conductive line 72 define boundaries of each memory cell 202, and an isolation pillar 102 is disposed between and isolates adjacent pairs of the conductive pillars 106 and 108. In some embodiments, the conductive pillars 108 are electrically coupled to ground. Although FIG. 1A illustrates a particular placement of the conductive pillars 106 relative the conductive pillars 108, it should be appreciated that the placement of the conductive pillars 106 and 108 may be exchanged in other embodiments.

In some embodiments, the ferroelectric memory device 200 may also include an oxide semiconductor (OS) material as a channel layer 92. The channel layer 92 may provide channel regions for the memory cells 202. For example, when an appropriate voltage (e.g., higher than a respective threshold voltage ($V_{th}$) of a corresponding memory cell 202) is applied through a corresponding conductive line 72, a region of the channel layer 92 that intersects the conductive line 72 may allow current to flow from the conductive pillars 106 to the conductive pillars 108 (e.g., in the direction indicated by arrow 206).

Figure 2A:
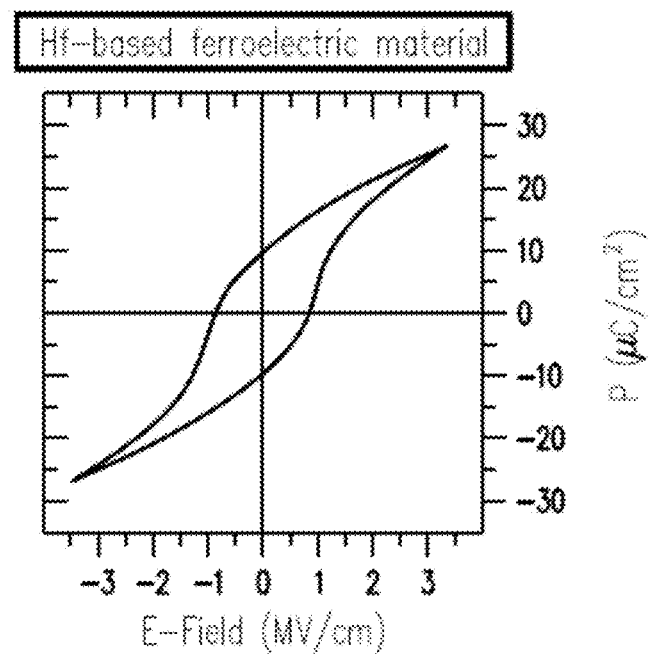
FIGS. 2A and 2B illustrate curves of polarization versus electric field (P-E) of ferroelectric memory devices in accordance with some embodiments.
Figure 2B:
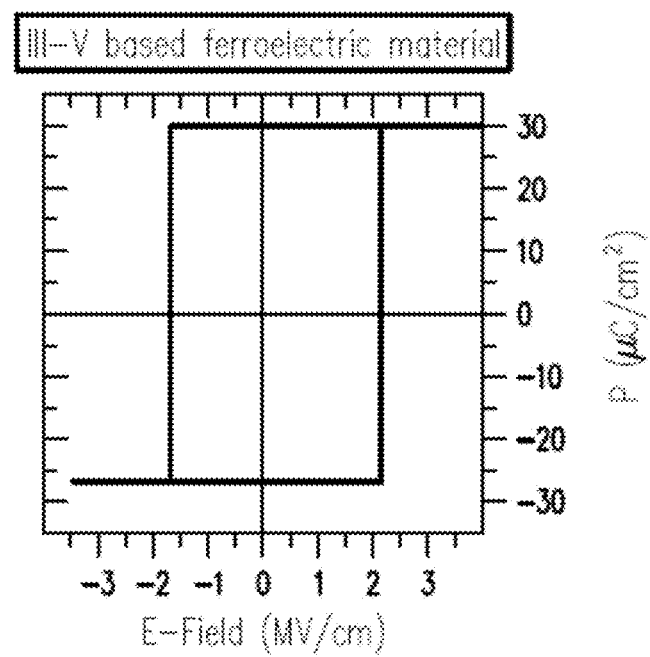

In some embodiments, a III-V based ferroelectric layer 90 is disposed between the channel layer 92 and each of the conductive lines 72 and the dielectric layers 52. The III-V based ferroelectric layer 90 may serve as a gate dielectric for each memory cell 202. In some embodiments, the III-V based ferroelectric layer 90 continuously extends past multiple ones of the conductive lines 72 and/or the dielectric layers 52. In some embodiments of the disclosure, the III-V based ferroelectric layer 90 includes a III-V compound in combination with a transition metal (e.g., a rare earth metal) rather than the conventional hafnium based ferroelectric material. For example, in some embodiments the III-V based ferroelectric layer 90 may comprise aluminum scandium nitride (AlScN), aluminum yttrium nitride (AlYN), gallium scandium nitride (GaScN), indium scandium nitride (InScN), or the like. Such III-V based ferroelectric material can exhibit better switching performance than the conventional hafnium based ferroelectric material. For example, as shown in FIG. 2A, an exemplary P-E curve (polarization-electric field curve) of the hafnium based ferroelectric material is gradually changed without sharp points and therefore causes half-select and write-disturb issues. However, as shown in FIG. 2B, the III-V based ferroelectric material of the disclosure can exhibit a square-like P-E loop and therefore minimize the write-disturb issue.

The III-V based ferroelectric layer 90 is polarized in one of two different directions, and the polarization direction is changed by applying an appropriate voltage differential across the III-V based ferroelectric layer 90 and generating an appropriate electric field. The polarization may be relatively localized (e.g., generally contained within each boundary of the memory cells 202), and a continuous region of the III-V based ferroelectric layer 90 may extend across a plurality of memory cells 202. Depending on a polarization direction of a particular region of the III-V based ferroelectric layer 90, a threshold voltage of a corresponding memory cell 202 varies, and a digital value (e.g., 0 or 1) can be stored. For example, when a region of the III-V based ferroelectric layer 90 has a first electrical polarization direction, the corresponding memory cell 202 may have a relatively low threshold voltage, and when the region of the III-V based ferroelectric layer 90 has a second electrical polarization direction, the corresponding memory cell 202 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the III-V based ferroelectric layer 90 corresponding to the memory cell 202. In some embodiments, the write voltage is applied, for example, by applying appropriate voltages to a corresponding conductive line 72 (e.g., the word line) and the corresponding conductive pillars 106/108 (e.g., the bit line/source line). In such embodiments, the conductive line 72 is configured to act as a gate electrode layer. By applying the write voltage across the portion of the III-V based ferroelectric layer 90, a polarization direction of the region of the III-V based ferroelectric layer 90 can be changed. As a result, the corresponding threshold voltage of the corresponding memory cell 202 can also be switched from a low threshold voltage to a high threshold voltage or vice versa, and a digital value can be stored in the memory cell 202. Because the conductive lines 72 intersect the conductive pillars 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the word line). Depending on the polarization direction of the corresponding region of the III-V based ferroelectric layer 90, the memory cell 202 may or may not be turned on. As a result, the conductive pillar 106 may or may not be discharged through the conductive pillar 108 (e.g., a source line that is coupled to ground), and the digital value stored in the memory cell 202 can be determined. Because the conductive lines 72 intersect the conductive pillars 106 and 108, individual memory cells 202 may be selected for the read operation.

FIG. 1A further illustrates lines corresponding to reference cross-sections of the ferroelectric memory device 200 that are used in later figures. Cross-section B-B' is along a longitudinal axis of conductive lines 72 and in a direction, for example, parallel to the direction of current flow of the memory cells 202. Cross-section C-C' is perpendicular to cross-section B-B' and extends through the dielectric material 98 and the isolation pillars 102. Cross-section D-D' is perpendicular to cross-section B-B' and extends through the dielectric material 98 and the conductive pillars 106. Subsequent figures refer to these reference cross-sections for clarity.

Figure 3:
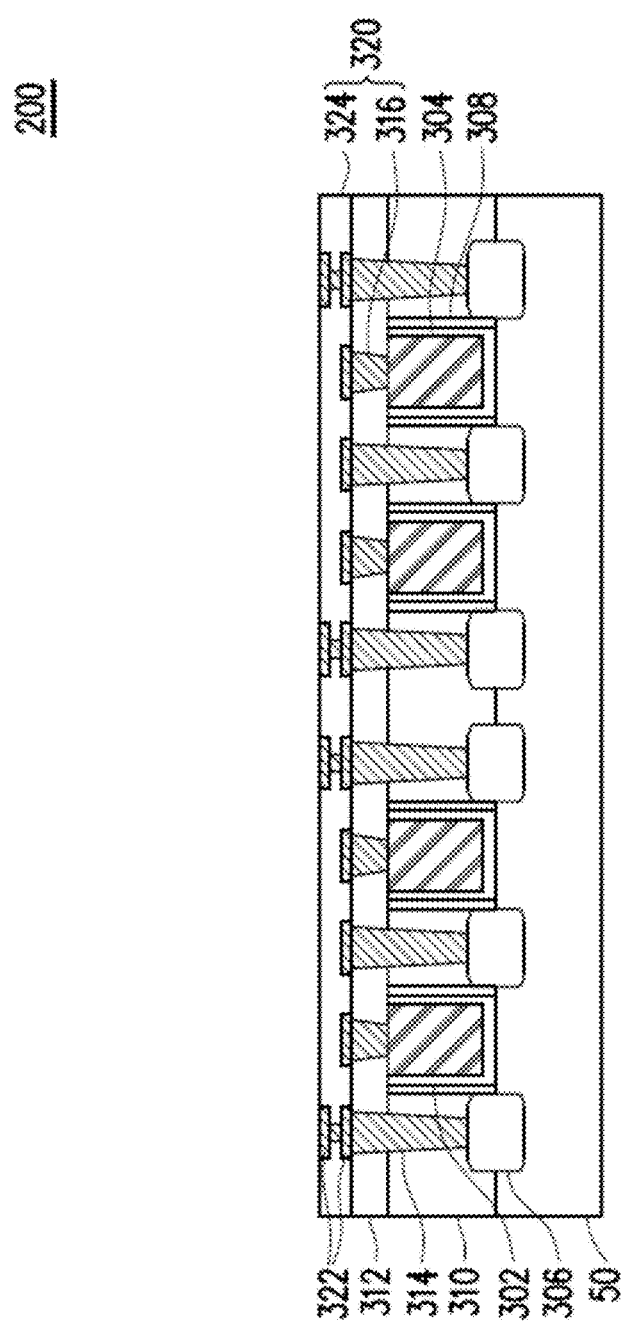

In FIG. 3, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 3 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETs (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304. A second ILD 312 is over the first ILD 310. Source/drain contacts 314 extend through the second ILD 312 and the first ILD 310 and are electrically coupled to the source/drain regions 306. Gate contacts 316 extend through the second ILD 312 and are electrically coupled to the gate electrodes 304. An interconnect structure 320 is over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 3 discusses transistors formed over the substrate 50, other active devices (e.g., diodes or the like) and/or passive devices (e.g., capacitors, resistors, or the like) may also be formed as part of the functional circuits.

Figure 4:
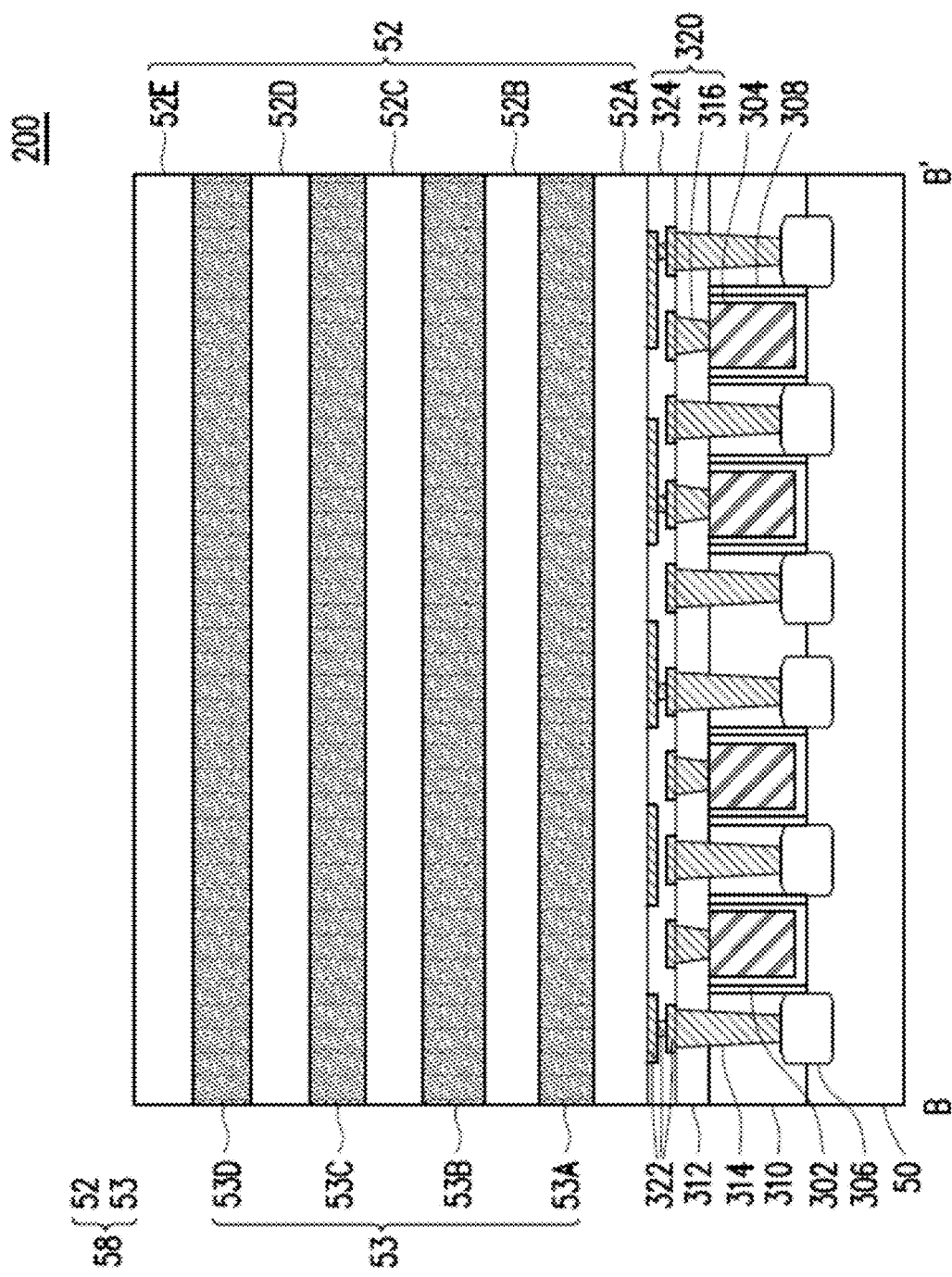

In FIG. 4, a multi-layer stack 58 is formed over the structure of FIG. 3. The substrate 50, the transistors, the ILDs, and the interconnect structure 320 may be omitted from subsequent drawings for the purposes of simplicity and clarity. Although the multi-layer stack 58 is illustrated as contacting the dielectric layers 324 of the interconnect structure 320, any number of intermediate layers may be disposed between the substrate 50 and the multi-layer stack 58. For example, one or more interconnect layers including conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the ferroelectric memory device 200 (see FIGS. 1A and 1B). In some embodiments, one or more interconnect layers including conductive features in insulting layers (e.g., low-k dielectric layers) may be disposed over the multi-layer stack 58.

In FIG. 4, the multi-layer stack 58 includes alternating layers of sacrificial layers 53A-53D (collectively referred to as sacrificial layers 53) and dielectric layers 52A-52E (collectively referred to as dielectric layers 52). The sacrificial layers 53 may be patterned and replaced in subsequent steps to define conductive lines 72 (e.g., the word lines). The sacrificial layers 53 may include dielectric materials, such as silicon oxide, silicon nitride, silicon oxynitride, combinations thereof, or the like. The dielectric layers 52 may include insulating materials, such as silicon oxide, silicon nitride, silicon oxynitride, combinations thereof, or the like. The sacrificial layers 53 and the dielectric layers 52 include different materials with different etching selectivities. In some embodiments, the sacrificial layers 53 include silicon nitride, and the dielectric layers 52 include silicon oxide. Each of the sacrificial layers 53 and the dielectric layers 52 may be formed using, for example, chemical vapor deposition (CVD), atomic layer deposition (ALD), physical vapor deposition (PVD), plasma enhanced CVD (PECVD), or the like.

Although FIG. 4 illustrates a particular number of the sacrificial layers 53 and the dielectric layers 52, other embodiments may include different numbers of the sacrificial layers 53 and the dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a sacrificial layer.

FIGS. 5 through 13 are views of intermediate stages in the manufacturing a staircase structure of the ferroelectric memory device 200, in accordance with some embodiments. FIGS. 5 through 13 are illustrated along reference cross-section B-B' illustrated in FIG. 1A.

Figure 5:
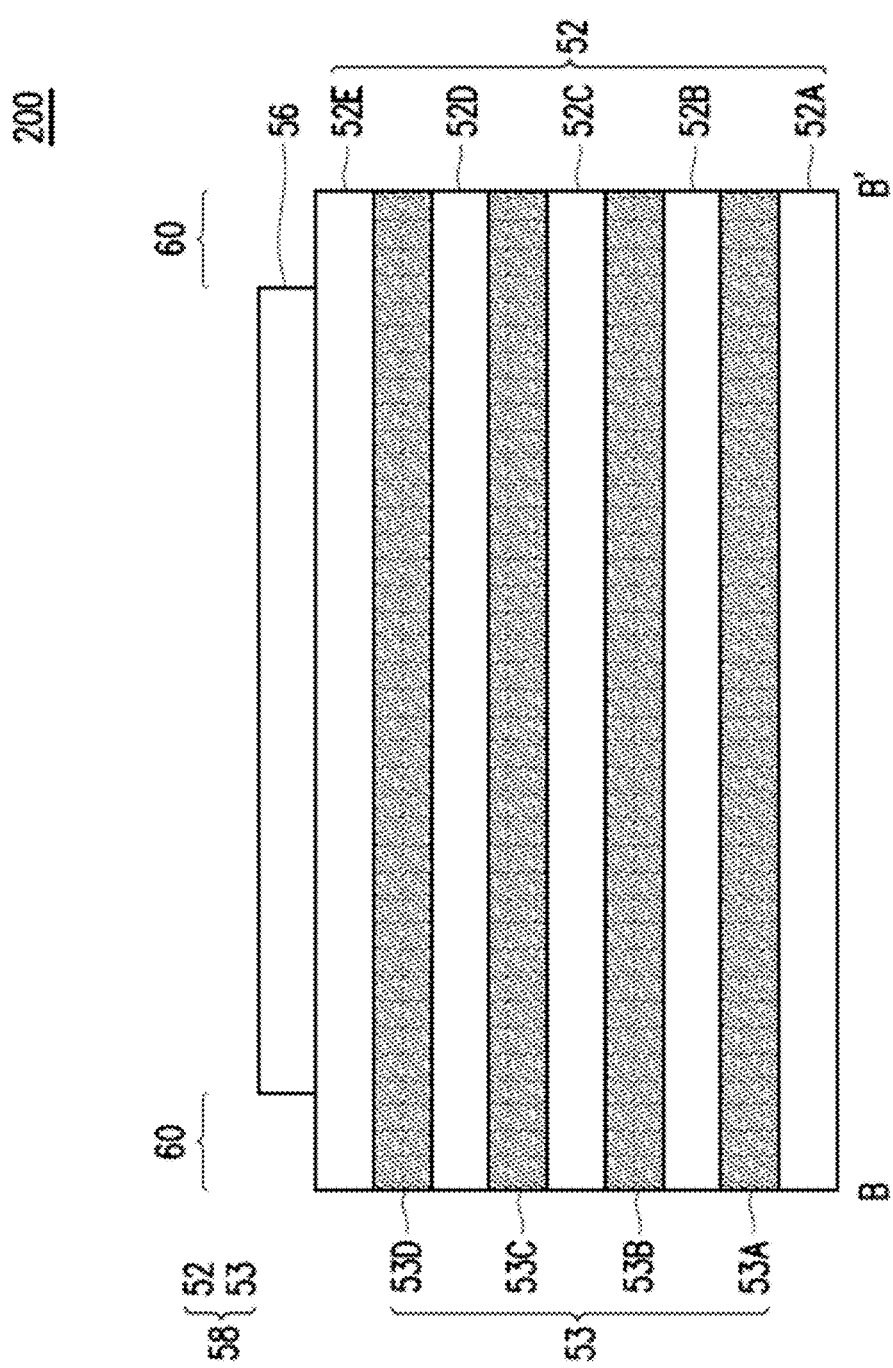

In FIG. 5, a photoresist 56 is formed over the multi-layer stack 58. In some embodiments, the photoresist 56 is formed by a spin-on technique and patterned by an acceptable photolithography technique. Patterning the photoresist 56 may expose the multi-layer stack 58 in regions 60, while masking remaining portions of the multi-layer stack 58. For example, a topmost layer of the multi-layer stack 58 (e.g., the dielectric layer 52E) may be exposed in the regions 60.

Figure 6:
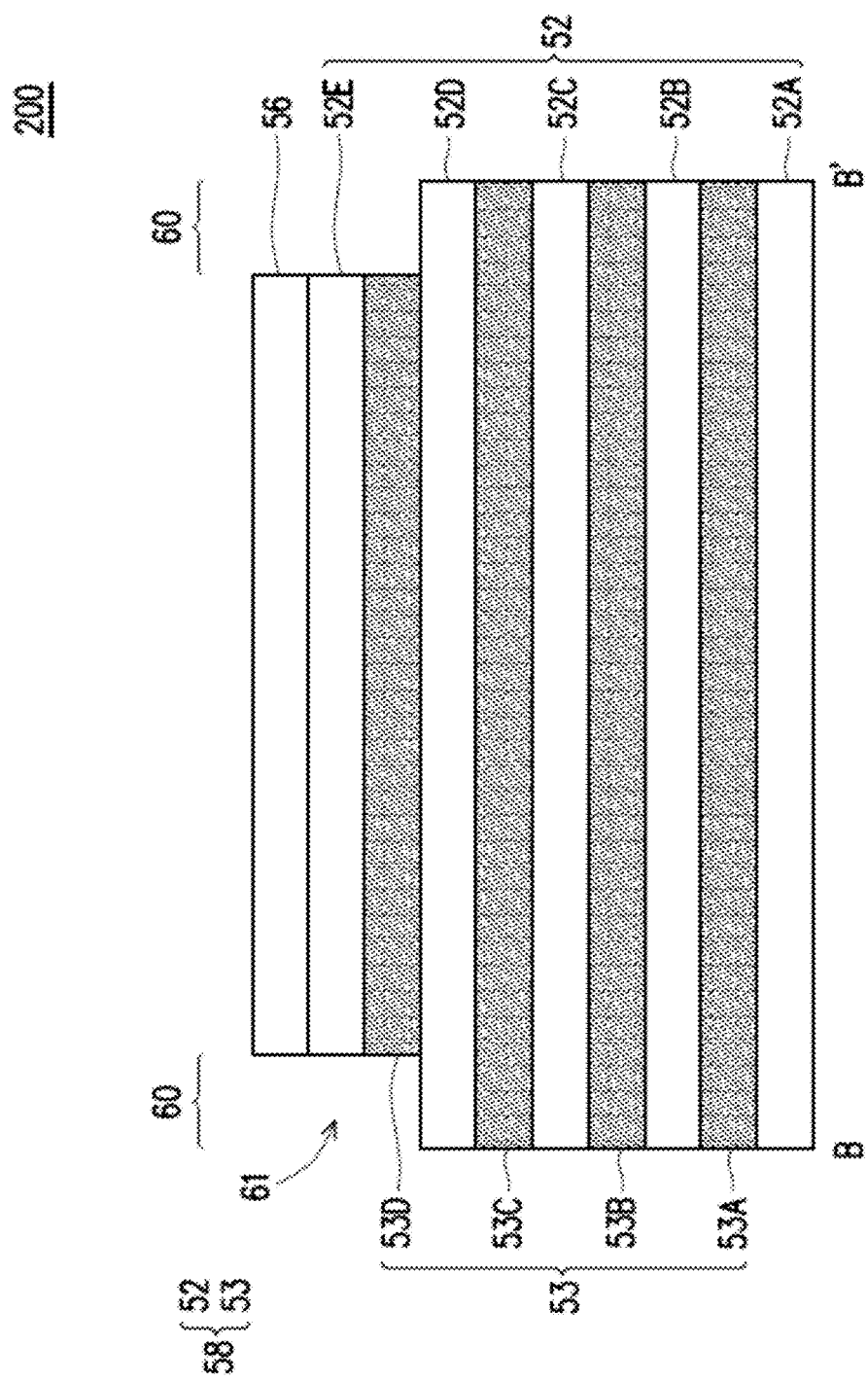

In FIG. 6, the exposed portions of the multi-layer stack 58 in the regions 60 are etched using the photoresist 56 as a mask. The etching may be any acceptable etching process, such as a dry etch (e.g., a reactive ion etch (RIE), a neutral beam etch (NBE), the like), a wet etch, the like, or a combination thereof. The etching may be anisotropic. The etching may remove portions of the dielectric layer 52E and the sacrificial layer 53D in the regions 60 and define openings 61. Because the dielectric layer 52E and the sacrificial layer 53D have different material compositions, etchants used to remove exposed portions of these layers may be different. In some embodiments, the sacrificial layer 53D acts as an etch stop layer while etching the dielectric layer 52E, and the dielectric layer 52D acts as an etch stop layer while etching sacrificial layer 53D. As a result, the portions of the dielectric layer 52E and the sacrificial layer 53D may be selectively removed without removing remaining layers of the multi-layer stack 58, and the openings 61 may be extended to a desired depth. Alternatively, a time-mode etching process may be used to stop the etching of the openings 61 after the openings 61 reach a desired depth. In the resulting structure, the dielectric layer 52D is exposed in the regions 60.

Figure 7:
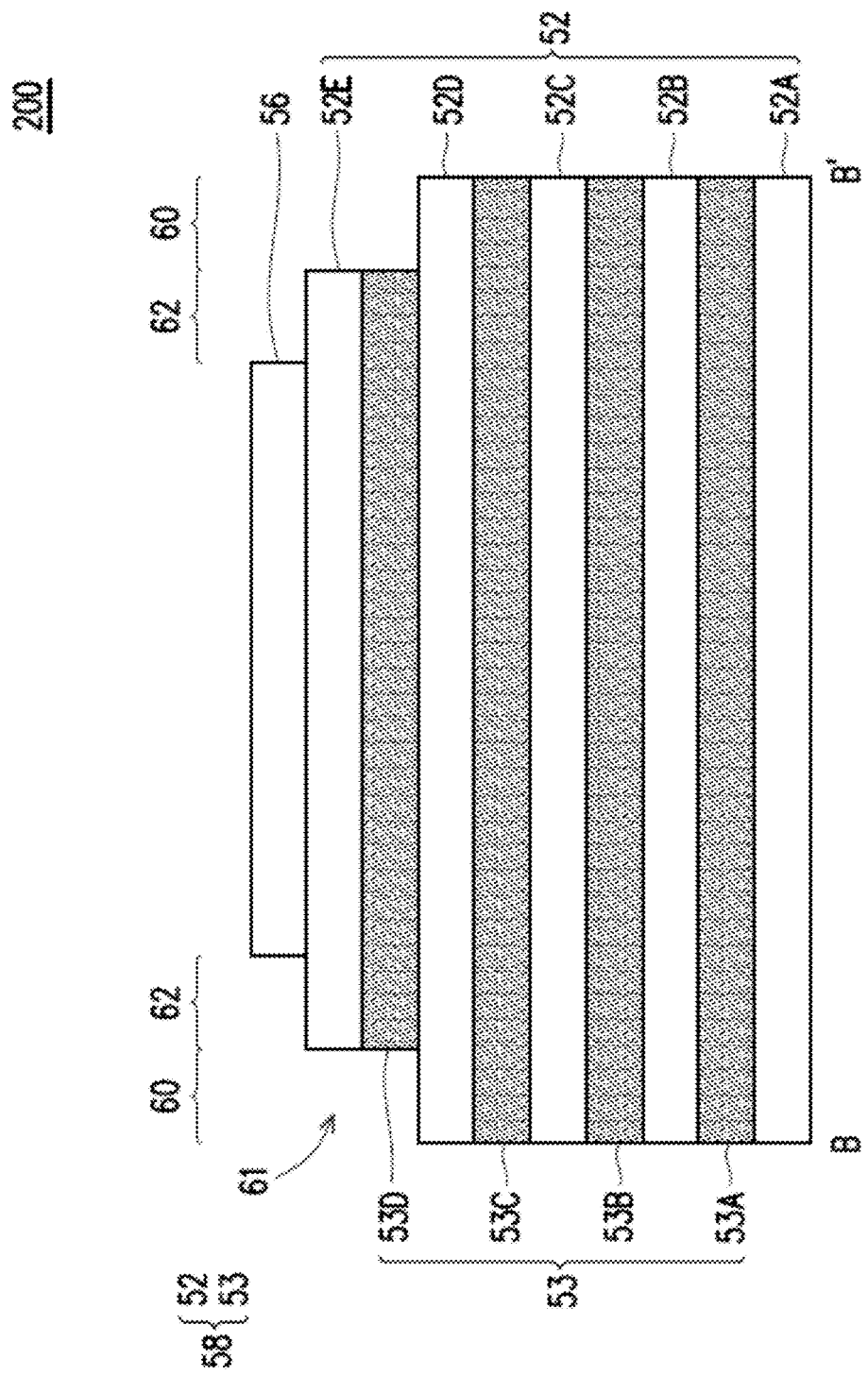

In FIG. 7, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced and portions the multi-layer stack 58 in the regions 60 and regions 62 may be exposed. For example, top surfaces of the dielectric layer 52D may be exposed in the regions 60, and top surfaces of the dielectric layer 52E may be exposed in the regions 62.

Figure 8:
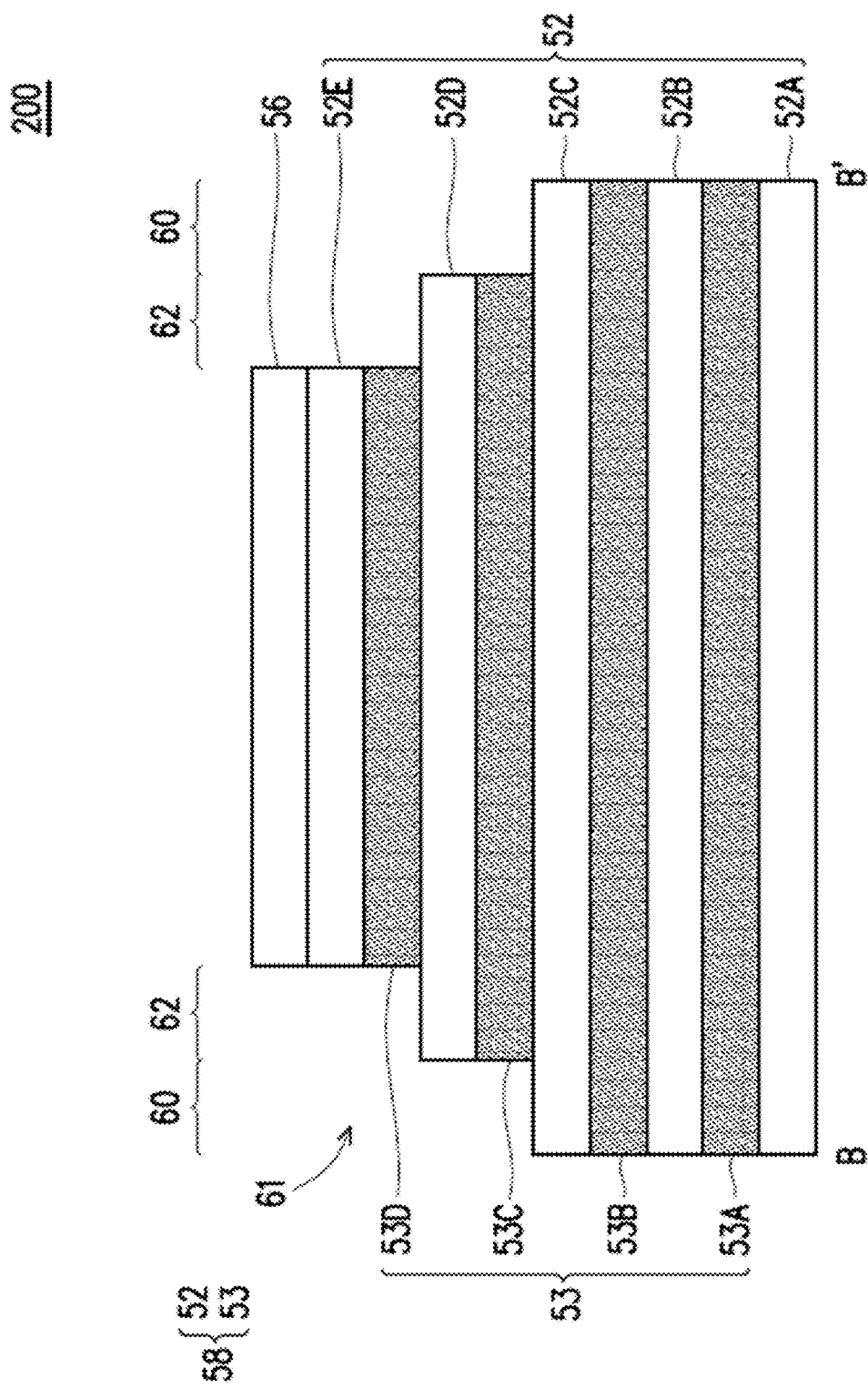

In FIG. 8, portions of the dielectric layer 52E, the sacrificial layer 53D, the dielectric layer 52D, and the sacrificial layer 53C in the regions 60 and the regions 62 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the sacrificial layers 53D and 53C and the dielectric layers 52E and 52D have different material compositions, etchants used to remove exposed portions of these layers may be different. In some embodiments, portions of the dielectric layers 52E and 52D in the regions 62 and 60 are removed by using the photoresist 56 as a mask and using the underlying sacrificial layers 53D and 53C as etch stop layers. Thereafter, the exposed portions of the sacrificial layers 53D and 53C in the regions 62 and 60 are removed by using the photoresist 56 as a mask and using the underlying dielectric layers 52D and 52C as etching stop layers. In the resulting structure, the dielectric layer 52C is exposed in the regions 60, and the dielectric layer 52D is exposed in the regions 62.

Figure 9:
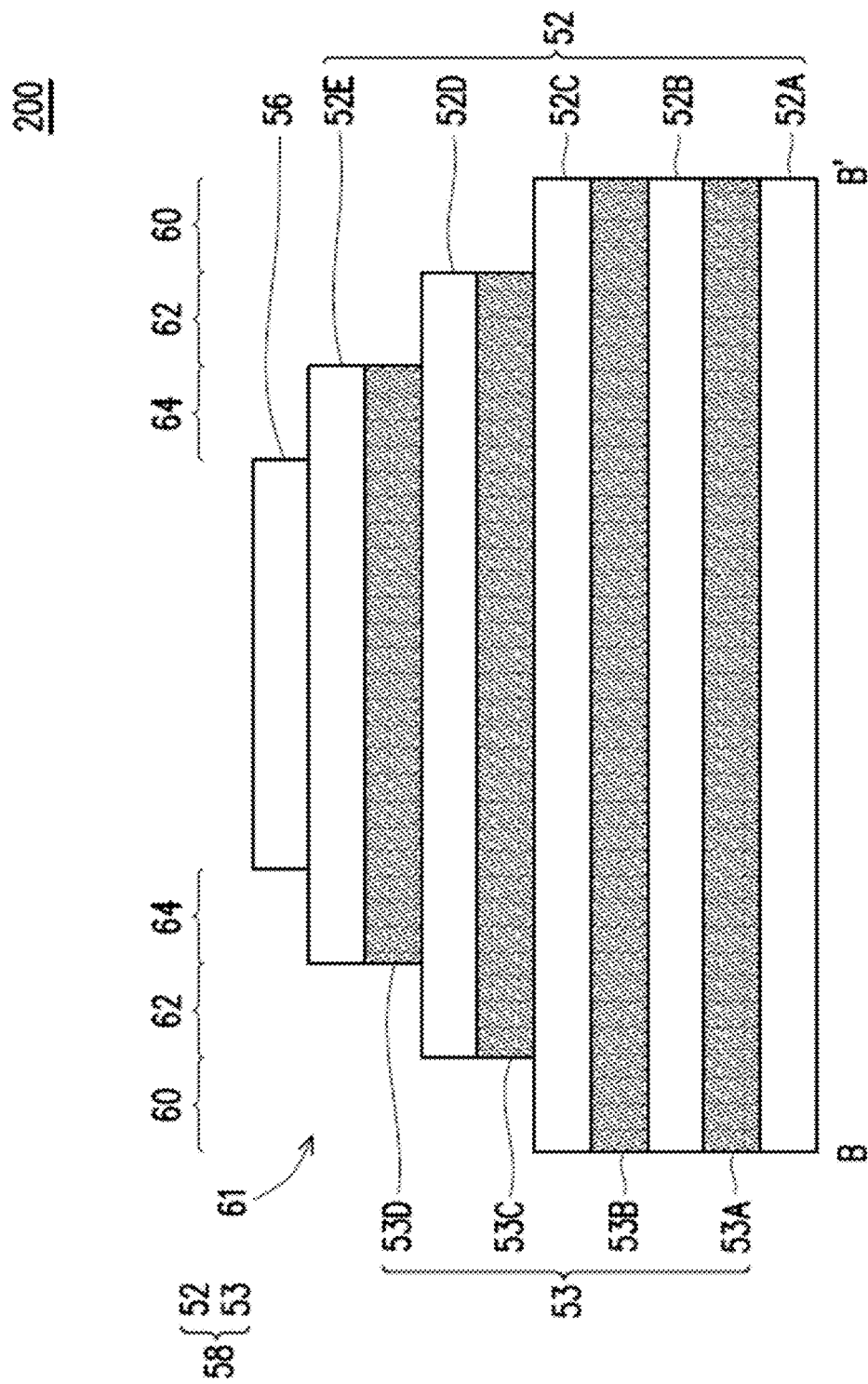

In FIG. 9, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, and regions 64 may be exposed. For example, top surfaces of the dielectric layer 52C may be exposed in the regions 60; top surfaces of the dielectric layer 52D may be exposed in the regions 62; and top surfaces of the dielectric layer 52E may be exposed in the regions 64.

Figure 10:
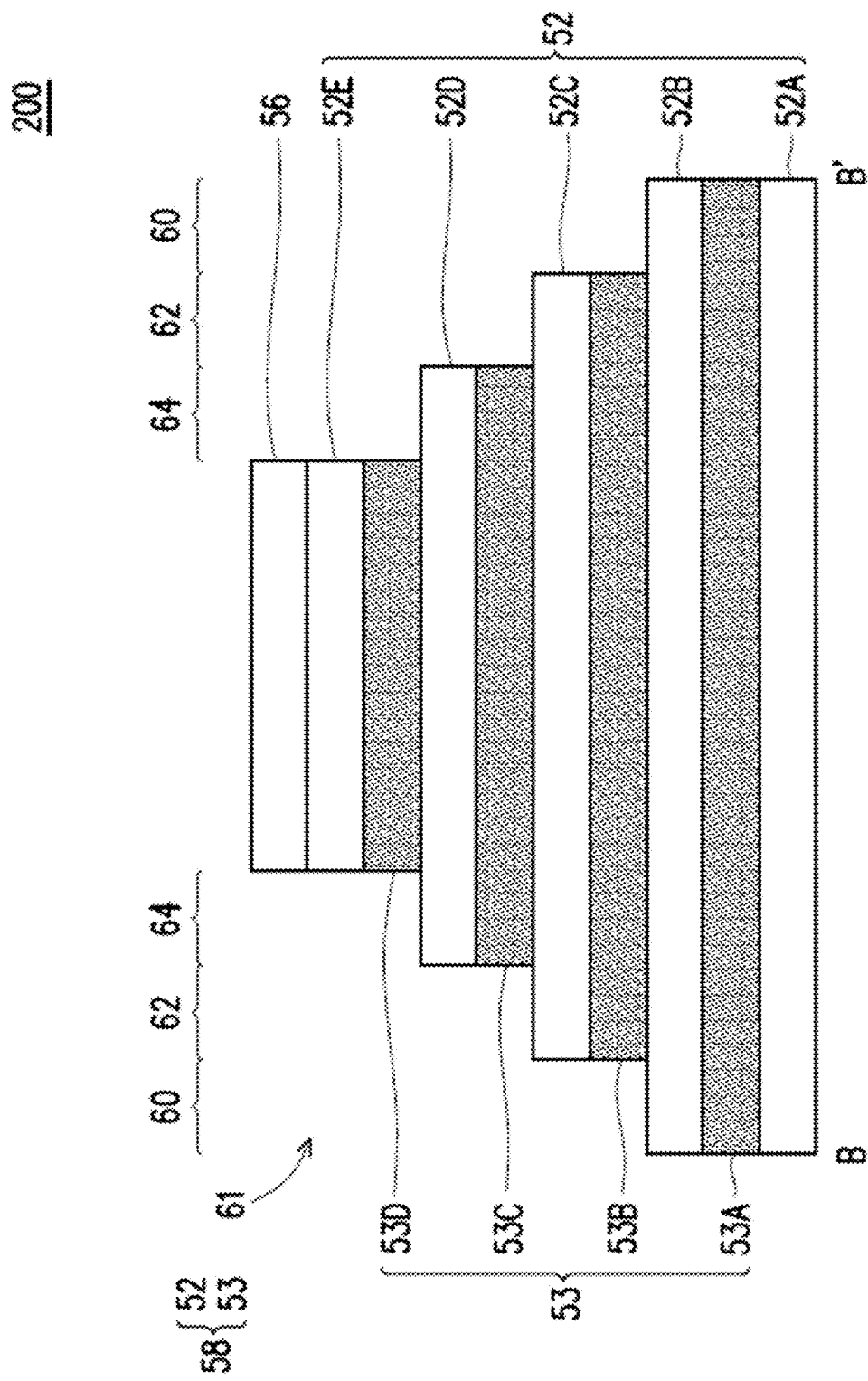

In FIG. 10, portions of the dielectric layers 52E, 52D, and 52C and the sacrificial layers 53D, 53C, and 53B in the regions 60, the regions 62, and the regions 64 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the dielectric layers 52C-52E and the sacrificial layers 53B-53D have different material compositions, etchants used to remove exposed portions of these layers may be different. In some embodiments, portions of the dielectric layers 52E, 52D and 52C in the regions 64, 62 and 60 are removed by using the photoresist 56 as a mask and using the underlying sacrificial layers 53D, 53C and 53B as etch stop layers. Thereafter, the exposed portions of the sacrificial layers 53D, 53C and 53B in the regions 64, 62 and 60 are removed by using the photoresist 56 as a mask and using the underlying dielectric layers 52D, 52C and 52B as etching stop layers. In the resulting structure, the dielectric layer 52B is exposed in the regions 60; the dielectric layer 52C is exposed in the regions 62; and the dielectric layer 52D is exposed in the regions 64.

Figure 11:
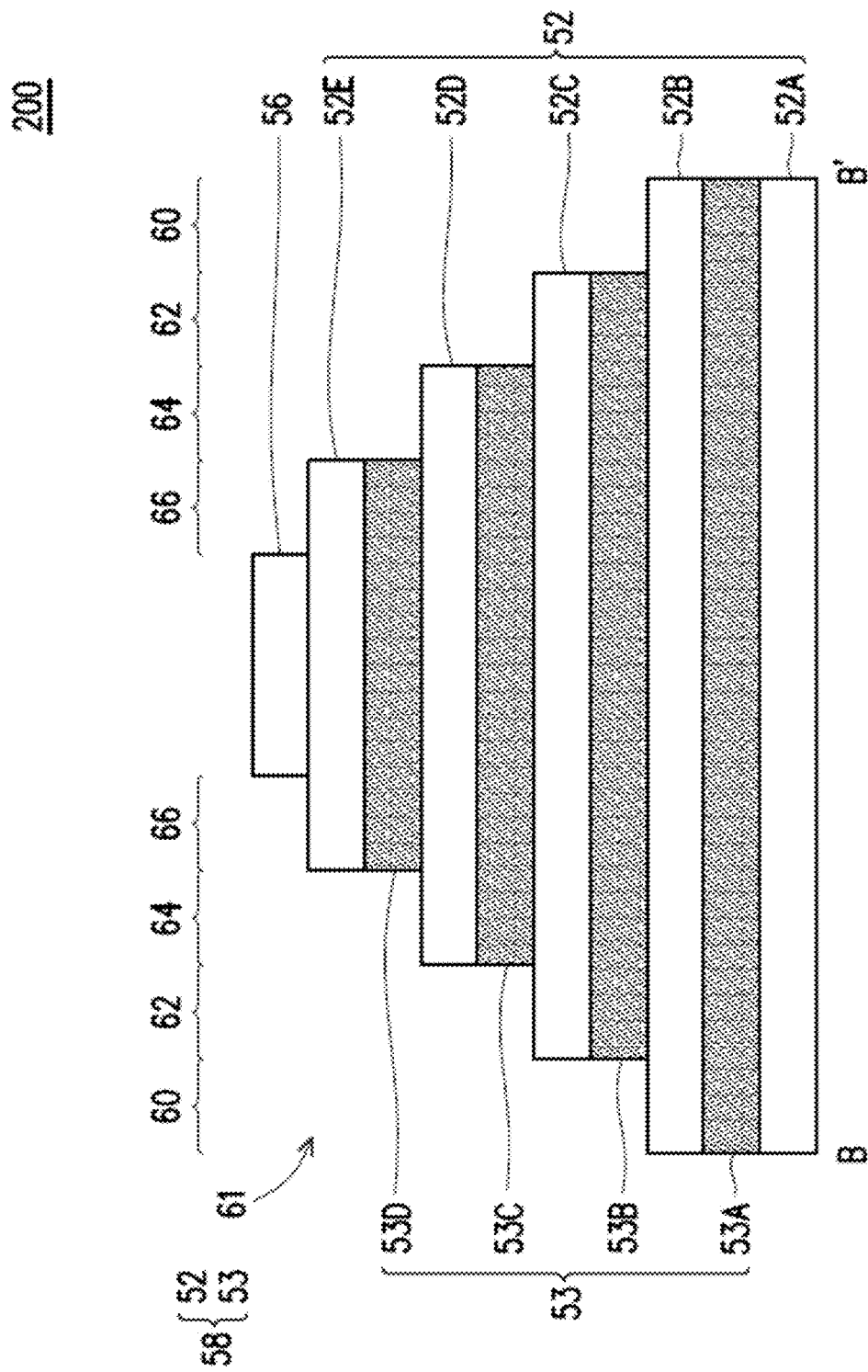

In FIG. 11, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, the regions 64, and regions 66 may be exposed. For example, top surfaces of the dielectric layer 52B may be exposed in the regions 60; top surfaces of the dielectric layer 52C may be exposed in the regions 62; and top surfaces of the dielectric layer 52D may be exposed in the regions 64; and top surfaces of the dielectric layer 52E may be exposed in the regions 66.

Figure 12:
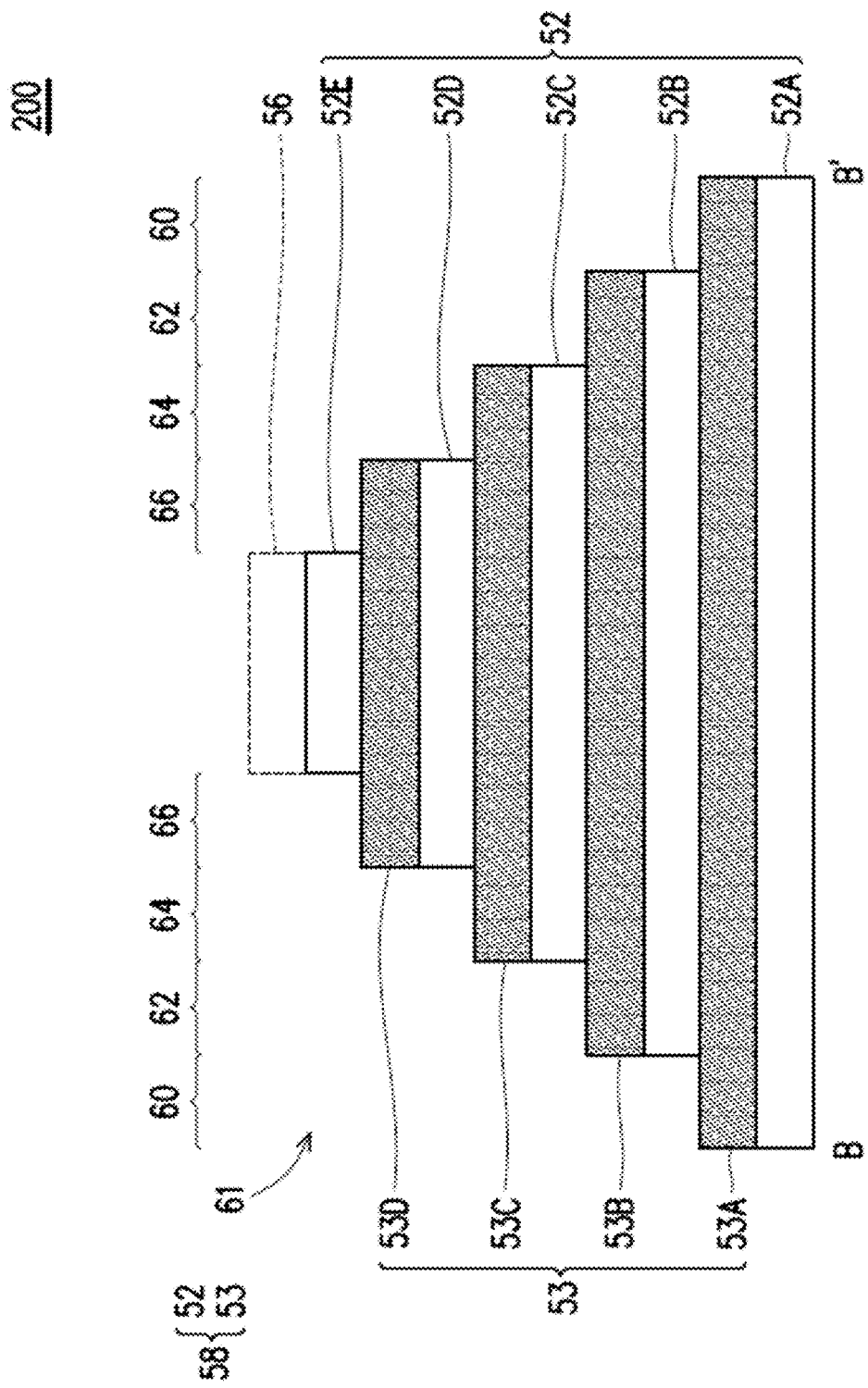

In FIG. 12, portions of the dielectric layers 52E, 52D, 52C, and 52B in the regions 60, the regions 62, the regions 64, and the regions 66 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. In some embodiments, portions of the dielectric layers 52E, 52D, 52C and 52B in the regions 66, 64, 62 and 60 are removed by using the photoresist 56 as a mask and using the underlying sacrificial layers 53D, 53C, 53B and 53A as etch stop layers. In the resulting structure, the sacrificial layer 53A is exposed in the regions 60; the sacrificial layer 53B is exposed in the regions 62; the sacrificial layer 53C is exposed in the regions 64; and the sacrificial layer 53D is exposed in the regions 66. Thereafter, the photoresist 56 may be removed by an acceptable ashing or wet strip process.

Figure 13:
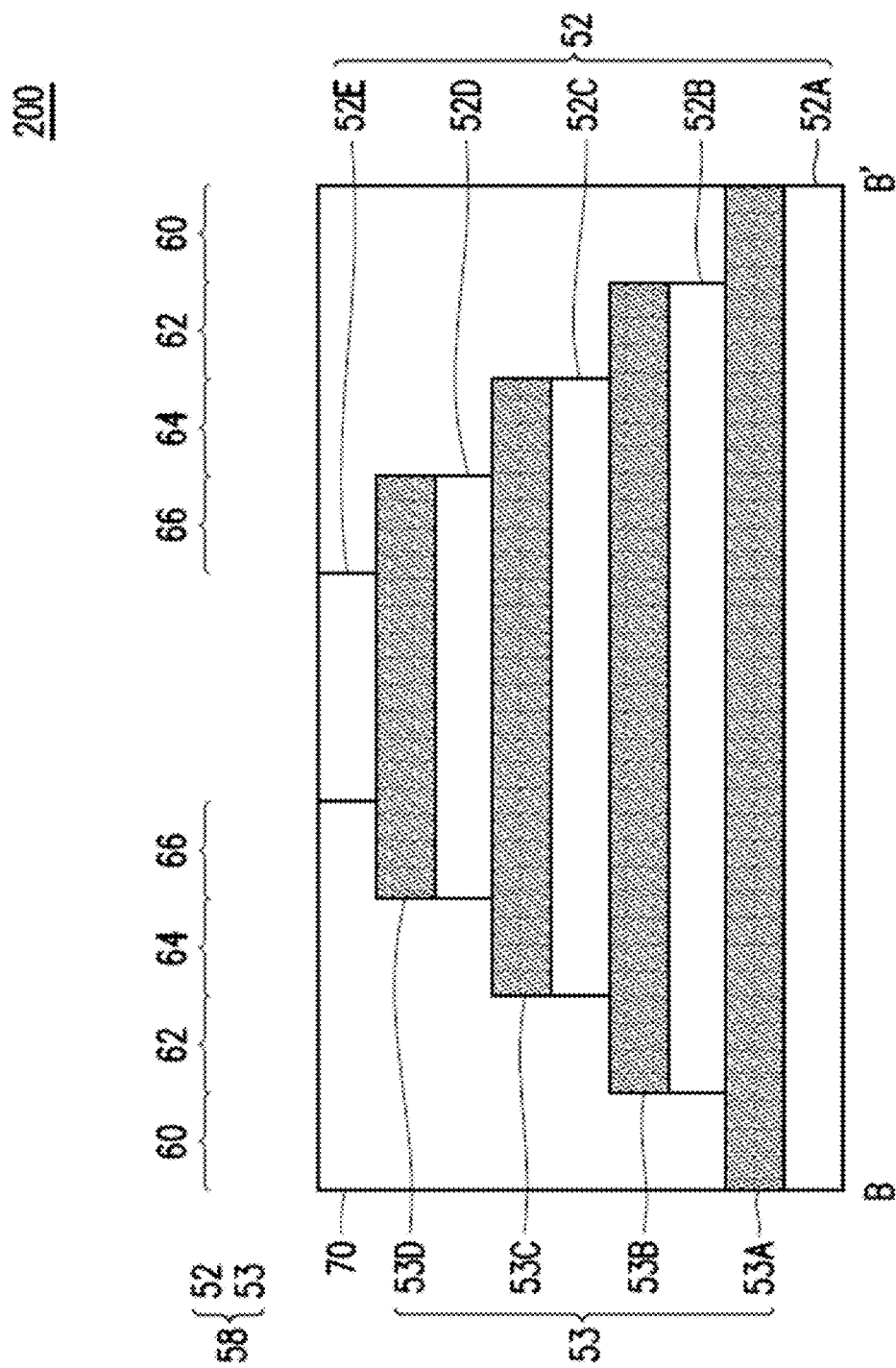

In FIG. 13, an inter-metal dielectric (IMD) 70 is deposited over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may include an oxide (e.g., silicon oxide or the like), a nitride (e.g., silicon nitride or the like), a combination thereof or the like. Other dielectric materials formed by any acceptable process may be used. The IMD 70 extends along sidewalls of the sacrificial layers 53B-53D and sidewalls of the dielectric layers 52B-52E. Further, the IMD 70 may contact top surfaces of the sacrificial layers 53A-53D and the dielectric layer 52E.

Thereafter, a removal process is applied to the IMD 70 to remove excess dielectric material over the multi-layer stack 58. In some embodiments, the removal process may be a planarization process, such as a chemical mechanical polish (CMP), an etch-back process, combinations thereof, or the like. The planarization process exposes the multi-layer stack 58 such that top surfaces of the multi-layer stack 58 and IMD 70 are level after the planarization process is completed.

Figure 17A:
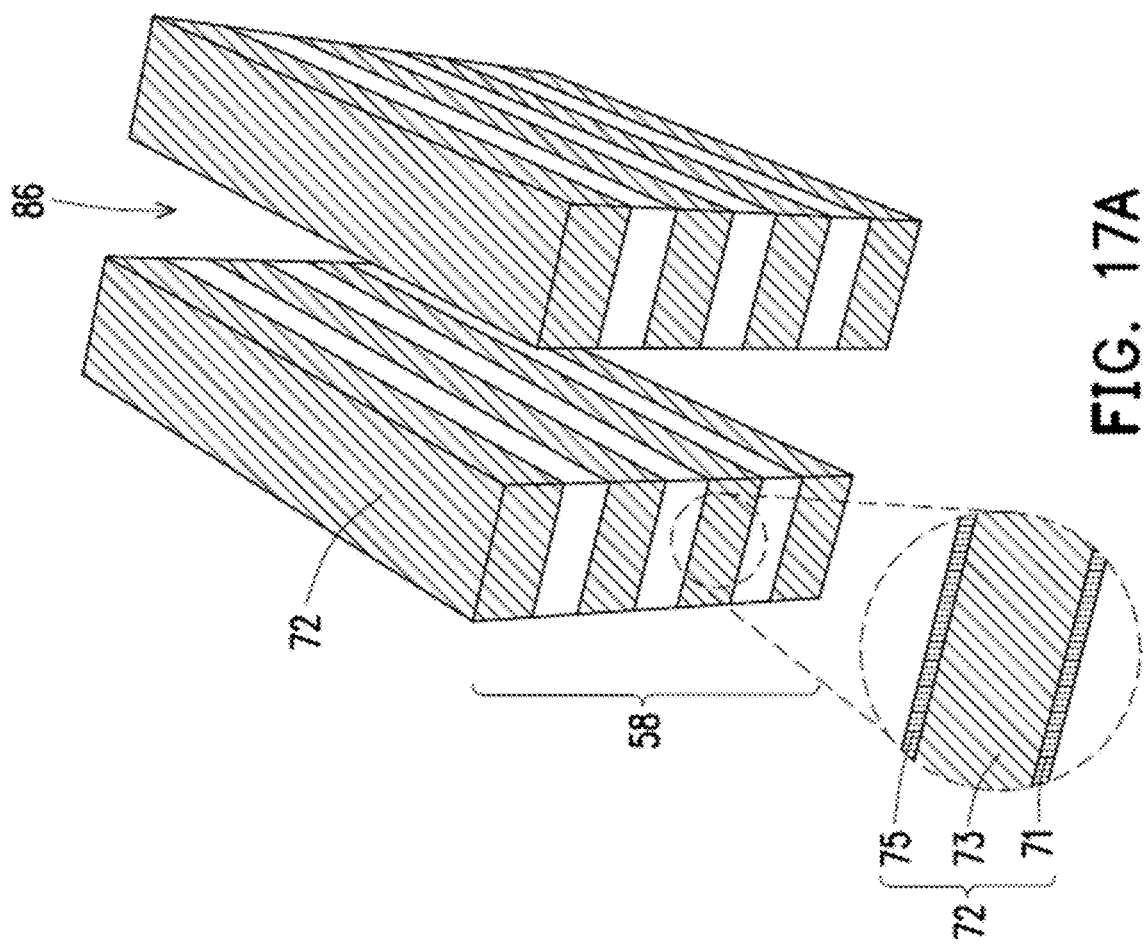
Figure 17B:
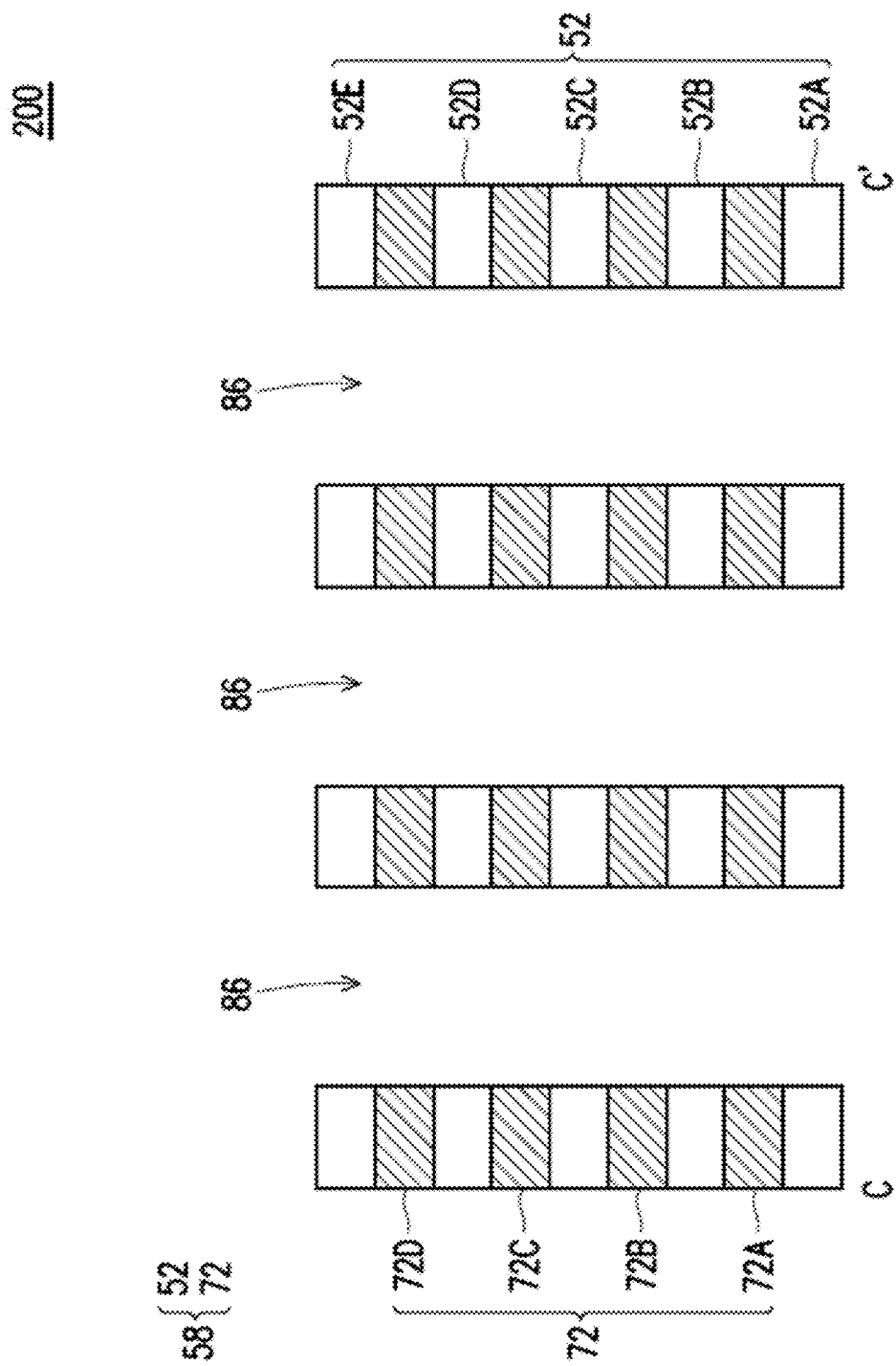

As shown in FIG. 13, an intermediate and bulk staircase structure is thus formed. The intermediate staircase structure includes alternating layers of sacrificial layers 53 and dielectric layers 52. The sacrificial layers 53 are subsequently replaced with conductive lines 72, which will be described in details in FIGS. 17A and 17B. Lower conductive lines 72 are longer and extend laterally past upper conductive lines 72, and a width of each of the conductive lines 72 increases in a direction towards the substrate 50 (see FIG. 1A).

FIGS. 14 through 17B are views of intermediate stages in the manufacturing of a memory region of the ferroelectric memory device 200, in accordance with some embodiments. In FIGS. 14 through 17B, the bulk multi-layer stack 58 is patterned to form trenches 86 therethrough, and sacrificial layers 53 are replaced with conductive materials to define the conductive lines 72. The conductive lines 72 may correspond to word lines in the ferroelectric memory device 200, and the conductive lines 72 may further provide gate electrodes for the resulting memory cells of the ferroelectric memory device 200. FIGS. 14, 15, 16B and 17B are illustrated along reference cross-section C-C' illustrated in FIG. 1A. FIGS. 16A and 17A are illustrated in a partial three-dimensional view.

Figure 14:
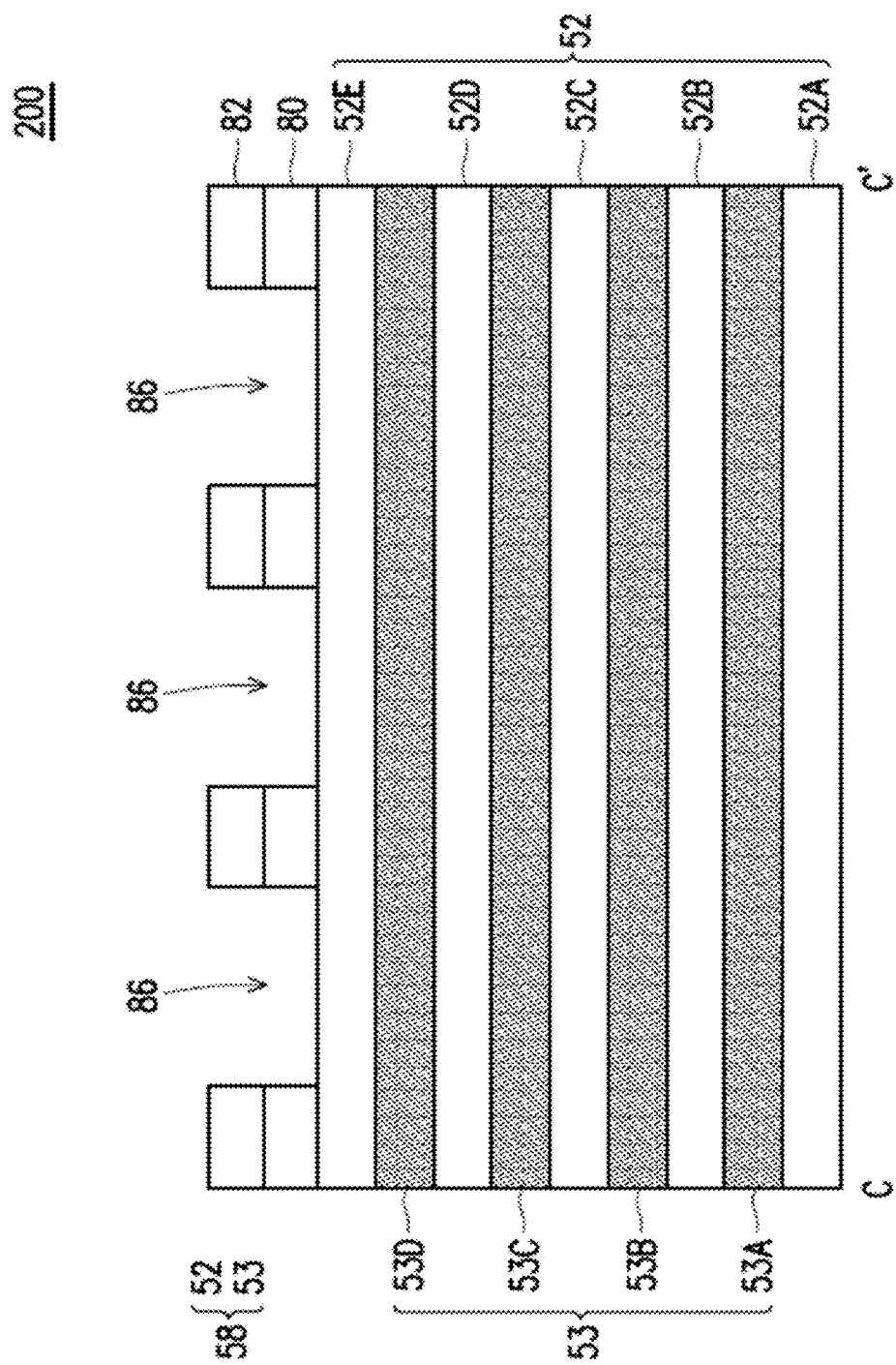

In FIG. 14, photoresist patterns 82 and underlying hard mask patterns 80 are formed over the multi-layer stack 58. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 82 and trenches 86 between the photoresist patterns 82. The photoresist layers is patterned by an acceptable photolithography technique, for example. The patterns of the photoresist patterns 82 are then transferred to the hard mask layer to form hard mask patterns 80 by using an acceptable etching process, such as by a dry etch (e.g., RIE, NBE, the like), a wet etch, the like, or a combination thereof. The etching may be anisotropic. Thus, trenches 86 are formed extending through the hard mask layer. Thereafter, the photoresist patterns 82 may be optionally removed by an ashing process, for example.

Figure 15:
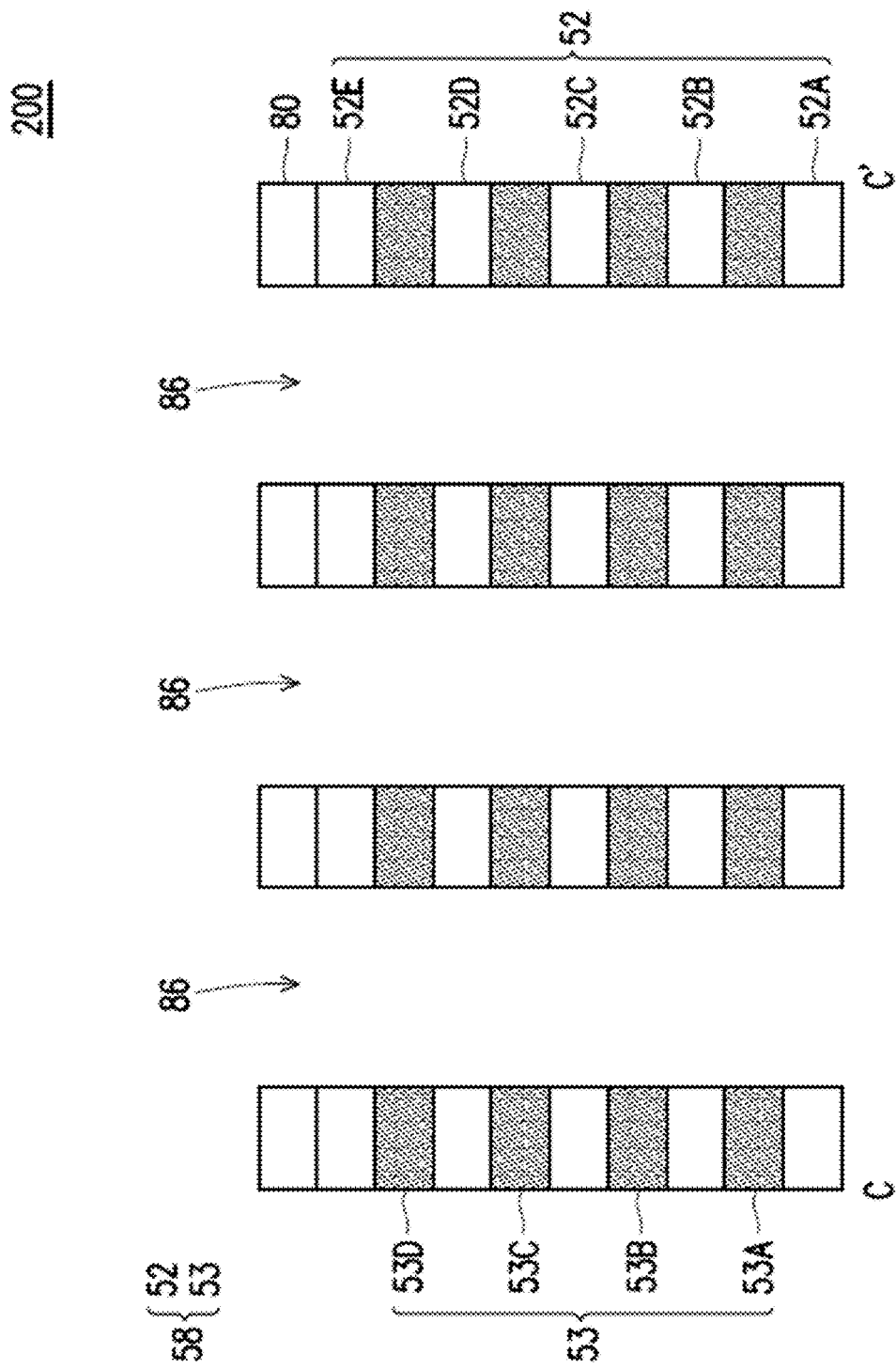
Figure 16A:
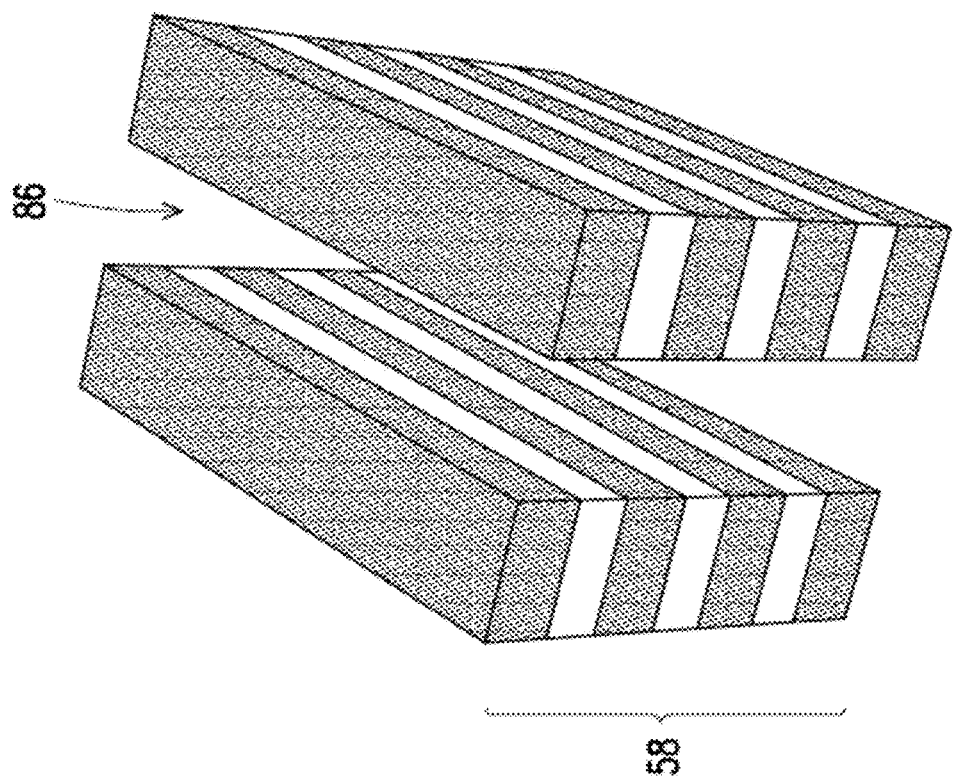
Figure 16B:
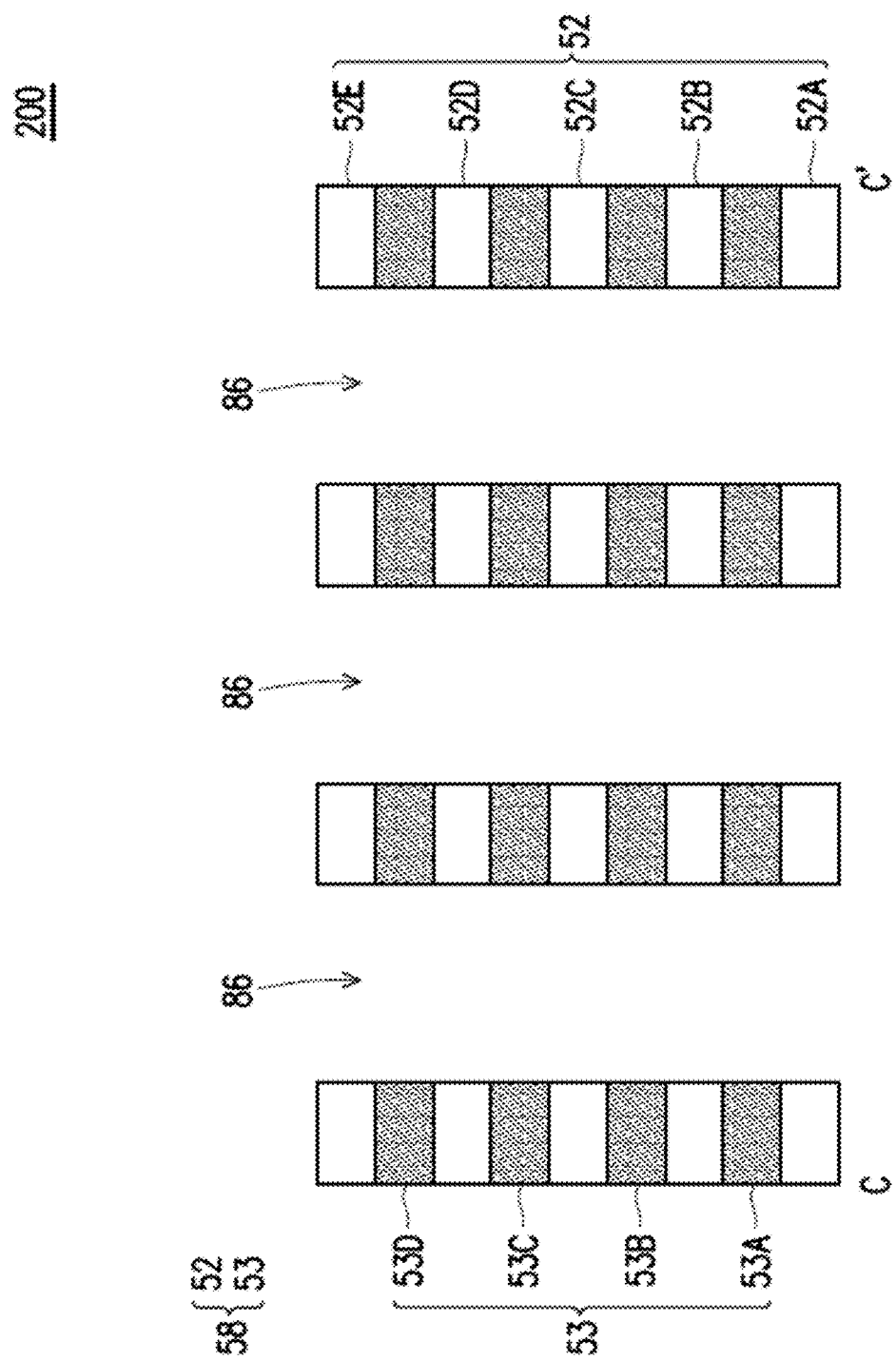

In FIGS. 15 to 16B, the patterns of the hard mask patterns 80 are transferred to the multi-layer stack 58 using one or more acceptable etching processes, such as by a dry etch (e.g., RIE, NBE, the like), a wet etch, the like, or a combination thereof. The etching processes may be anisotropic. Thus, the trenches 86 extend through the bulk multi-layer stack 58, and strip-shaped sacrificial layers 53 and strip-shaped dielectric layers 52 are accordingly defined. In some embodiments, the trenches 86 extend through the bulk staircase structure, and strip-shaped staircase structures are accordingly defined. The hard mask patterns 80 may be then removed by an acceptable process, such as a wet etching process, a dry etching process, a planarization process, combinations thereof, or the like.

In FIGS. 16A to 17B, portions of the sacrificial layers 53A-53D (collectively referred to as sacrificial layers 53) are replaced with conductive lines 72A-72D (collectively referred to as conductive lines 72). In some embodiments, portions of the sacrificial layers 53 are removed by an acceptable process, such as a wet etching process, a dry etching process or both. In some embodiments, a periphery region surrounding an array region with a memory array has some portions of the sacrificial layers 53 that are not removed by the said replacement process. Therefore, some portions of the sacrificial layers 53 in the periphery region also provides further support to prevent the dielectric layers 52 in the array region from collapse.

Thereafter, conductive lines 72 are filled into the space between two adjacent dielectric layers 52. As shown in the local enlarged view, each conductive line 72 includes two barrier layers 71 and 75 and a metal layer 73 between the barrier layers 71 and 75. Specifically, a barrier layer is disposed between the metal layer 73 and the adjacent dielectric layer 52. The barrier layers may prevent the metal layer from diffusion to the adjacent dielectric layers 52. The barrier layers may also provide the function of increasing the adhesion between the metal layer and the adjacent dielectric layers, and may be referred to as glue layers in some examples. In some embodiments, both barrier layers and glue layers with different materials are provided as needed. The barrier layers 71 and 75 are formed of a first conductive material, such as a metal nitride, such as titanium nitride, tantalum nitride, molybdenum nitride, zirconium nitride, hafnium nitride, or the like. The metal layer 73 may be formed of a second conductive material, such as a metal, such as tungsten, ruthenium, molybdenum, cobalt, aluminum, nickel, copper, silver, gold, alloys thereof, or the like. The barrier layers 71, 75 and metal layer 73 may each be formed by an acceptable deposition process such as CVD, PVD, ALD, PECVD, or the like. The barrier layers 71, 75 and the metal layer 73 are further deposited on the sidewalls of the multi-layer stack 58 and fill in the trenches 86. Thereafter, the barrier layers 71, 75 and the metal layer 73 in the trenches 86 are removed by an etching back process. An acceptable etch back process may be performed to remove excess materials from the sidewalls of the dielectric layers 52 and the bottom surfaces of the trenches 86. The acceptable etch back process includes a dry etch (e.g., RIE, NBE, the like), a wet etch, the like, or a combination thereof. The acceptable etch back process may be anisotropic.

In some embodiments, upon the replacement process, the sacrificial layers 53 of the strip-shaped staircase structures are subsequently replaced with conductive lines 72 (see FIG. 1A).

In alternative embodiments, portions of the sacrificial layers 53 are replaced with the conductive lines 72 after conductive pillars 106 and 108 are formed. In addition to the conductive pillars 106 and 108, the dielectric materials 98, the channel layer 92, and the isolation pillars 102, some portions of the sacrificial layers 53 in the periphery region also provides further support to prevent the dielectric layers 52 in the array region from collapse.

Figure 18A:
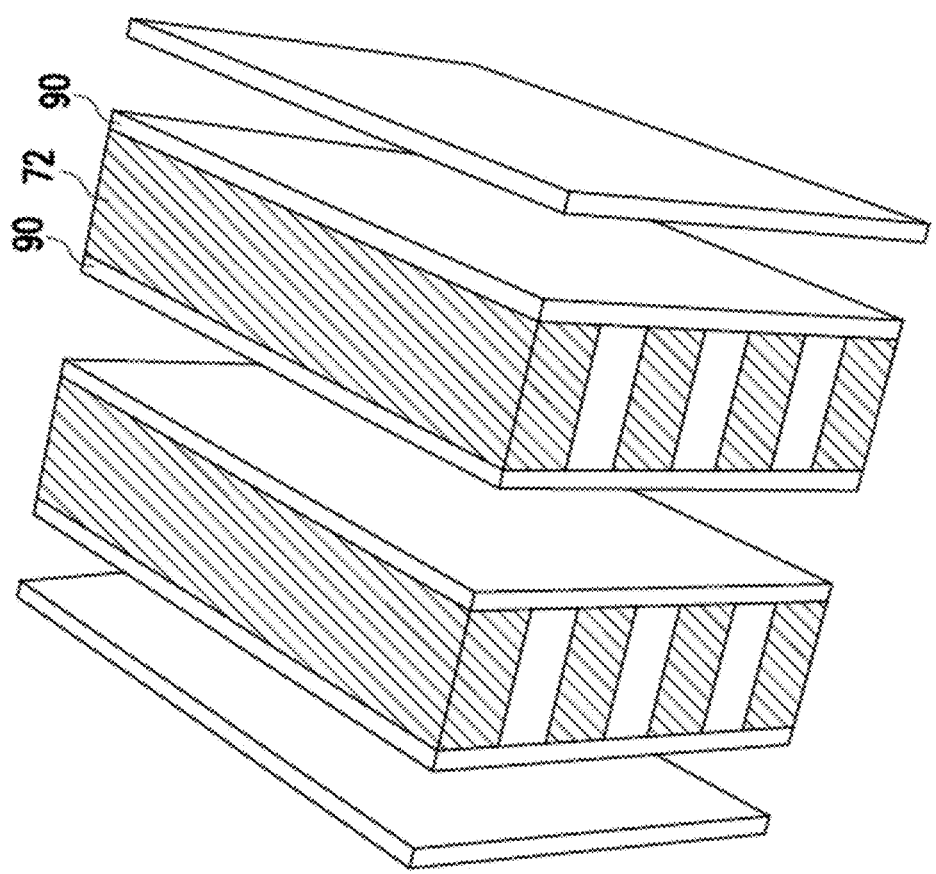
Figure 18B:
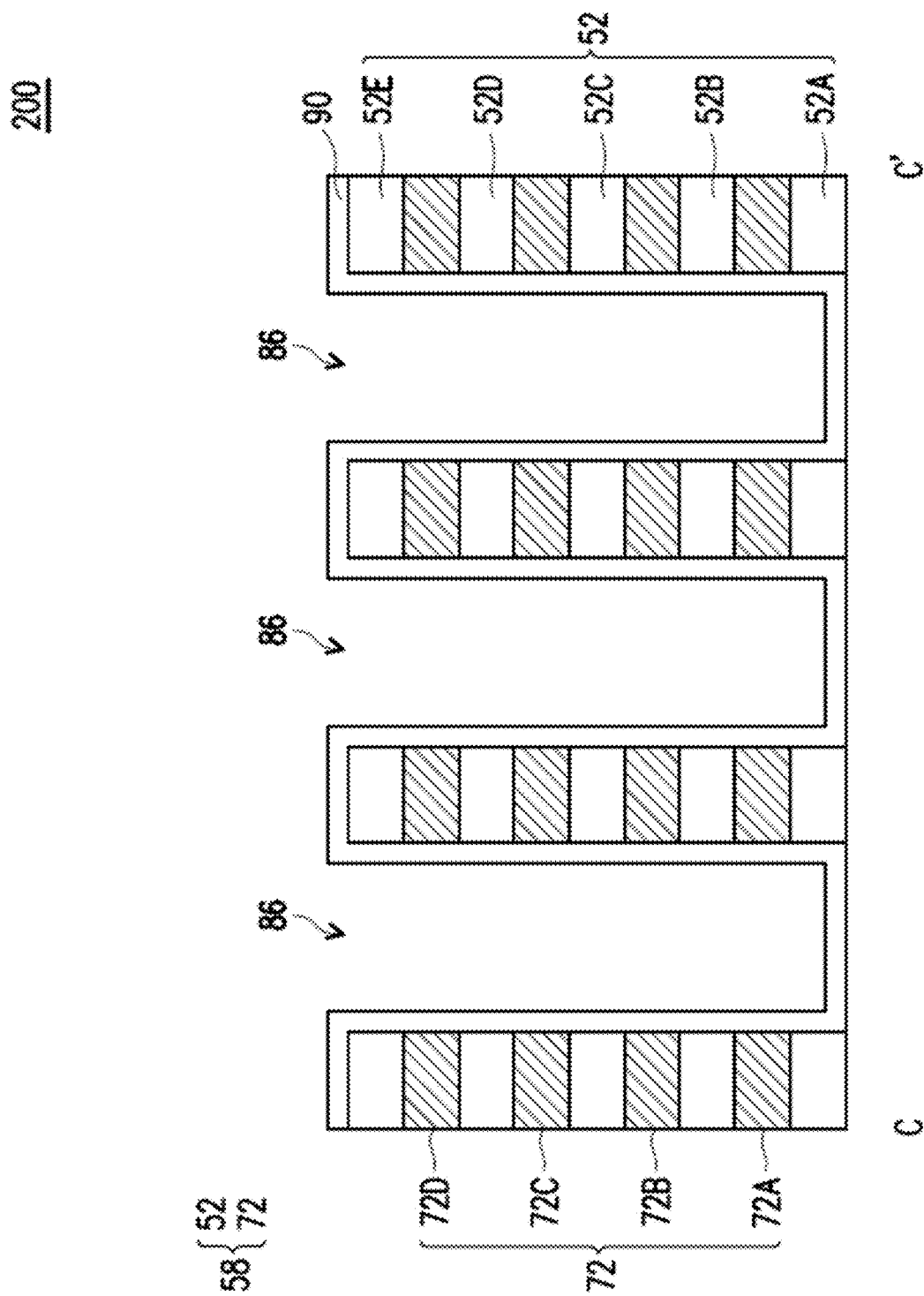
Figure 19A:
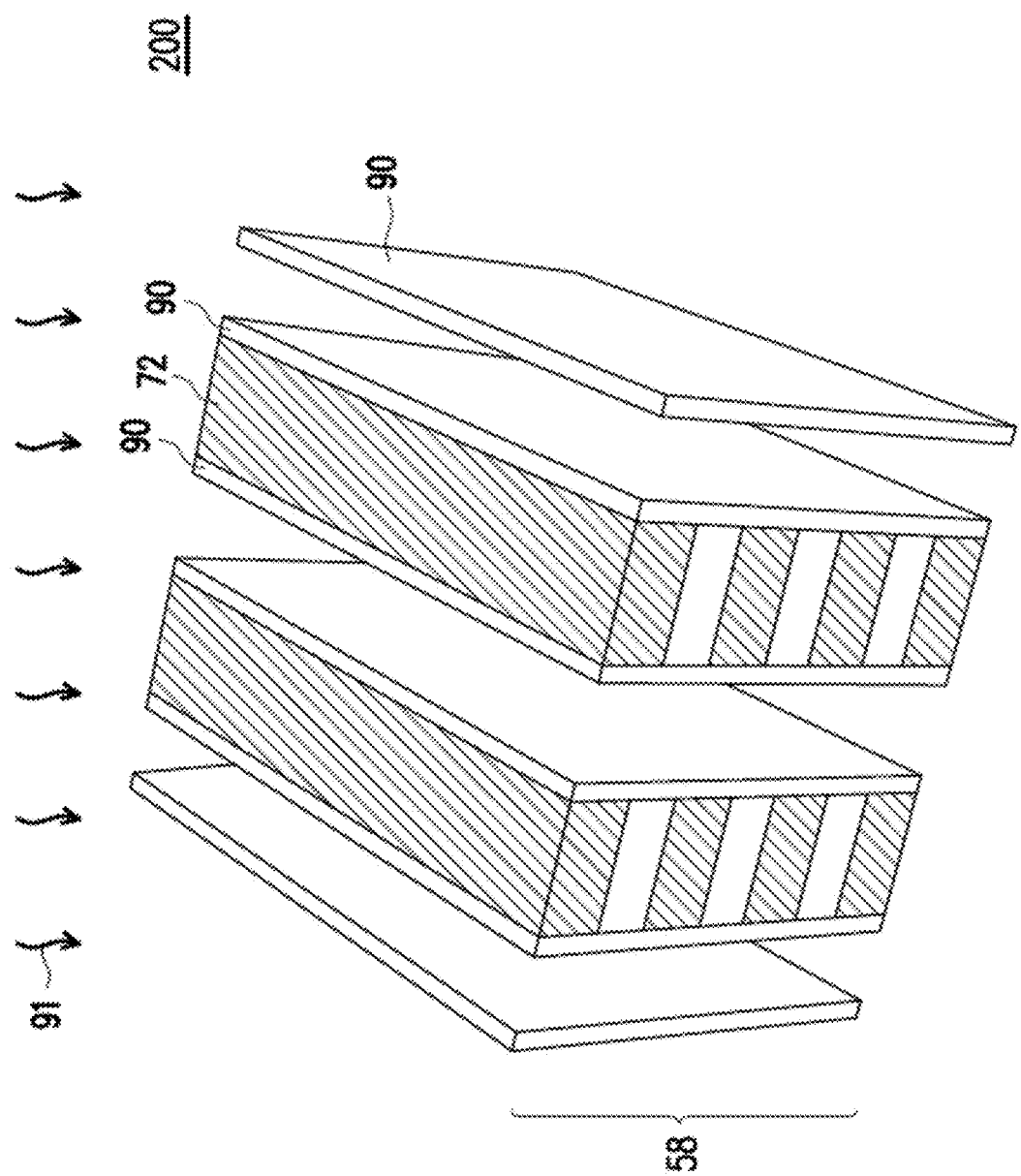
Figure 19B:
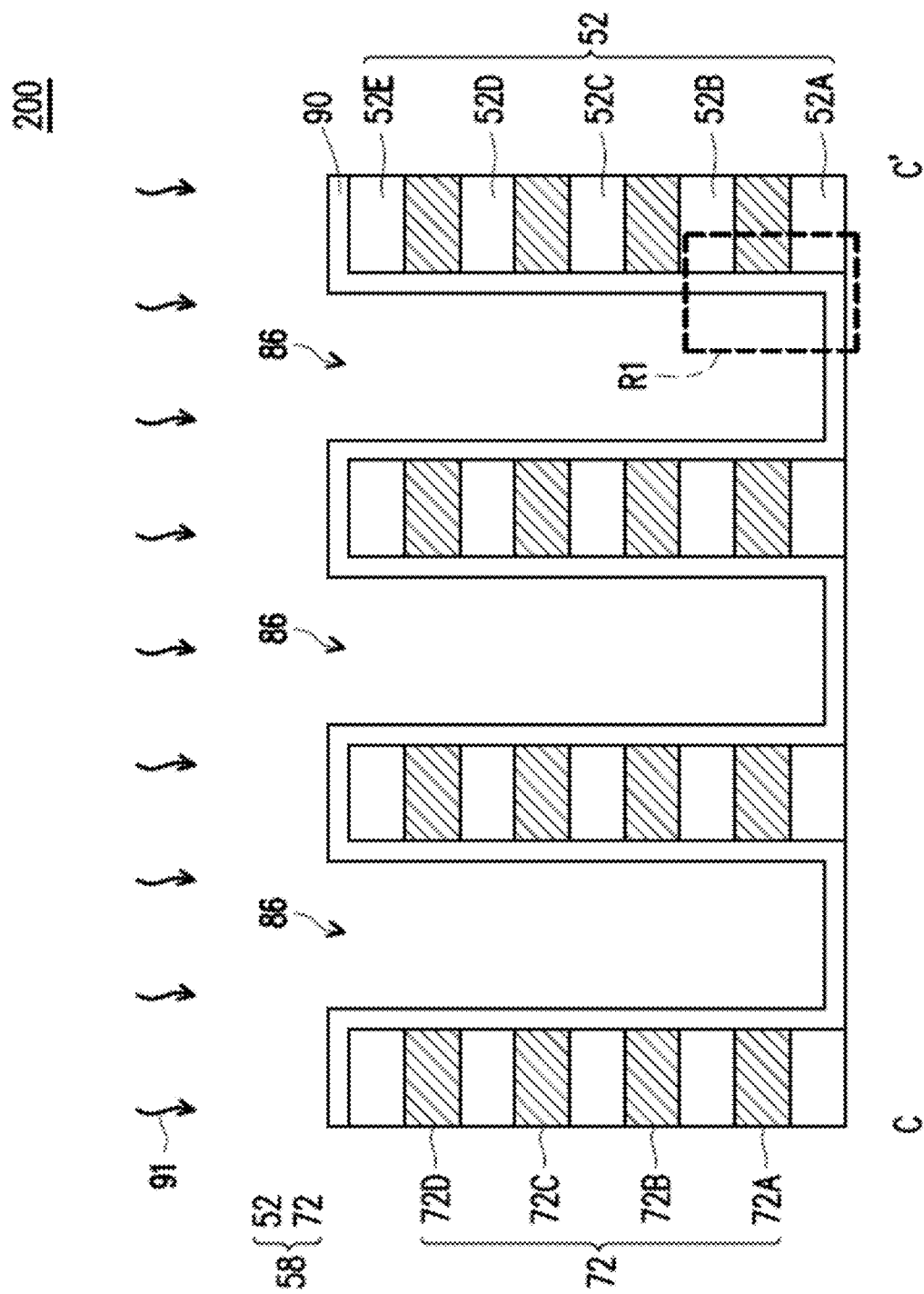
Figure 19C:
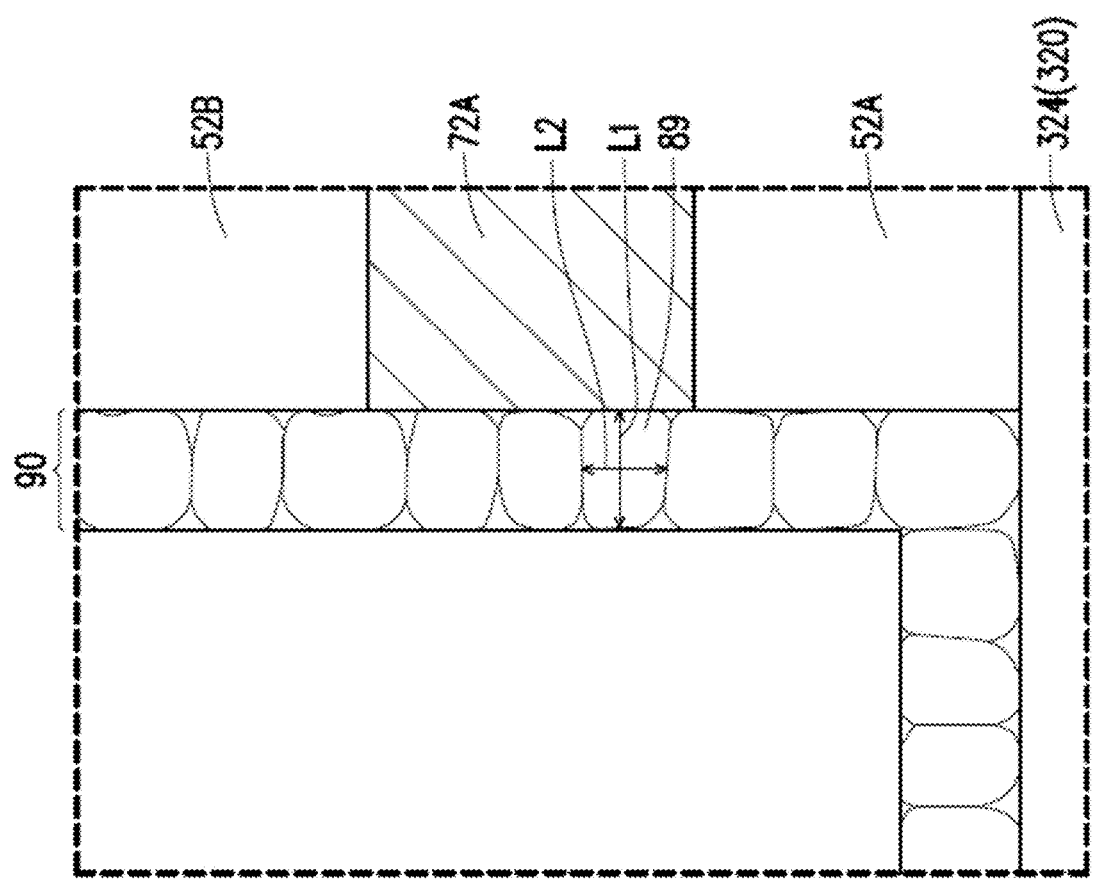
Figure 19E:
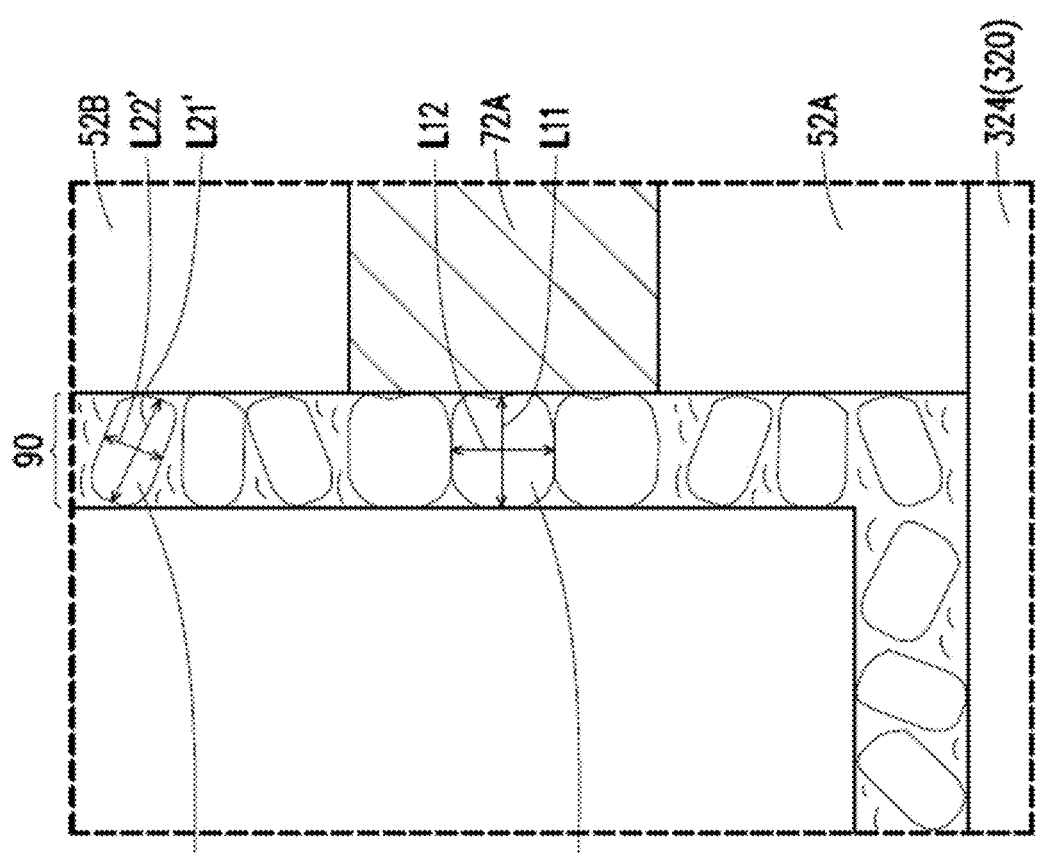

FIGS. 18A through 19E illustrate forming a III-V based ferroelectric layer 90 on sidewalls of the conductive layers 72 and the dielectric layers 52 of the multi-layer stack 58. FIGS. 18A and 19A are illustrated in a partial three-dimensional view. In FIGS. 18B and 19B, cross-sectional views are provided along line C-C' of FIG. 1A. FIGS. 19C, 19D and 19E illustrate local enlarged views in a region R1 of FIG. 19B.

In FIGS. 18A and 18B, a III-V based ferroelectric layer 90 may be deposited conformally in the trenches 86 along sidewalls of the conductive lines 72 and the dielectric layers 52, along top surfaces of the dielectric layer 52E, and along the bottom surfaces of the trenches 86. In some embodiments, the III-V based ferroelectric layer 90 may be further deposited on the IMD 70 and along the sidewall of each step of the staircase structure in the staircase region.

In some embodiments, the III-V based ferroelectric layer 90 includes at least one element selected from Group III elements, at least one element selected from Group V elements, and at least one element selected from transition metal elements. In some embodiments, the III-V compound can exhibit ferroelectric characteristics by adding a suitable transition metal thereto.

In some embodiments, the Group III elements include B, Al, Ga, In and Tl. For example, the Group III elements include Al and Ga. In some embodiments, the Group V elements include N, P, As, Sb and Bi. For example, the Group III elements include N. In some embodiments, the transition metal elements include Group 3-12 transition metal elements, in particular, Sc, Y, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd and Hg. In some embodiments, the transition metal elements include Group 3 transition metal elements. For example, the transition metal elements include Sc and Y. In some embodiments, the III-V based ferroelectric material includes AlScN, AlYN, GaScN, InScN or a combination thereof.

In some embodiments, the transition metal content of the III-V based ferroelectric material ranges from about 10 at % (atomic percent) to 40 at % (atomic percent), so as to provide better switching between two different polarization directions by applying an appropriate voltage differential across the III-V based ferroelectric layer 90. For example, the transition metal content of the III-V based ferroelectric material may be 10 at %, 15 at %, 20 at %, 25 at %, 30 at %, 35 at %, or 40 at %, including any range between any two of the preceding values and any range more than any one of the preceding values. The transition metal content of the III-V based ferroelectric material may be more than about 40 at % as needed.

In some embodiments, the method of forming the III-V based ferroelectric layer 90 includes introducing a Group III element, a Group V element precursor and a transition metal precursor into a process chamber, so as to form a III-V based ferroelectric layer on the sidewalls of the trenches 86. The process chamber is an ALD chamber, for example. Other process chamber such as a CVD chamber may be used in other embodiments. In some embodiments, III-V films and transition metal nitride films are stacked with each other to form a multi-layer structure. In some embodiments, the III-V films include wurzite-based AlN or GaN, and the transition metal nitride films include ScN or YN.

In some embodiments, when the III-V based ferroelectric layer 90 includes AlScN, the precursor of AlN includes $Al(CH_3)_3$ and $NH_3$, and the precursor of ScN includes $Sc(NO_3)_3 \cdot xH_2O$ and $NH_3$. In some embodiments, when the III-V based ferroelectric layer 90 includes AlYN, the precursor of AlN includes $Al(CH_3)_3$ and $NH_3$, and the precursor of YN includes tris[N,N-bis(trimethylsily)amide]yttrium and $NH_3$. In some embodiments, when the III-V based ferroelectric layer 90 includes GaScN, the precursor of GaN includes trimethylgallium and $NH_3$, and the precursor of ScN includes $Sc(NO_3)_3 \cdot xH_2O$ and $NH_3$. In some embodiments, when the III-V based ferroelectric layer 90 includes InScN, the precursor of InN includes trimethylindium and $NH_3$, and the precursor of ScN includes $Sc(NO_3)_3 \cdot xH_2O$ and $NH_3$. Other precursors may be used in other embodiments.

In some embodiments, the ALD process may be performed at a temperature in a range of about 150° C. to about 400° C. at a pressure of about 1 to 760 torr. In the case that the process chamber is an ALD chamber, the required precursors are sequentially introduced into the ALD chamber. In the case that the chamber is a CVD chamber, the required precursors are simultaneously introduced into the CVD chamber.

Thereafter, as shown in FIGS. 19A and 19B, an annealing process 91 is performed to the III-V based ferroelectric layer 90. The temperature range of the annealing process 91 ranges from about 250° C. to about 400° C. in an oxygen-containing or nitrogen-containing ambient (e.g., $O_2$, $N_2$ or $NH_3$), so as to achieve a desired crystalline lattice structure for the III-V based ferroelectric layer 90. In some embodiments, upon the annealing process 91, the III-V based ferroelectric layer 90 is transformed from an amorphous state to a partially or fully crystalline sate. In alternative embodiments, upon the annealing process 91, ferroelectric layer 90 is transformed from a partially crystalline state to a fully crystalline sate. In some embodiments, a crystalline structure can be achieved in the III-V based ferroelectric layer 90 from the relatively low temperature annealing. Accordingly, BEOL integration of the memory array 200 may be improved.

In some embodiments, the III-V based ferroelectric layer 90 has a thickness of about 10-100 nm, such as 20-50 nm. Other thickness ranges may be applicable. In some embodiments, upon the annealing process 91, the III-V based ferroelectric layer 90 is formed in a fully crystalline state. In other embodiments, upon the annealing process 91, the III-V based ferroelectric layer 90 is formed in a partially crystalline state; that is, the III-V based ferroelectric layer 90 is formed in a mixed crystalline-amorphous state and having some degree of structural order. In some embodiments, the III-V based ferroelectric layer 90 is a single layer. In alternative embodiments, the III-V based ferroelectric layer 90 is a multi-layer structure.

Figure 19D:
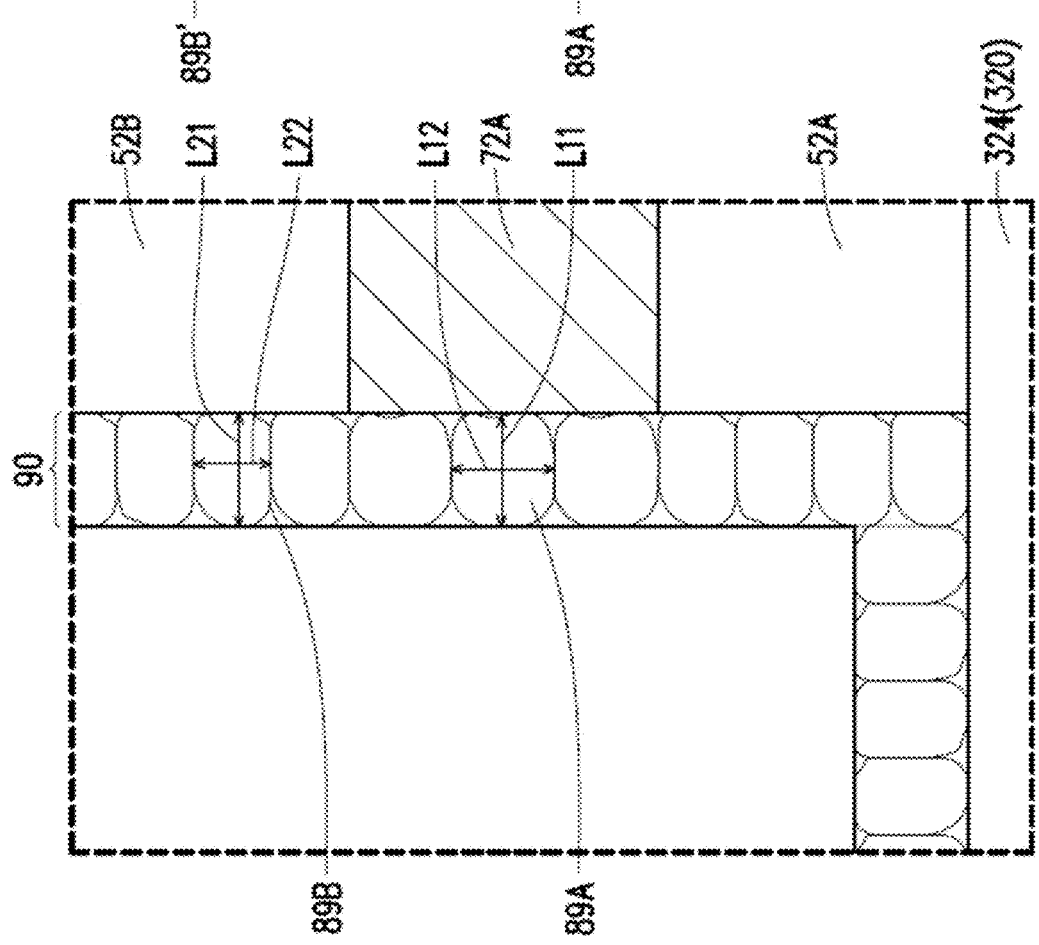

FIGS. 19C to 19E illustrate local enlarged views of the region R1 of FIG. 19B, so as to describe the relation of the III-V based ferroelectric layer 90 with respect to the adjacent elements.

In FIG. 19C, the columnar-like crystalline grains (e.g., polycrystalline grains) in the III-V based ferroelectric layer 90 may have similar size. Herein, the similar size indicates that the long-axis length or the short-axis length of the columnar-like grains may have +−10% variation or less due to the process tolerance. In some embodiments, the columnar-like grains 89 in the III-V based ferroelectric layer 90 have a long-axis length L1 and a short-axis length L2 across (e.g., perpendicular to) the long-axis length L1.

Herein, the long-axis length indicates the longest distance along the long-axis direction, and the short-axis length indicates the longest distance along the short-axis direction. The long-axis length may be greater than (or equal to, in some examples) than the short-axis length.

In some embodiments, the long-axis length L1 ranges from about 10 to 100 nm, and the short-axis length L2 ranges from about 1 to 20 nm. In some embodiments, the III-V based ferroelectric layer 90 are in a crystalline state and the long-axis direction of the columnar-like grains 89 in the III-V based ferroelectric layer 90 is perpendicular to the dielectric layers 52, the conductive layers 72 and the topmost dielectric layer 324 of the interconnect structure 320.

Herein, when an element is described as being "perpendicular to" another element, the included angle between these two elements is about 90 degrees or between 85 to 95 degrees due to the process tolerance.

In FIG. 19D, the columnar-like grains in the III-V based ferroelectric layer 90 may have different sizes because the contacting materials are different when the grains are grown. In some embodiments, the columnar-like grains 89A in the III-V based ferroelectric layer 90 contacting the conductive layers 72 have a long-axis length L11 and a short-axis length L12 across (e.g., perpendicular to) the long-axis length L11. In some embodiments, the long-axis length L11 ranges from about 10 to 100 nm, and the short-axis length L12 ranges from about 5 to 20 nm. In some embodiments, the columnar-like grains 89B in the III-V based ferroelectric layer 90 contacting the dielectric layers 52 have a long-axis length L21 and a short-axis length L22 across (e.g., perpendicular to) the long-axis length L21. In some embodiments, the long-axis length L21 ranges from about 10 to 100 nm, and the short-axis length L22 ranges from about 1 to 5 nm. In some embodiments, the III-V based ferroelectric layer 90 are in a crystalline state and the long-axis direction of the columnar-like grains in the III-V based ferroelectric layer 90 is perpendicular to the dielectric layers 52, the conductive layers 72 and the topmost dielectric layer 324 of the interconnect structure 320. Specifically, the long-axis direction of the columnar-like grains 89A is perpendicular to contacting surfaces of the conductive layers 72, and the long-axis direction of the columnar-like grains 89B is perpendicular to the contacting surfaces of the dielectric layers 52.

In FIG. 19E, the columnar-like grains in the III-V based ferroelectric layer 90 may have different sizes because the contacting materials are different when the grains are grown. In some embodiments, the columnar-like grains 89A in the III-V based ferroelectric layer 90 contacting the conductive layers 72 have a long-axis length L11 and a short-axis length L12 across (e.g., perpendicular to) the long-axis length L11. In some embodiments, the long-axis length L11 ranges from about 10 to 100 nm, and the short-axis length L12 ranges from about 5 to 20 nm. In some embodiments, the columnar-like grains 89B' in the III-V based ferroelectric layer 90 contacting the dielectric layers 52 have a long-axis length L21' and a short-axis length L22' across (e.g., perpendicular to) the long-axis length L21'. In some embodiments, the long-axis length L21' ranges from about 10 to 100 nm, and the short-axis length L22' ranges from about 1 to 5 nm. In some embodiments, the III-V based ferroelectric layer 90 is in a crystalline-amorphous mixed state. In some embodiments, the III-V based ferroelectric layer 90 is in a crystalline state when it is formed from the surfaces of the conductive layers 72, and the long-axis direction of the columnar-like grains 89A is perpendicular to the contacting surfaces of the conductive layers 72. Besides, the III-V based ferroelectric layer 90 is in a crystalline-amorphous mixed state when it is formed from the surfaces of the dielectric layers 52, and part of the III-V based ferroelectric layer 90 have columnar-like grains 89B' with a long-axis direction non-perpendicular to (e.g., tilted to) the contacting surfaces of the dielectric layers 52, and part of the III-V based ferroelectric layer 90 is in an amorphous state without grains.

Figure 20A:
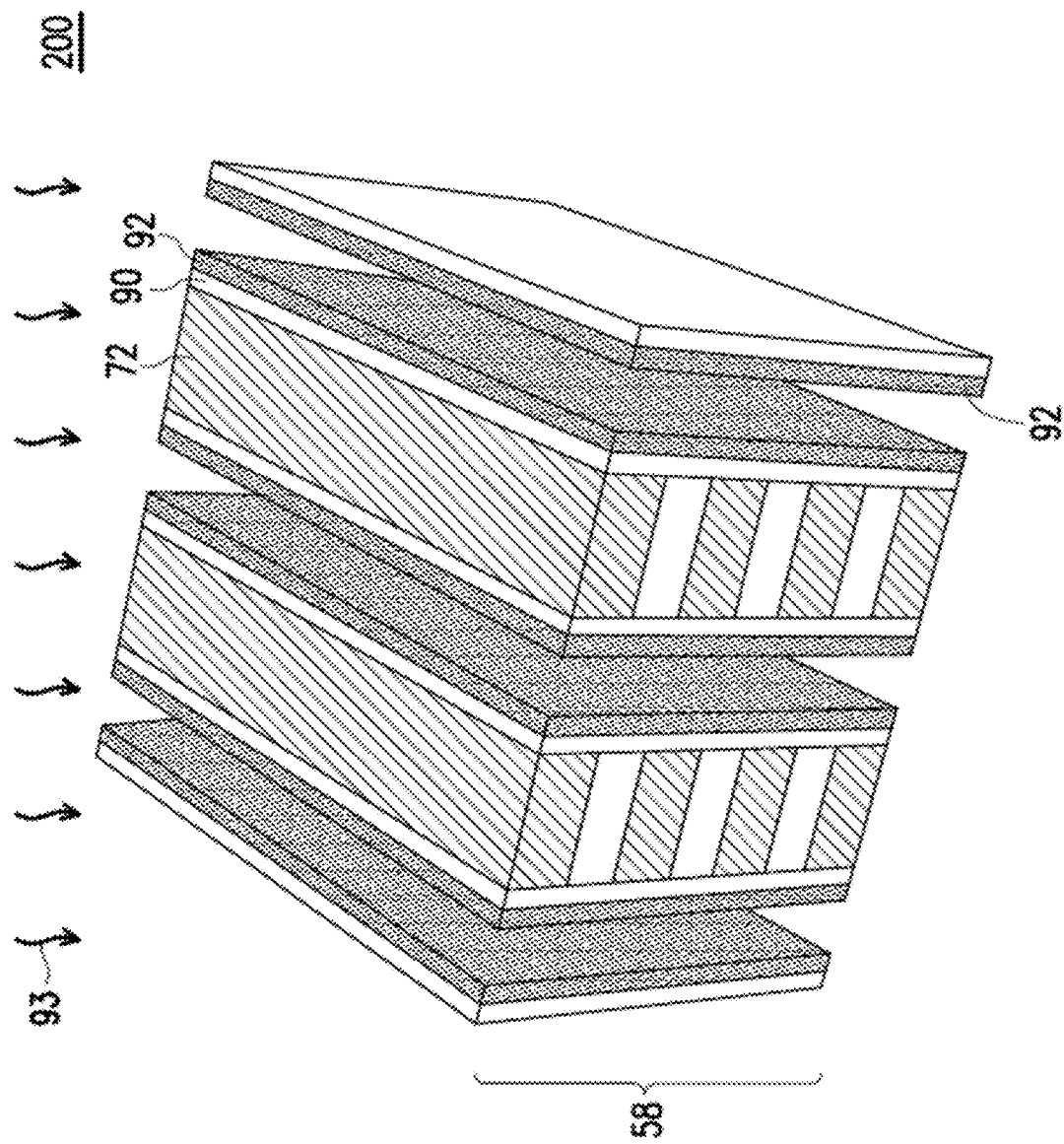
Figure 20B:
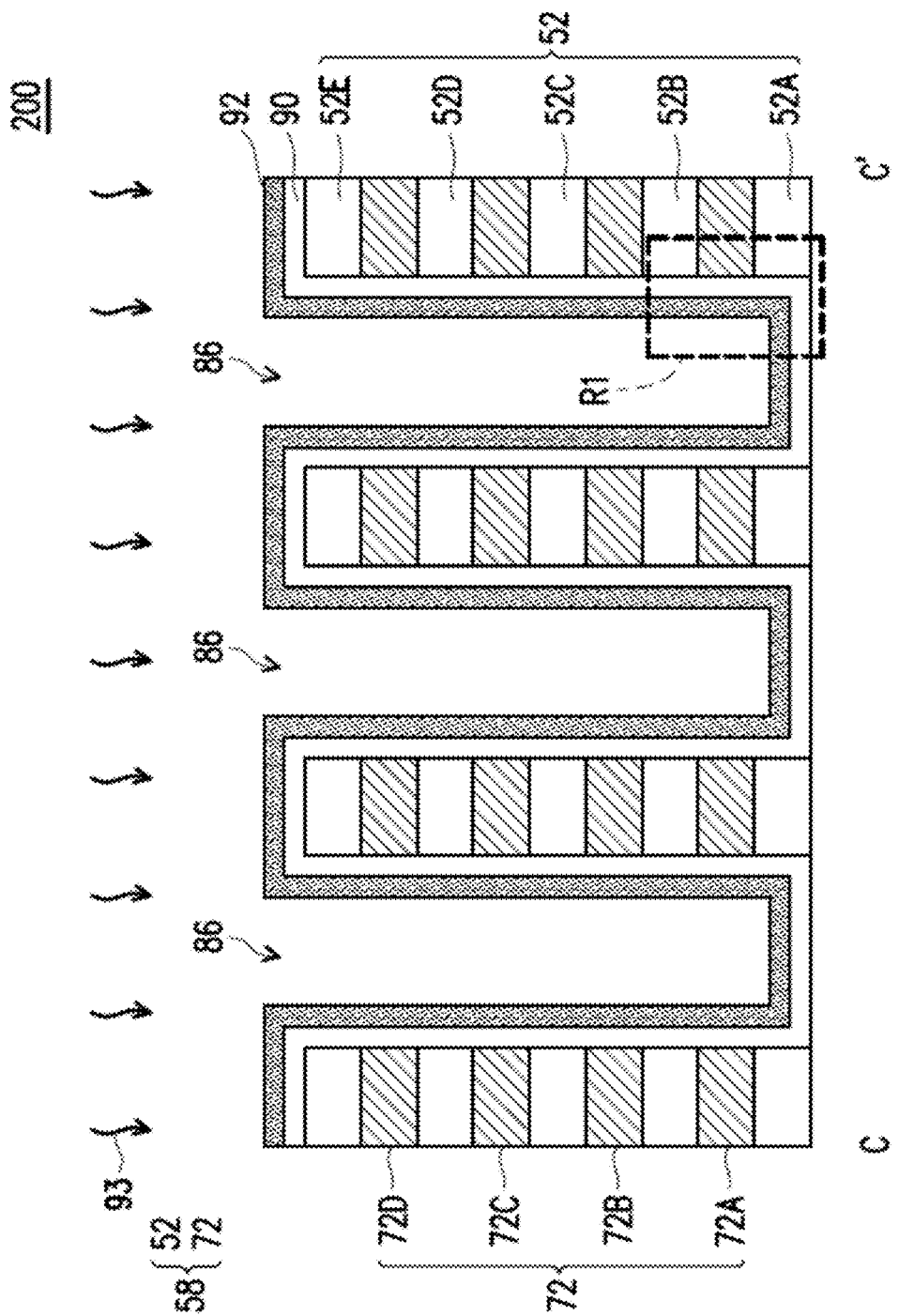
Figure 20C:
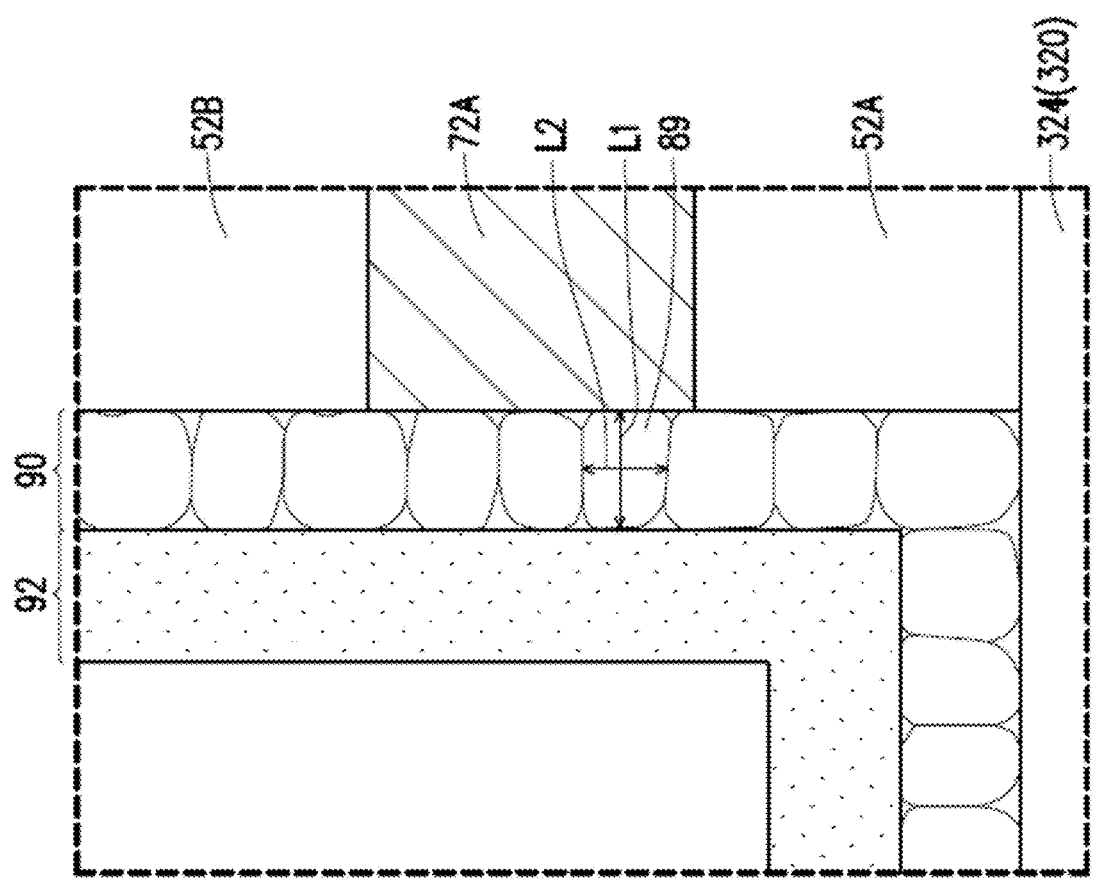

FIGS. 20A through 20E illustrate forming a channel layer 92 on the III-V based ferroelectric layer 90. FIG. 20A is illustrated in a partial three-dimensional view. In FIG. 20B, a cross-sectional view is provided along line C-C' of FIG. 1A. FIGS. 20C, 20D and 20E illustrate local enlarged views in a region R1 of FIG. 20B.

In FIGS. 20A and 20B, a channel layer 92 is conformally deposited in the trenches 86 over the III-V based ferroelectric layer 90. The channel layer 92 includes materials suitable for providing channel regions for the memory cells 202 (see FIG. 1A). For example, the channel layer 92 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. In some embodiments, channel layer 92 includes polycrystalline silicon (poly-Si), amorphous silicon (a-Si), or the like. The channel layer 92 may be deposited by CVD, PVD, ALD, PECVD, or the like. The channel layer 92 may extend along sidewalls and bottom surfaces of the trenches 86 over the III-V based ferroelectric layer 90. In some embodiments, the channel layer 92 may be further deposited on the IMD 70 and along the sidewall of each step of the staircase structure in the staircase region. After the channel layer 92 is deposited, an annealing step 93 (e.g., at a temperature range of about 300° C. to about 450° C.) in an oxygen containing ambient may be performed to activate the charge carriers of the channel layer 92.

FIGS. 20C to 20E illustrate local enlarged views of the region R1 of FIG. 19B, so as to describe the relation of the III-V based ferroelectric layer 90 with respect to the adjacent elements.

In FIG. 20C, the long-axis direction of the columnar-like grains 89 in the III-V based ferroelectric layer 90 is perpendicular to the contacting surface of the channel layer 92.

In FIG. 20D, the long-axis directions of the columnar-like grains 89A/89B with difference sizes in the III-V based ferroelectric layer 90 are perpendicular to the contacting surface of the channel layer 92.

In FIG. 20E, part of the III-V based ferroelectric layer 90 have columnar-like grains 89A with a long-axis direction perpendicular to the contacting surface of the channel layer 92, and part of the III-V based ferroelectric layer 90 have columnar-like grains 89B' with a long-axis direction non-perpendicular to (e.g., tilted to) the contacting surface of the channel layer 92.

Figure 21:
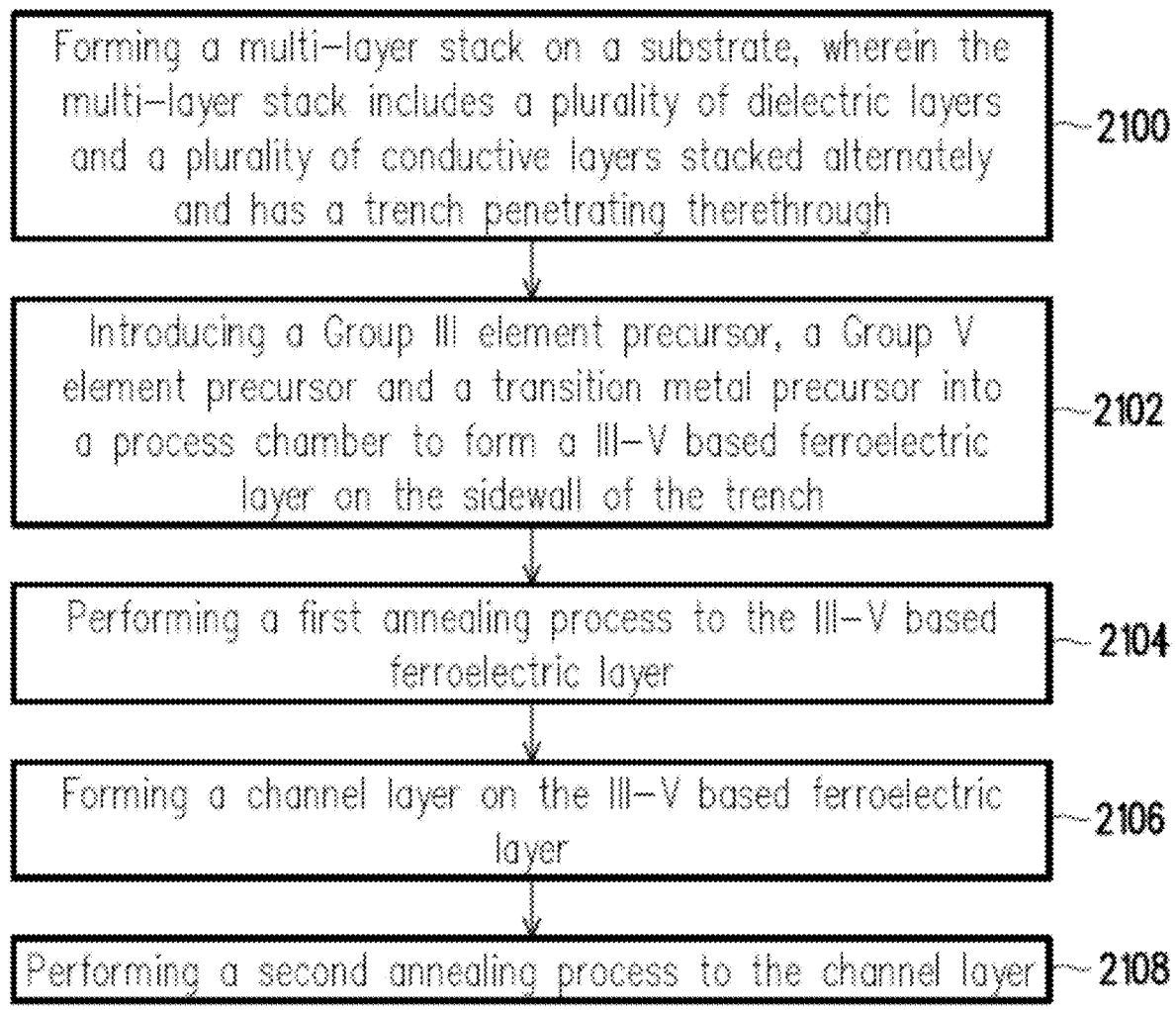
FIG. 21 illustrates a method of forming a ferroelectric layer and a channel layer of a ferroelectric memory device in accordance with some embodiments.

FIG. 21 illustrates a method of forming a ferroelectric layer and a channel layer of a ferroelectric memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2100, a multi-layer stack is formed on a substrate, and the multi-layer stack includes a plurality of dielectric layers and a plurality of conductive layers stacked alternately and has a trench penetrating therethrough. FIG. 14 to FIG. 17B illustrate varying views corresponding to some embodiments of act 2100.

At act 2102, a Group III element precursor, a Group V element precursor and a transition metal precursor are introduced into a process chamber to form a III-V based ferroelectric layer on the sidewall of the trench. FIG. 18A to FIG. 18B illustrate varying views corresponding to some embodiments of act 2102.

At act 2104, a first annealing process is performed to the III-V based ferroelectric layer. In some embodiments, the temperature range of the first annealing process ranges from about 250° C. to about 400° C. in an $O_2$, $N_2$ or $NH_3$ ambient, so as to achieve a desired crystalline lattice structure for the III-V based ferroelectric layer. FIG. 19A to FIG. 19E illustrate varying views corresponding to some embodiments of act 2104.

At act 2106, a channel layer is formed on the III-V based ferroelectric layer. FIG. 20A to FIG. 20E illustrate varying views corresponding to some embodiments of act 2106.

At act 2108, a second annealing process is performed to the channel layer. In some embodiments, the temperature range of the second annealing process ranges from about 350° C. to about 400° C. in an oxygen containing ambient, so as to activate the charge carriers of the channel layer 92. FIG. 20A to FIG. 20E illustrate varying views corresponding to some embodiments of act 2108.

Figure 22:
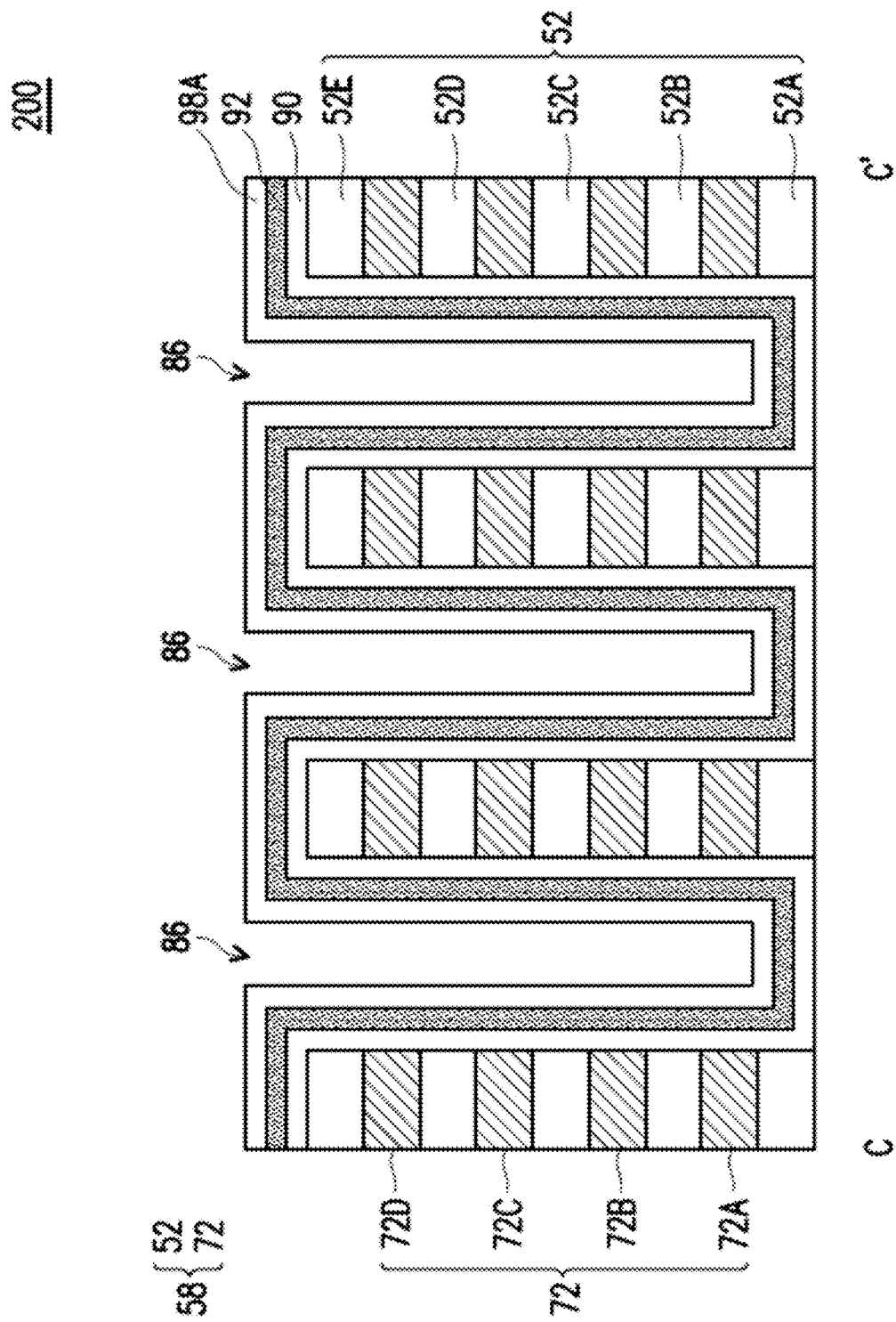

In FIG. 22, a dielectric material 98A is deposited in the trenches 86 over the channel layer 92. In some embodiments, the dielectric material 98A includes silicon oxide, silicon nitride, silicon oxynitride, or the like, which may be deposited by CVD, PVD, ALD, PECVD, or the like. The dielectric material 98A may extend along sidewalls and bottom surfaces of the trenches 86 over the channel layer 92. In some embodiments, the dielectric material 98A is optional and may be omitted as needed.

Figure 23:
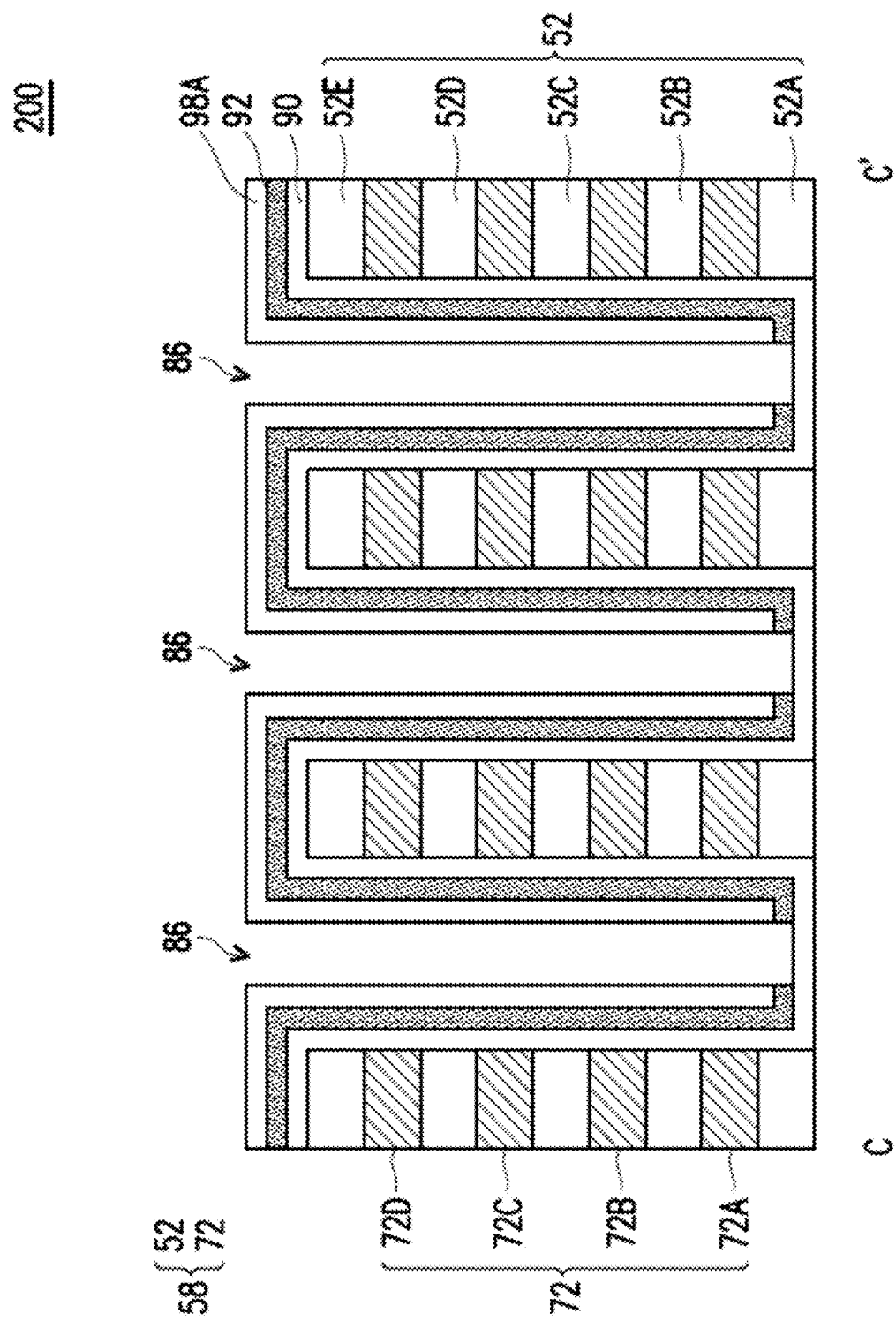

In FIG. 23, bottom portions of the dielectric material 98A and the channel layer 92 are removed in the trenches 86. The removal process includes an acceptable etching process, such as a dry etch (e.g., RIE, NBE, the like), a wet etch, the like, or a combination thereof. The etching may be anisotropic. In some embodiments, the top portions of the dielectric material 98A and the channel layer 92 are removed from the multi-layer stack 58. In some embodiments, removal process includes a combination of photolithography and etching.

Accordingly, the remaining dielectric material 98A and the channel layer 92 may expose portions of the III-V based ferroelectric layer 90 on bottom surfaces of the trenches 86. Thus, portions of the channel layer 92 on opposing sidewalls of the trenches 86 may be separated from each other, which improves isolation between the memory cells 202 of the memory array 200 (see FIG. 1A).

Figure 24:
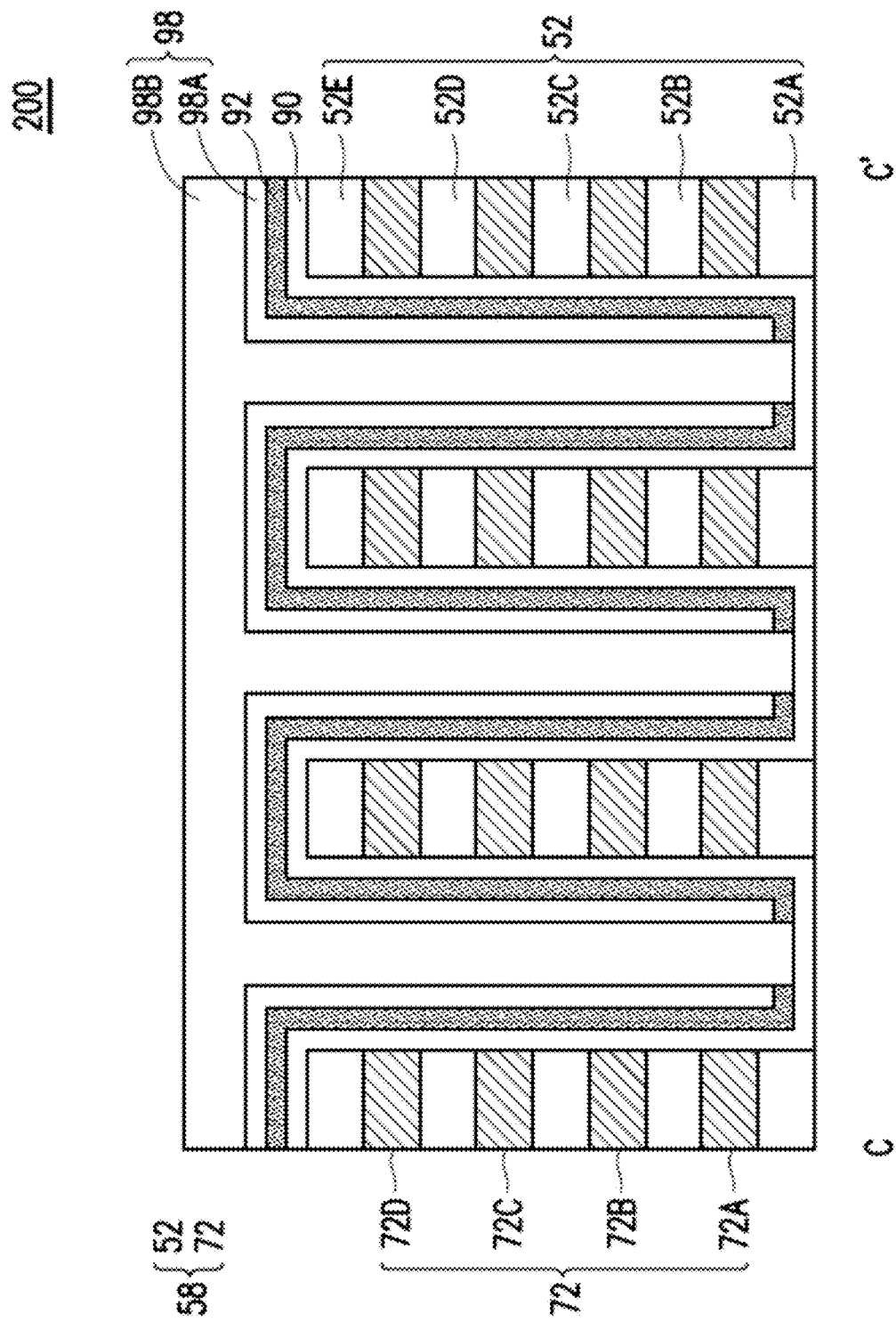

In FIG. 24, a dielectric material 98B is deposited to completely fill the trenches 86. The dielectric material 98B may be formed of one or more materials and by processes the same as or similar to those of the dielectric material 98A. In some embodiments, the dielectric material 98B and the dielectric material 98A include different materials.

Figure 25A:
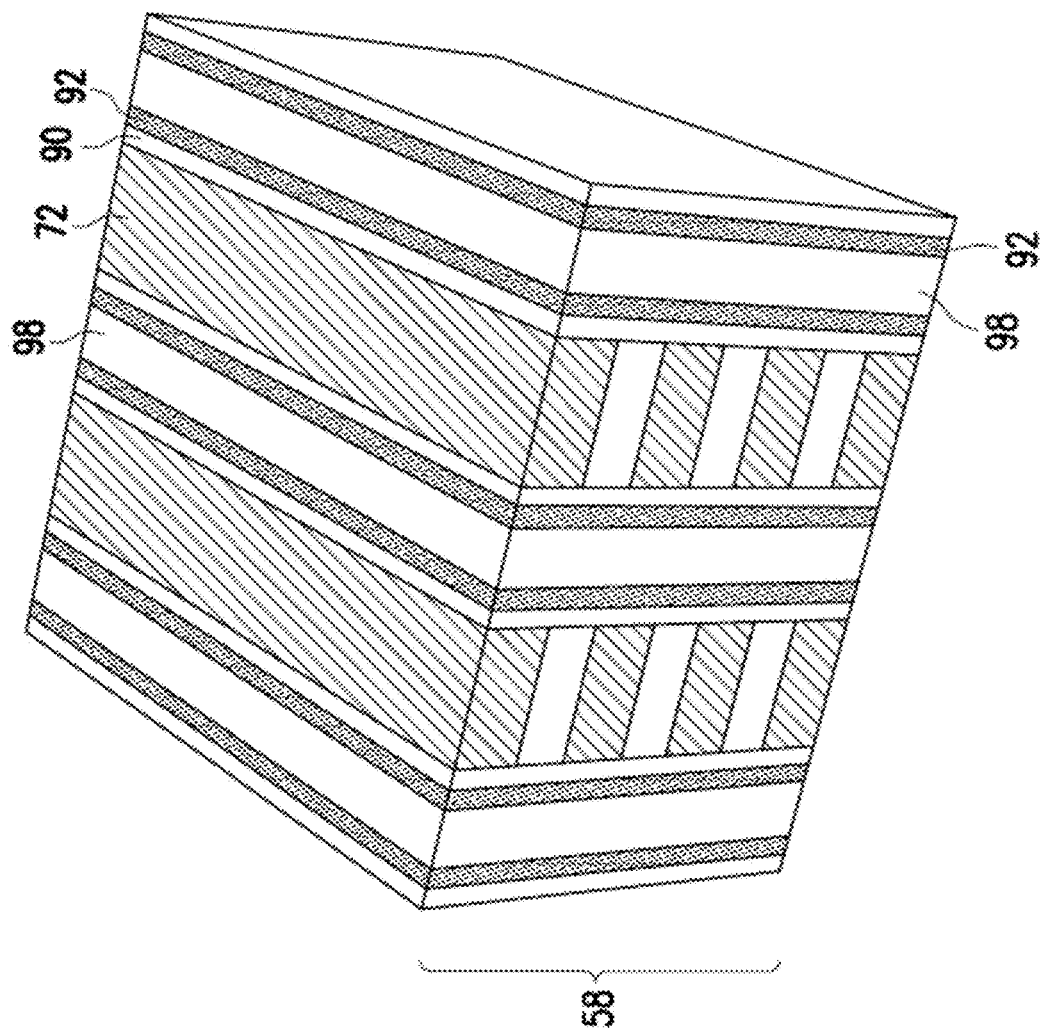
Figure 25B:
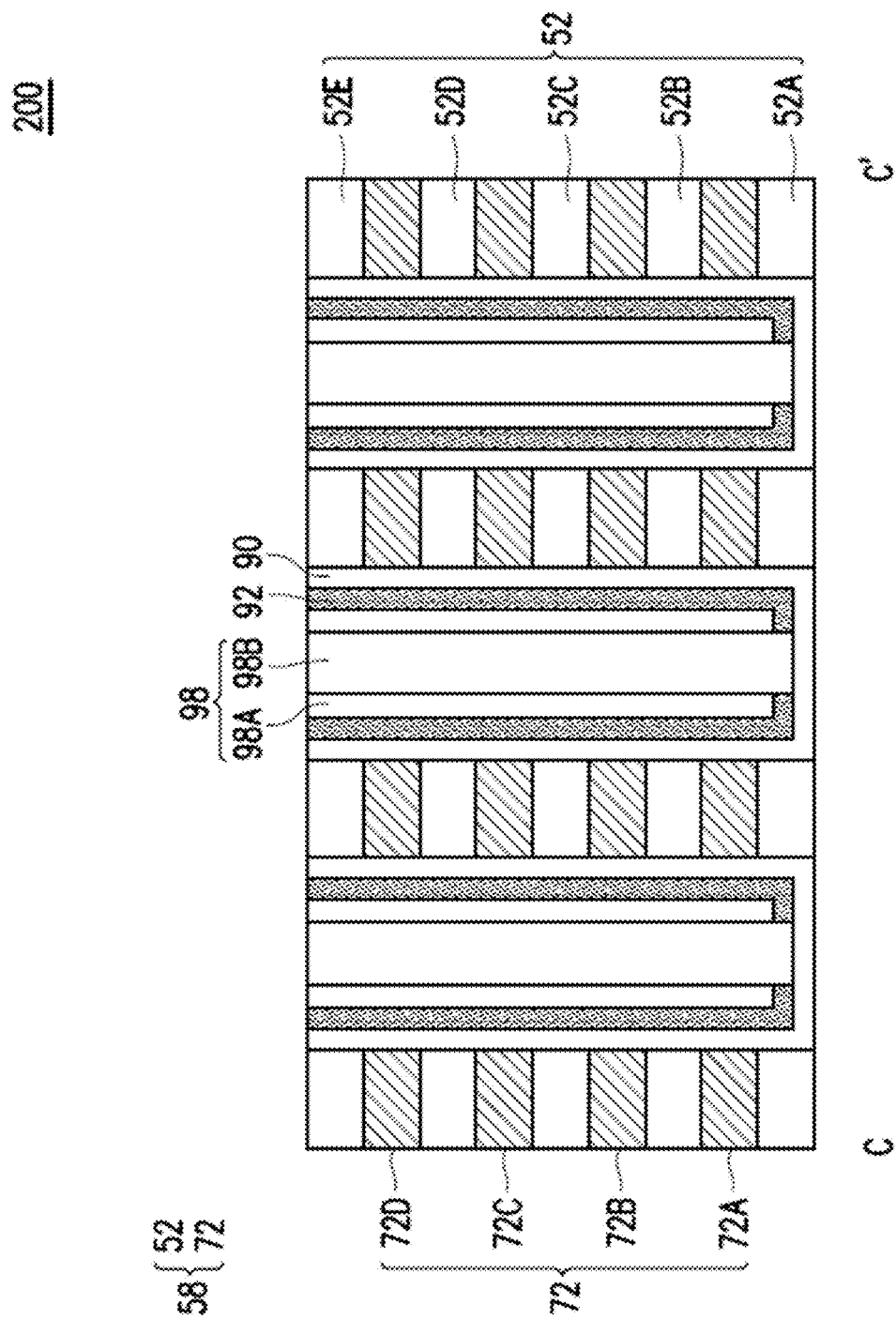

In FIGS. 25A and 25B, a removal process is applied to the dielectric material 98A/98B (collectively referred to as dielectric material 98), the channel layer 92, and the III-V based ferroelectric layer 90 to remove excess materials over the multi-layer stack 58. In some embodiments, a planarization process such as a CMP, an etch-back process, combinations thereof, or the like may be utilized. The planarization process exposes the multi-layer stack 58 such that top surfaces of the multi-layer stack 58 (e.g., the dielectric layer 52E), the III-V based ferroelectric layer 90, the channel layer 92, the dielectric material 98, and the IMD 70 are level after the planarization process is complete.

Figure 27A:
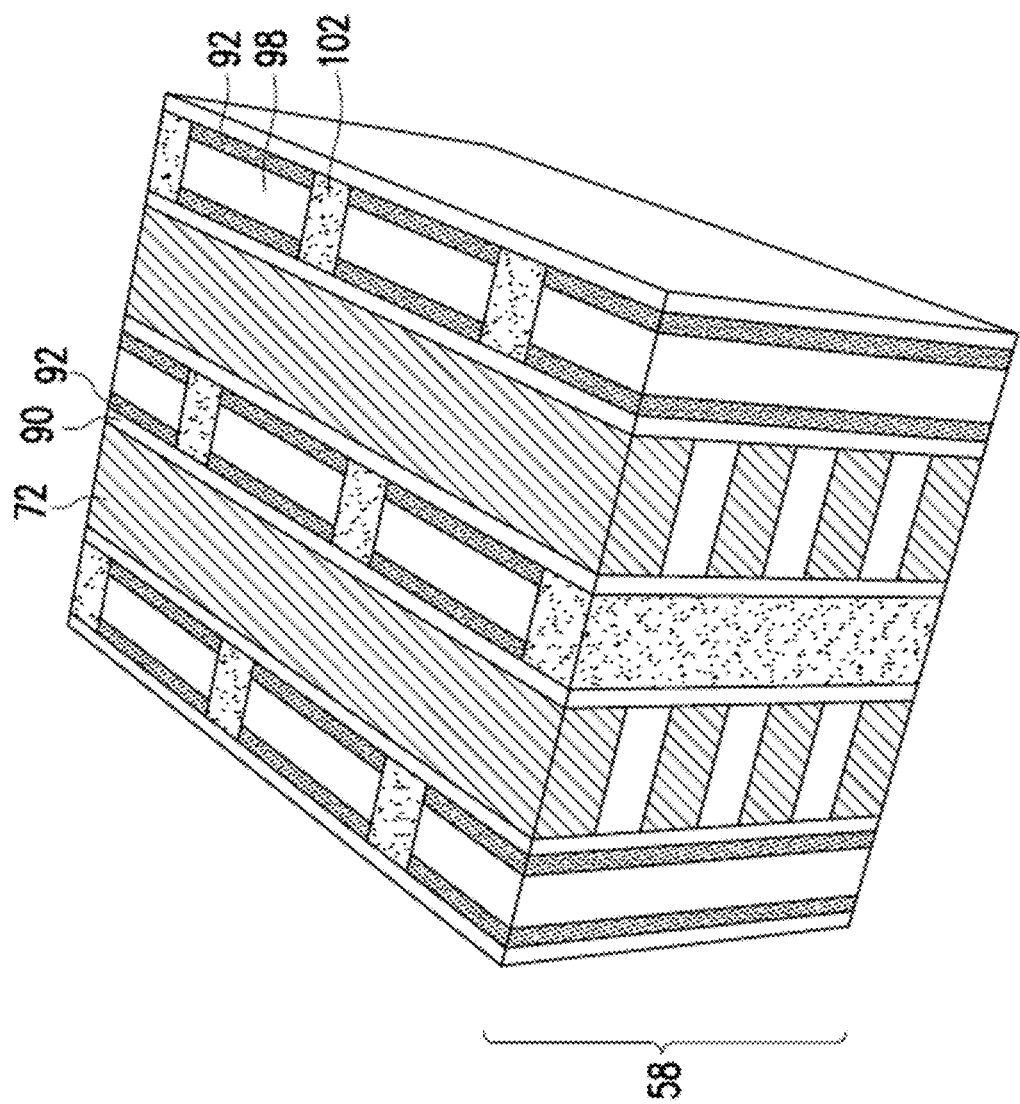
Figure 27B:
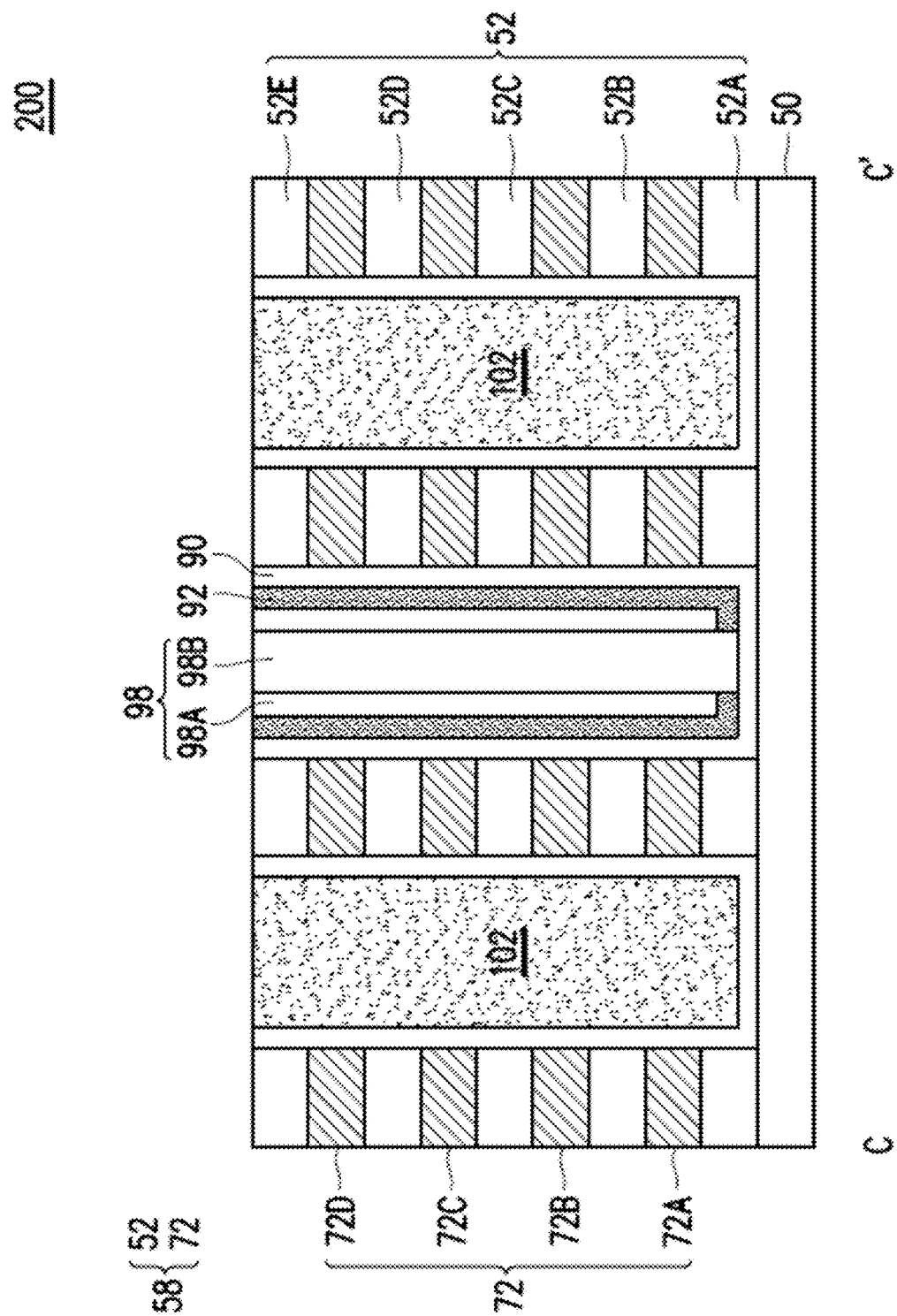
Figure 28A:
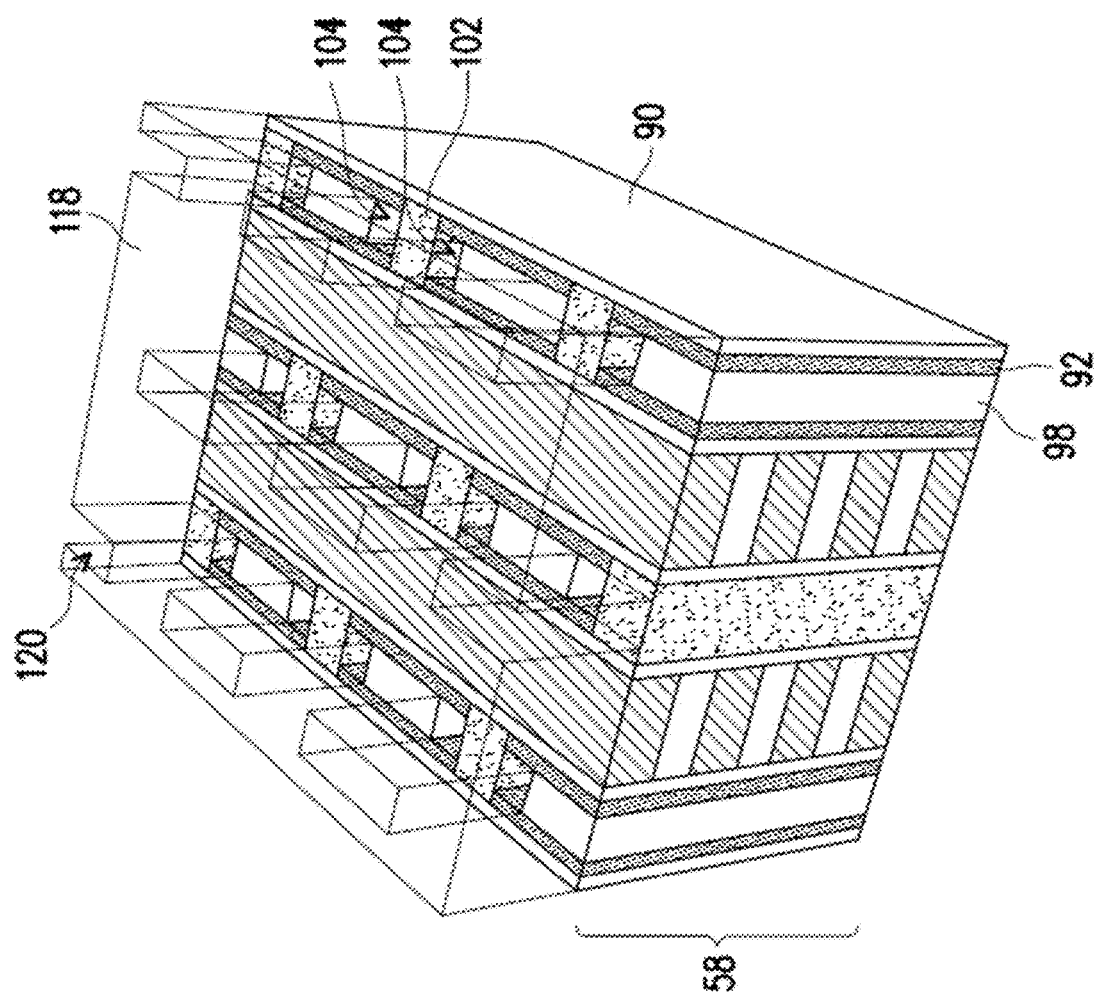
Figure 28B:
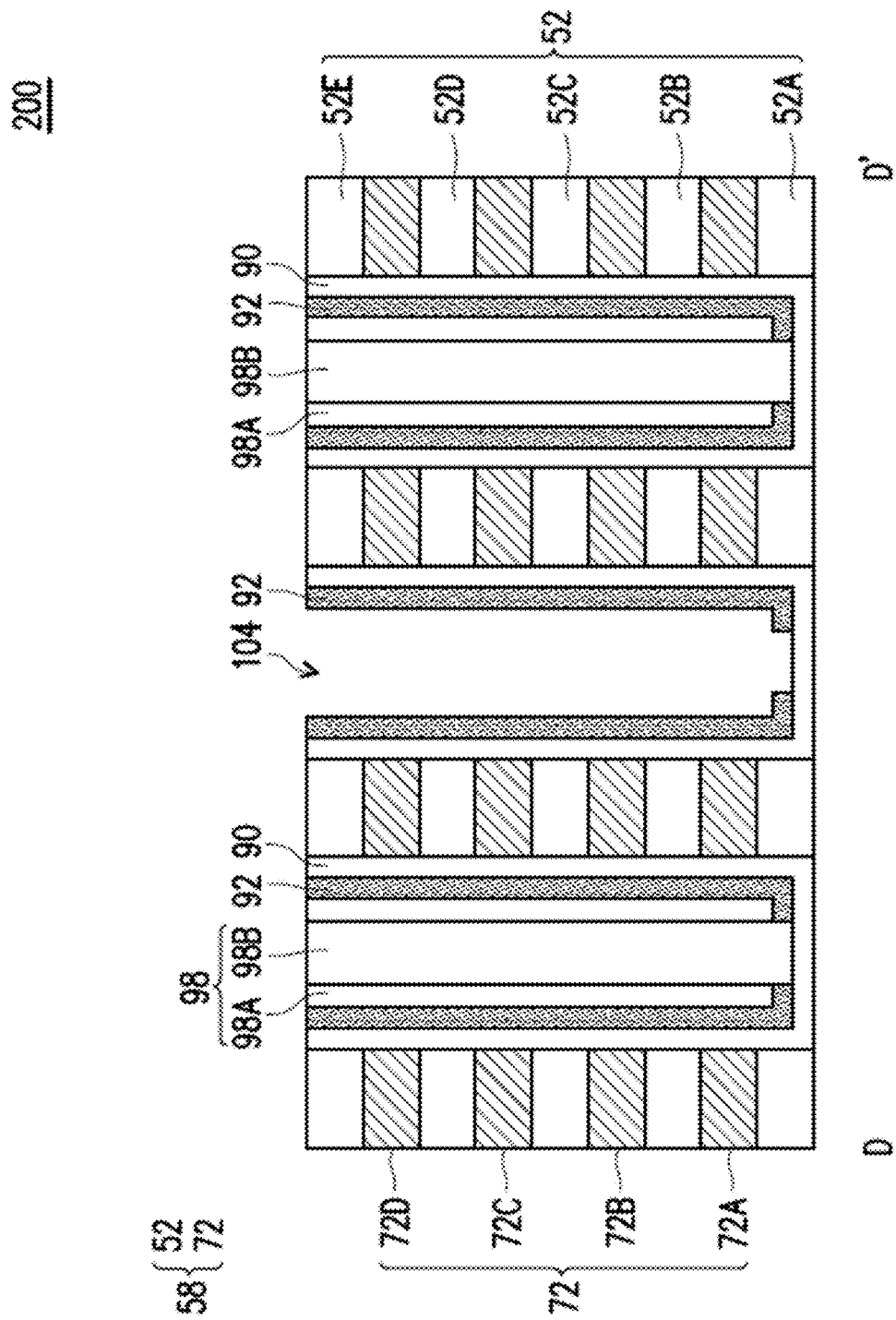
Figure 29A:
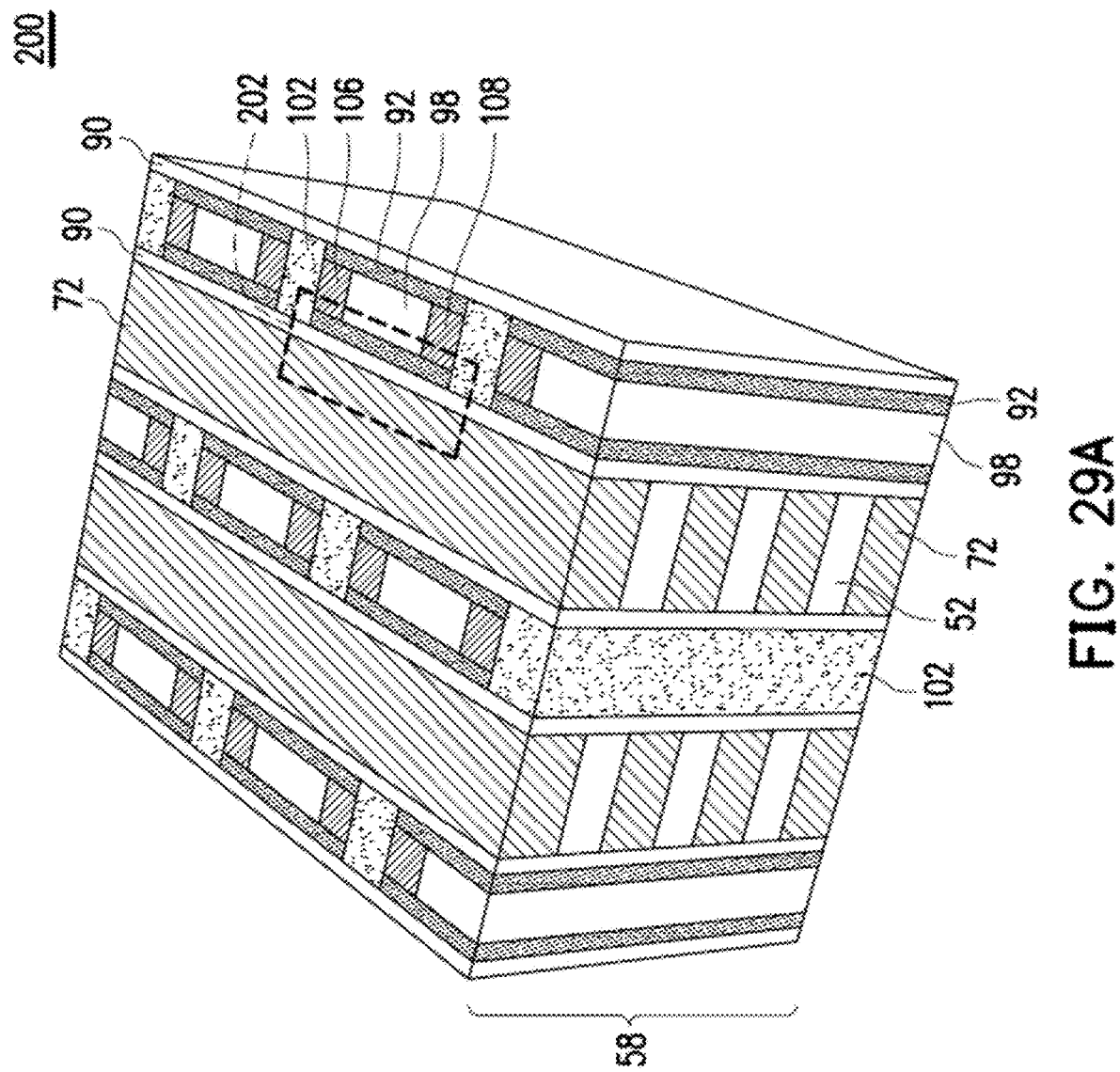
Figure 29B:
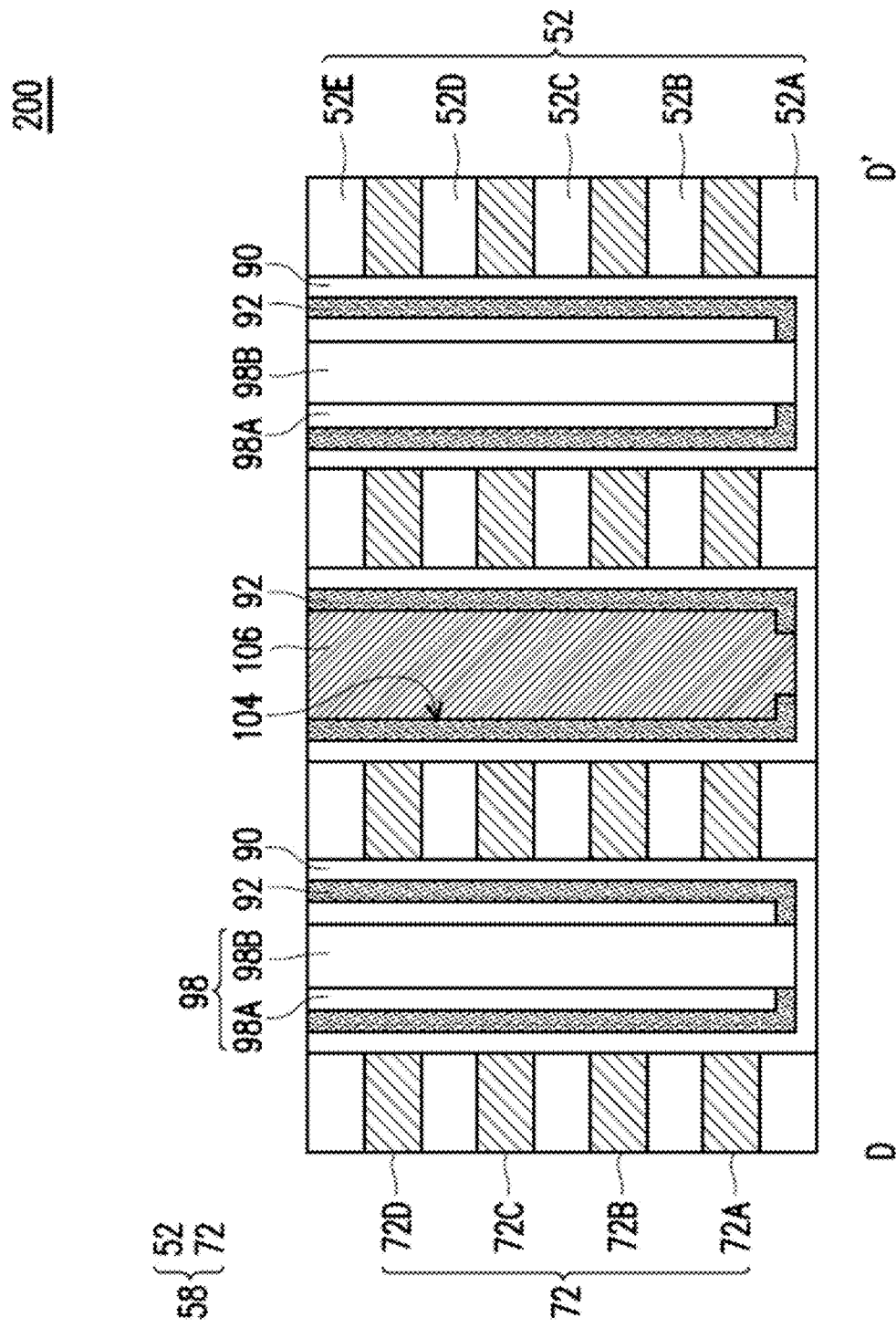

FIGS. 26A through 29B illustrate intermediate steps of manufacturing conductive pillars 106 and 108 (e.g., source/drain pillars) in the memory array 200. The conductive pillars 106 and 108 may extend along a direction perpendicular to the conductive lines 72 such that individual cells of the memory array 200 may be selected for read and write operations. FIGS. 26A, 27A, 28A and 29A are illustrated in a partial three-dimensional view. In FIGS. 26B and 27B, cross-sectional views are provided along line C-C' of FIG. 1A. In FIGS. 28B and 29B, cross-sectional views are provided along line D-D' of FIG. 1A.

Figure 26A:
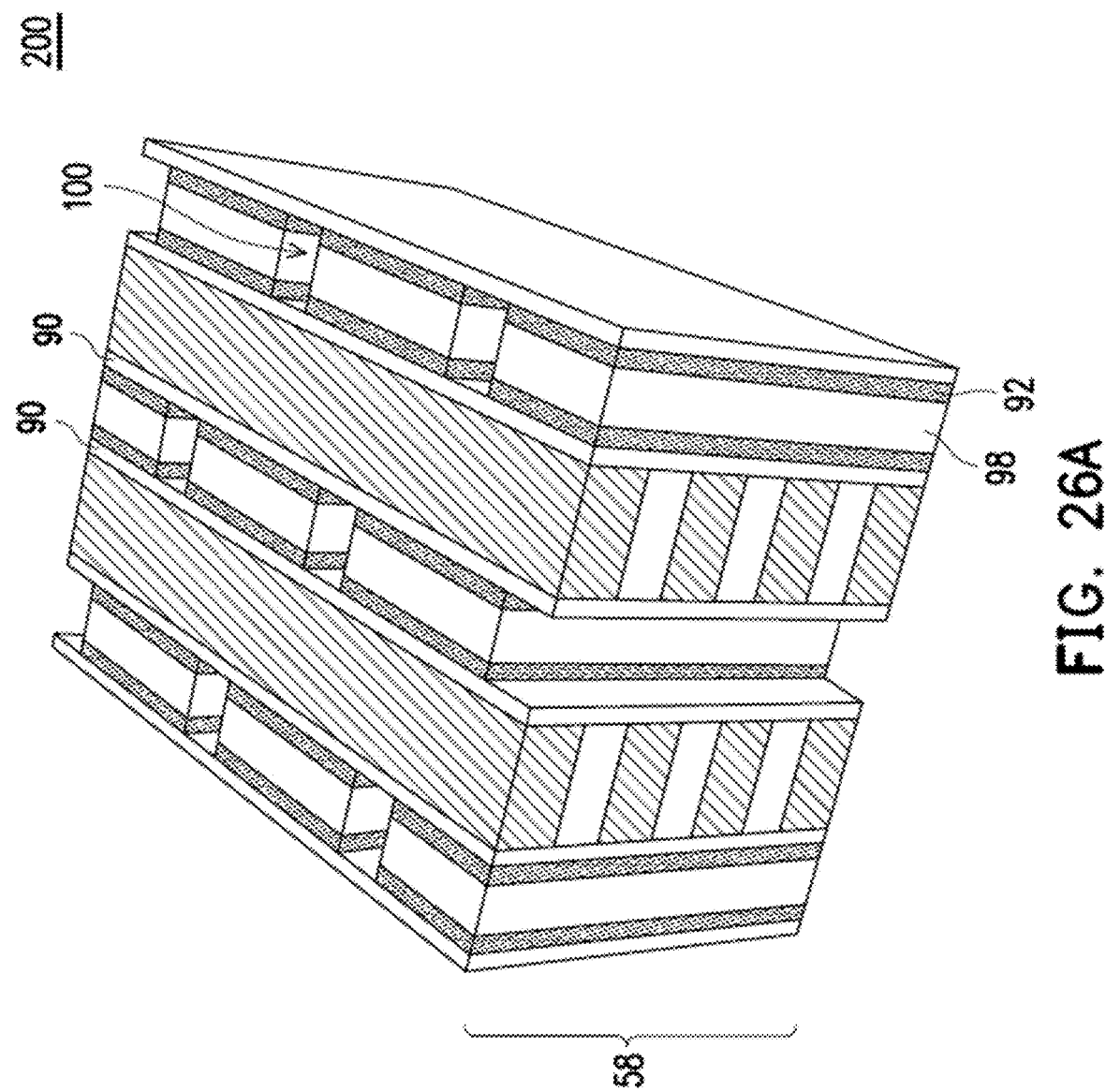
Figure 26B:
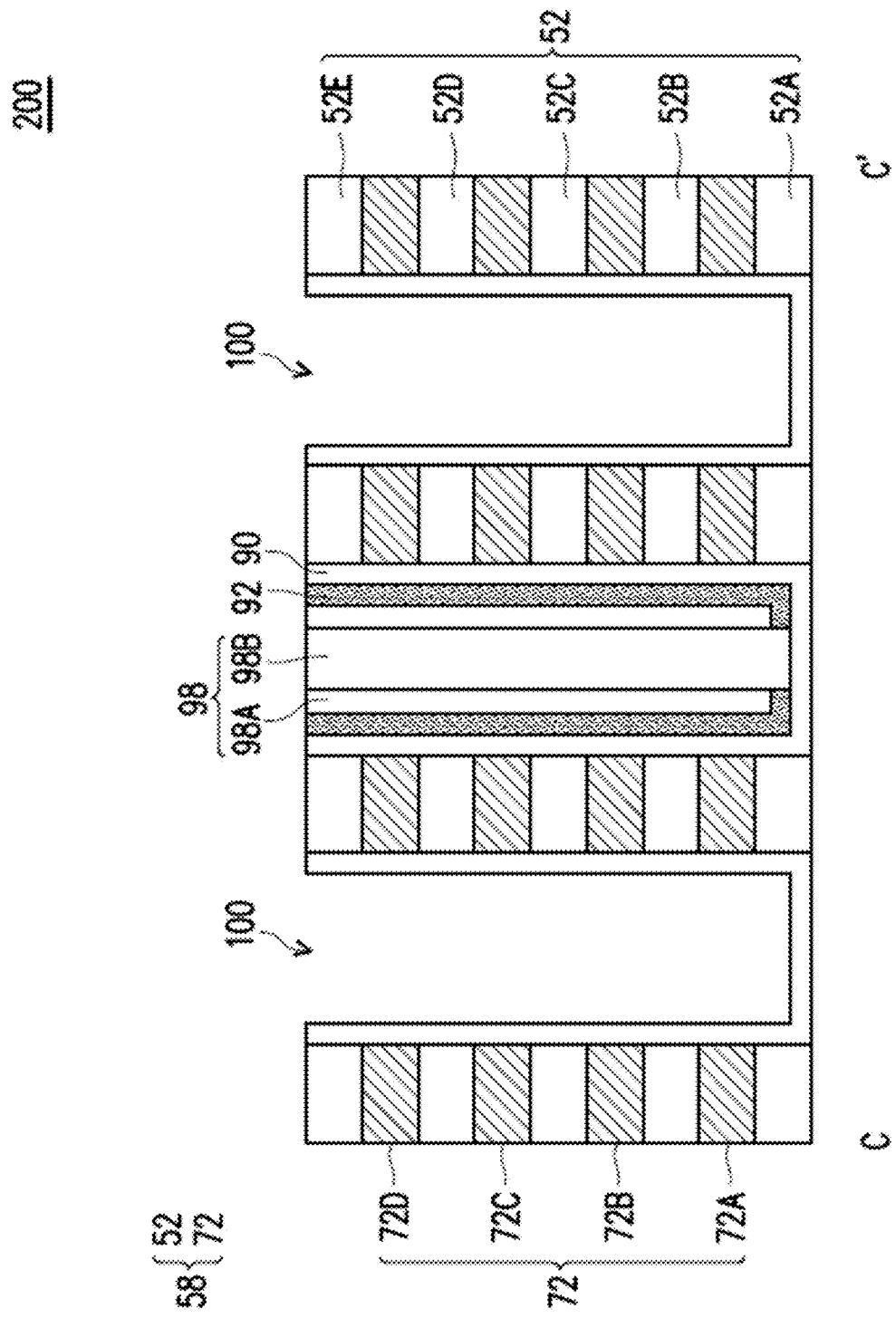

In FIGS. 26A and 26B, in some embodiments, trenches 100 are formed through the channel layer 92 and the dielectric material 98. In alternative embodiments, the trenches 100 are patterned through the channel layer 92, the dielectric material 98, and the ferroelectric layer 90' (not shown). The trenches 100 may be formed through a combination of photolithography and etching, for example. The trenches 100 may be disposed between opposing sidewalls of the III-V based ferroelectric layer 90, and the trenches 100 may physically separate adjacent stacks of memory cells in the memory array 200 (see FIG. 1A).

In FIGS. 27A and 27B, isolation pillars 102 are formed in the trenches 100. In some embodiments, an isolation layer is deposited over the multi-layer stack 58 filling in the trenches 100. The isolation layer may include, for example, silicon oxide, silicon nitride, silicon oxynitride, or the like, which may be deposited by CVD, PVD, ALD, PECVD, or the like. The isolation layer may extend along sidewalls and bottom surfaces of the trenches 100 over the channel layer 92. After deposition, a planarization process (e.g., a CMP, etch back, or the like) may be performed to remove excess portions of the isolation layer. In the resulting structure, top surfaces of the multi-layer stack 58 (e.g., dielectric layer 52E), the III-V based ferroelectric layer 90, the channel layer 92, and the isolation pillars 102 may be substantially level (e.g., within process variations). In some embodiments, materials of the dielectric material 98 and isolation pillars 102 may be selected so that they may be etched selectively relative each other. For example, in some embodiments, the dielectric material 98 include oxide and the isolation pillars 102 include nitride. In some embodiments, the dielectric material 98 include nitride and the isolation pillars 102 include oxide. Other materials are also possible.

In FIGS. 28A and 28B, trenches 104 are defined for the subsequently formed the conductive pillars 106 and 108. The trenches 104 are formed by patterning the dielectric material 98 with a combination of photolithography and etching, for example. In some embodiments, as shown in FIG. 28A, a photoresist 118 is formed over the multi-layer stack 58, the dielectric material 98, the isolation pillars 102, the channel layer 92, and the III-V based ferroelectric layer 90. In some embodiments, the photoresist 118 is patterned by an acceptable photolithography technique to define openings 120. Each of the openings 120 may expose the corresponding isolation pillar 102 and two separate regions of the dielectric material 98 beside the isolation pillar 102. In this way, each of the openings 120 may define a pattern of a conductive pillar 106 and an adjacent conductive pillar 108 that are separated by the isolation pillars 102.

Subsequently, portions of the dielectric material 98 exposed by the openings 120 may be removed by an acceptable etching process, such as by a dry etch (e.g., RIE, NBE, the like), a wet etch, the like, or a combination thereof. The etching may be anisotropic. The etching process may use an etchant that etches the dielectric material 98 without significantly etching the isolation pillars 102. As a result, even though the openings 120 expose the isolation pillars 102, the isolation pillars 102 may not be significantly removed. Patterns of the trenches 104 may correspond to the conductive pillars 106 and 108 (see FIGS. 29A and 29B). After the trenches 104 are patterned, the photoresist 118 may be removed by ashing, for example.

In FIGS. 29A and 29B, the trenches 104 are filled with a conductive material to form the conductive pillars 106 and 108. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 106 and 108. In the resulting structure, top surfaces of the multi-layer stack 58 (e.g., the dielectric layer 52E), the III-V based ferroelectric layer 90, the channel layer 92, the conductive pillars 106, and the conductive pillars 108 may be substantially level (e.g., within process variations). In some embodiments, the conductive pillars 106 correspond to and are electrically connected to the bit lines in the memory array, and the conductive pillars 108 correspond to correspond to and are electrically connected to the source lines in the memory array 200.

Thus, stacked memory cells 202 may be formed in the memory array 200, as shown in FIG. 29A. Each memory cell 202 includes a gate electrode (e.g., a portion of a corresponding conductive line 72), a gate dielectric (e.g., a portion of a corresponding ferroelectric layer 90), a channel region (e.g., a portion of a corresponding channel layer 92), and source/drain pillars (e.g., portions of corresponding conductive pillars 106 and 108). The isolation pillars 102 isolates adjacent memory cells 202 in a same column and at a same vertical level. The memory cells 202 may be disposed in an array of vertically stacked rows and columns.

Figure 30A:
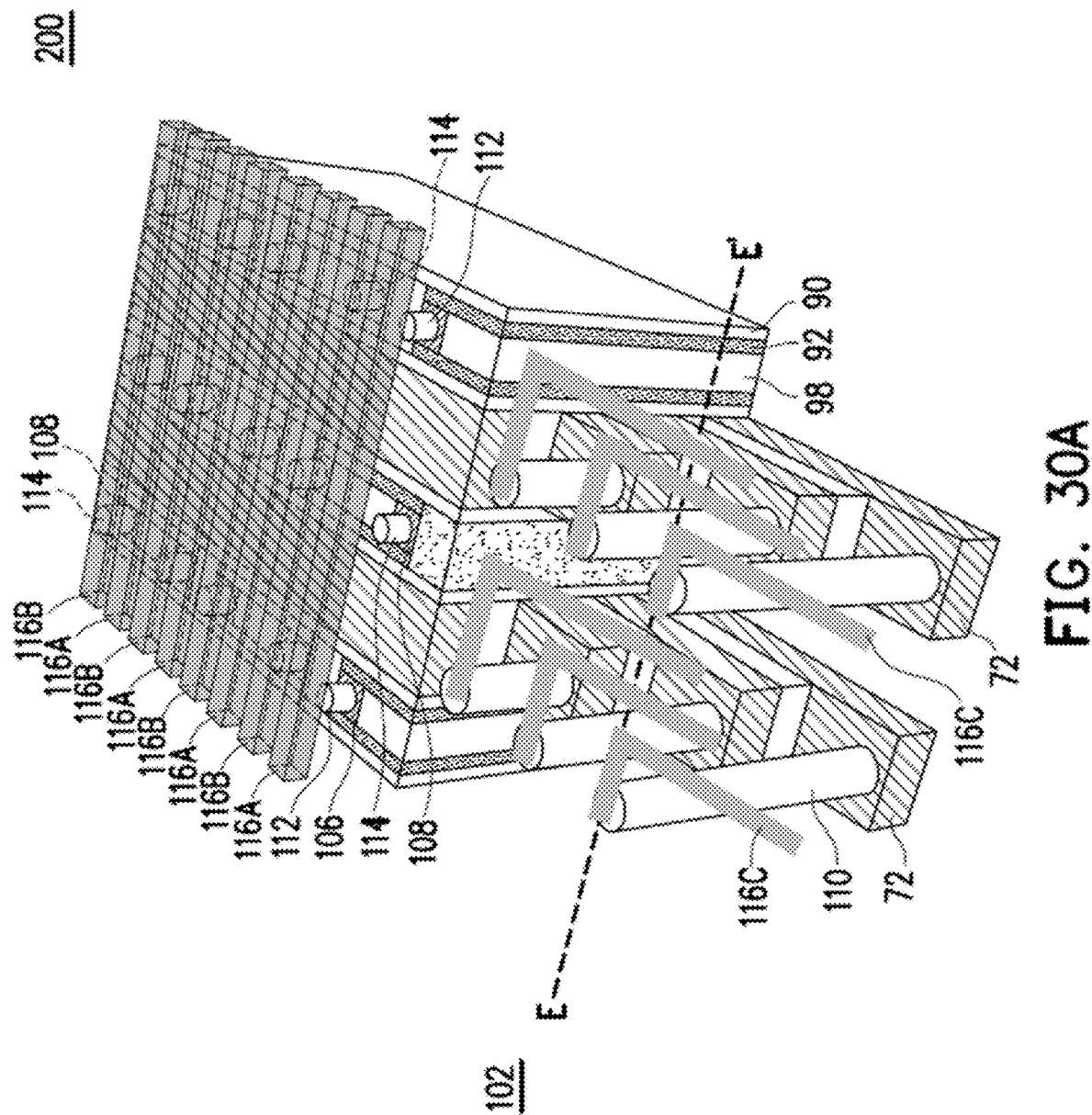
Figure 30B:
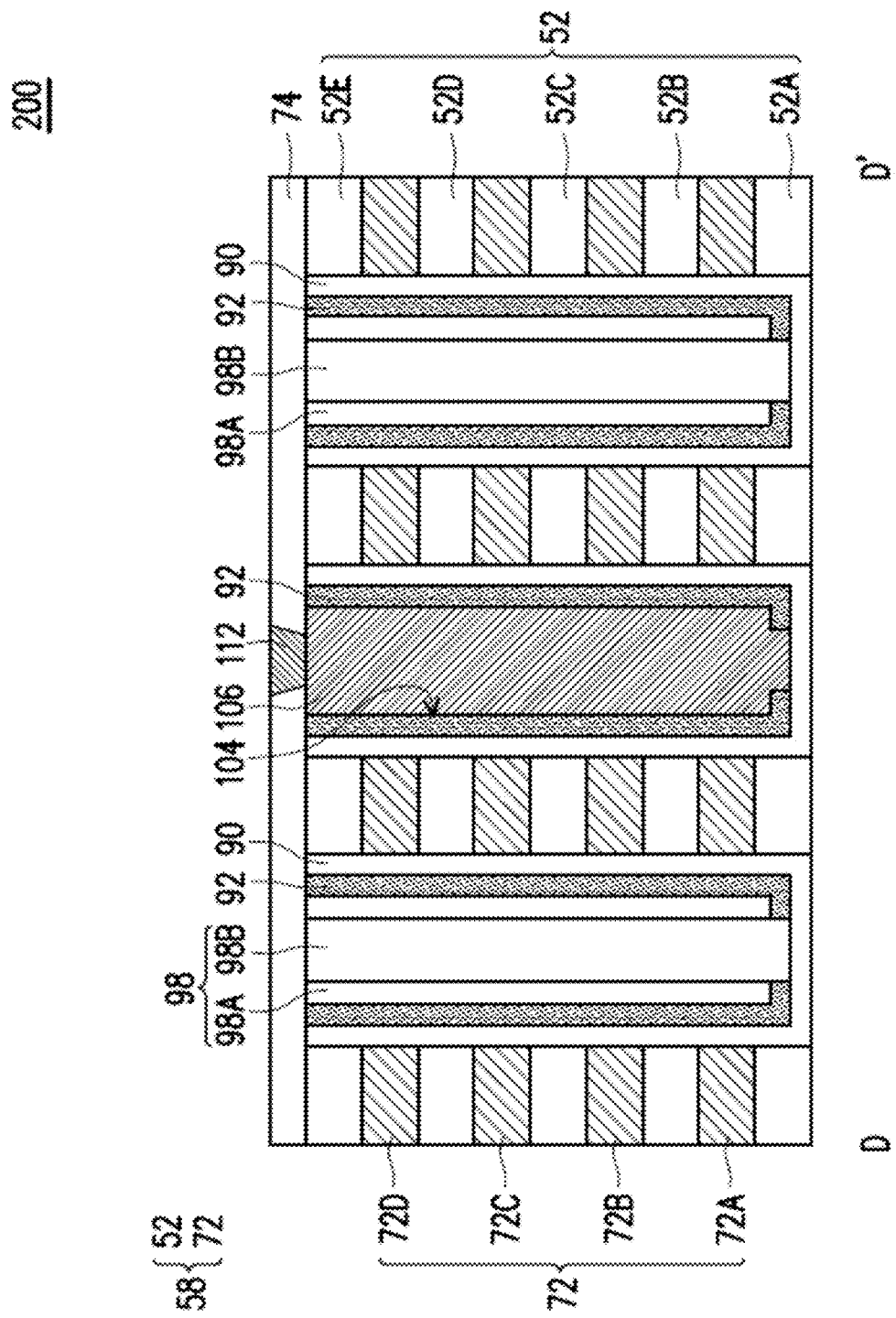
Figure 30C:
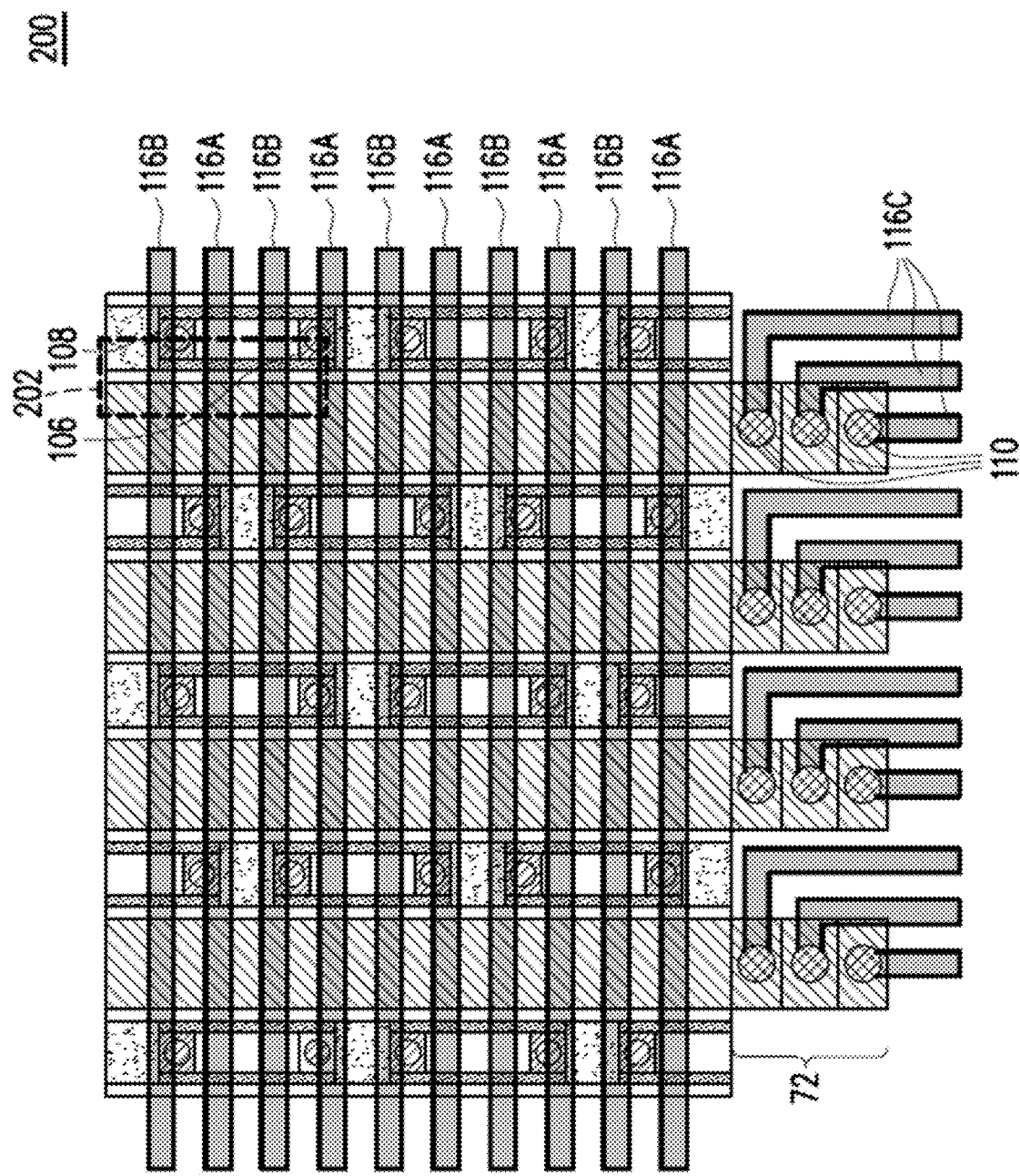
Figure 30D:
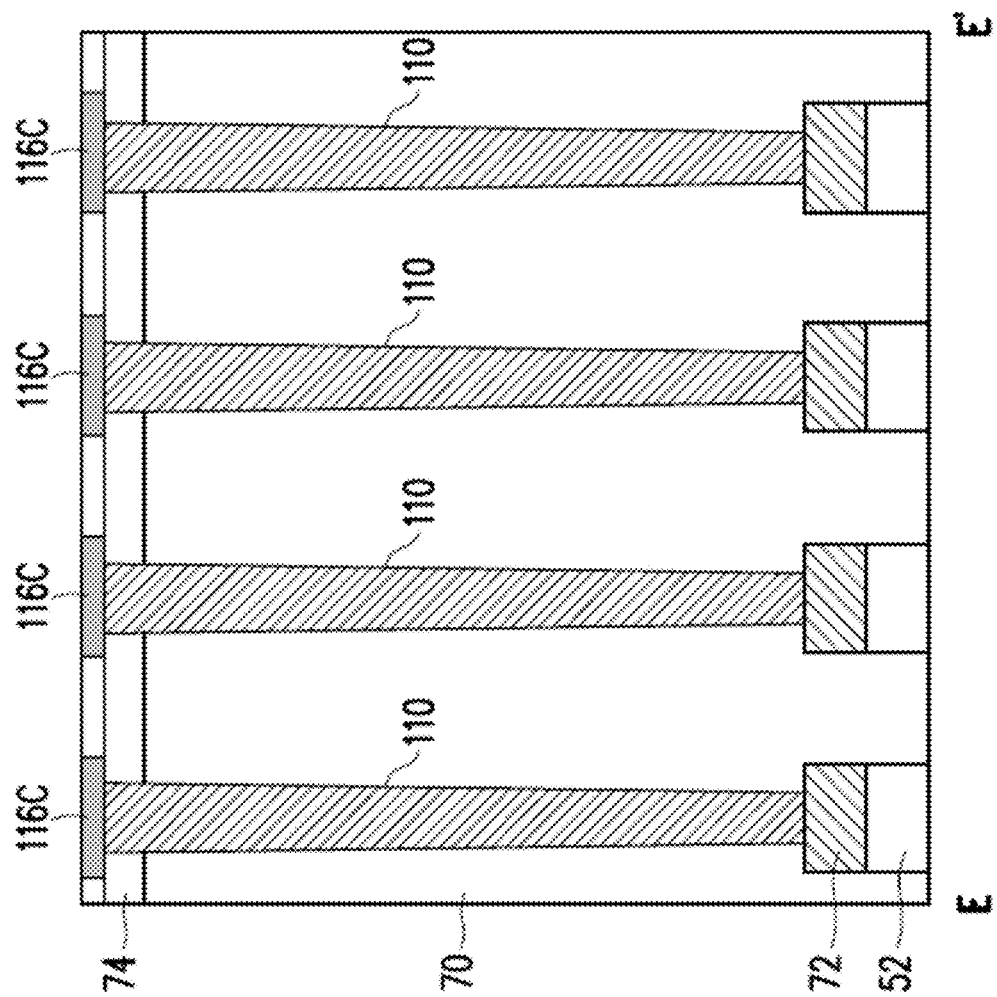
Figure 30E:
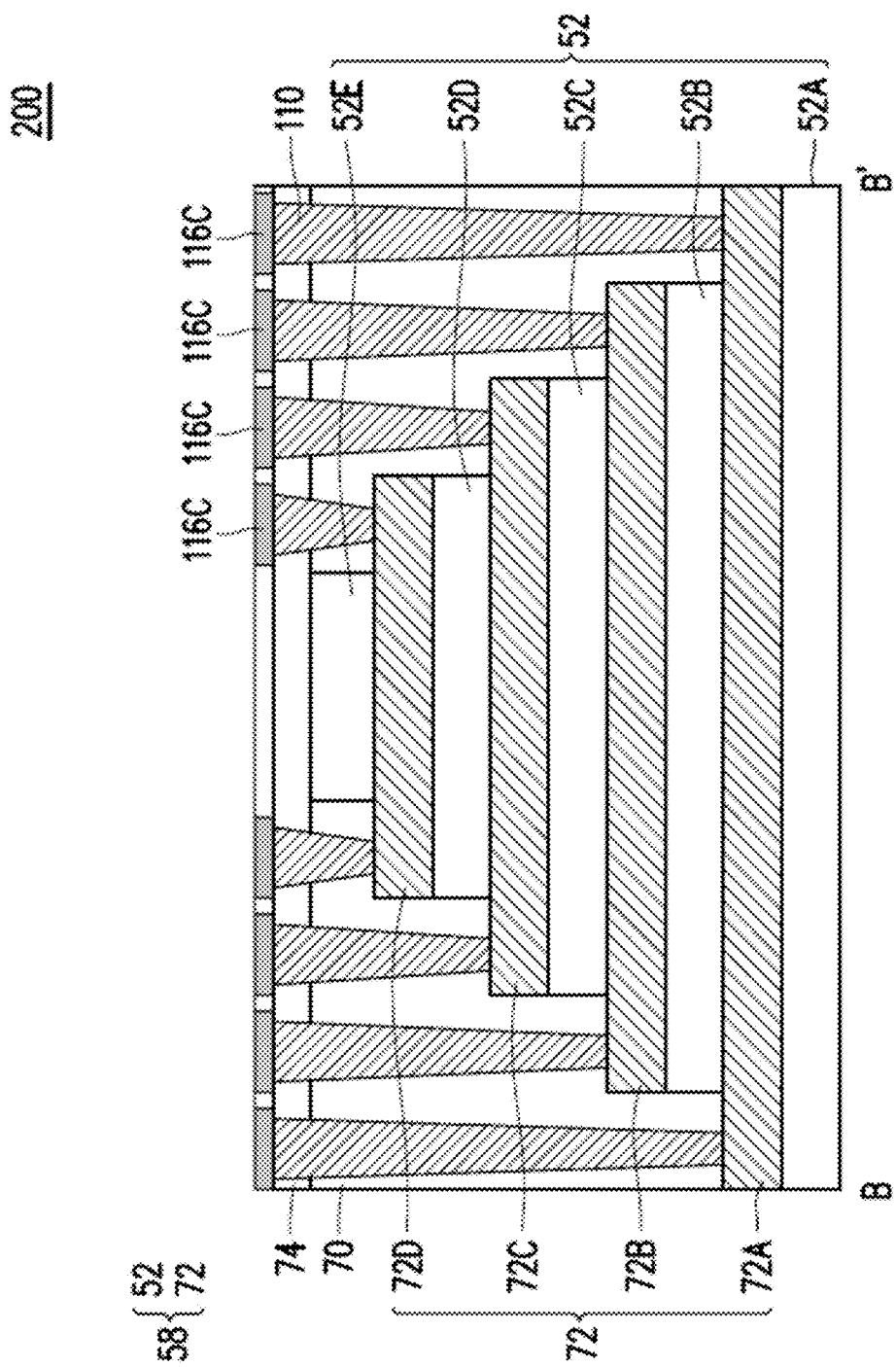

In FIGS. 30A, 30B, 30C, 30D and 30E, an IMD 74 is formed on top surfaces of the multi-layer stack 58 (e.g., the dielectric layer 52E), the III-V based ferroelectric layer 90, the channel layer 92, the conductive pillars 106, and the conductive pillars 108 and the IMD 70. Conductive contacts 110, 112, and 114 are made on the conductive lines 72, the conductive pillars 106, and the conductive pillars 108, respectively. FIG. 30A illustrates a perspective view of the memory array 200; FIG. 30B illustrates a cross-sectional view of the device along line D-D' of FIG. 1A; FIG. 30C illustrates a top-down view of the memory array 200; and FIG. 30D illustrates a cross-sectional view along the line E-E' of FIG. 30A; and FIG. 30E illustrates a cross-sectional view of the device along line B-B' of FIG. 1A.

The IMD 74 may be formed of a dielectric material, and may be deposited by any suitable method, such as CVD, PECVD, flowable CVD (FCVD), or the like. The dielectric materials may include phospho-silicate glass (PSG), borosilicate glass (BSG), boron-doped phospho-silicate glass (BPSG), undoped silicate glass (USG), or the like. In some embodiments, the IMD 74 may include an oxide (e.g., silicon oxide or the like), a nitride (e.g., silicon nitride or the like), a combination thereof or the like. Other dielectric materials formed by any acceptable process may be used. Thereafter, a removal process is applied to the IMD 74 to remove excess dielectric material over the multi-layer stack 58. In some embodiments, the removal process may be a planarization process, such as a chemical mechanical polish (CMP), an etch-back process, combinations thereof, or the like.

In some embodiments, the staircase shape of the conductive lines 72 may provide a surface on each of the conductive lines 72 for the conductive contacts 110 to land on. In some embodiments, forming the conductive contacts 110 may include patterning openings in the IMD 74 and IMD 70 to expose portions of the conductive lines 72 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove excess material from the surface of the IMD 74. The remaining liner and conductive material form the conductive contacts 110 in the openings.

As also illustrated by the perspective view of FIG. 30A, conductive contacts 112 and 114 may also be made on the conductive pillars 106 and the conductive pillars 108, respectively. The conductive contacts 112, 114 and 110 may be electrically connected to conductive lines 116A, 116B, and 116C, respectively, which connect the memory array to an underlying/overlying circuitry (e.g., control circuitry) and/or signal, power, and ground lines in the semiconductor die. For example, as shown in FIG. 30D, the conductive contacts 110 may extend through the IMD 74 and IMD 70 to electrically connect conductive lines 116C to the conductive lines 72 and the underlying active devices one the substrate. Other conductive contacts or vias may be formed through the IMD 74 to electrically connect the conductive lines 116A and 116B to the underlying active devices one the substrate. Other conductive contacts or vias may extend through the memory array 200, such as through the isolation pillars 102 and the III-V based ferroelectric layer 90, and such conductive contacts or vias may be electrically coupled to underlying conductive features, such as the conductive features 322 of the interconnect structure 320. In alternate embodiments, routing and/or power lines to and from the memory array may be provided by an interconnect structure formed over the memory array 200 in addition to or in lieu of the interconnect structure 320. Accordingly, the memory array 200 may be completed.

The above embodiments in which the III-V based ferroelectric layer 90 is a single layer structure are provided for illustration purposes, and are construed as limiting the present disclosure. The III-V based ferroelectric layer 90 may have a multi-layer structure as needed.

Figure 31:
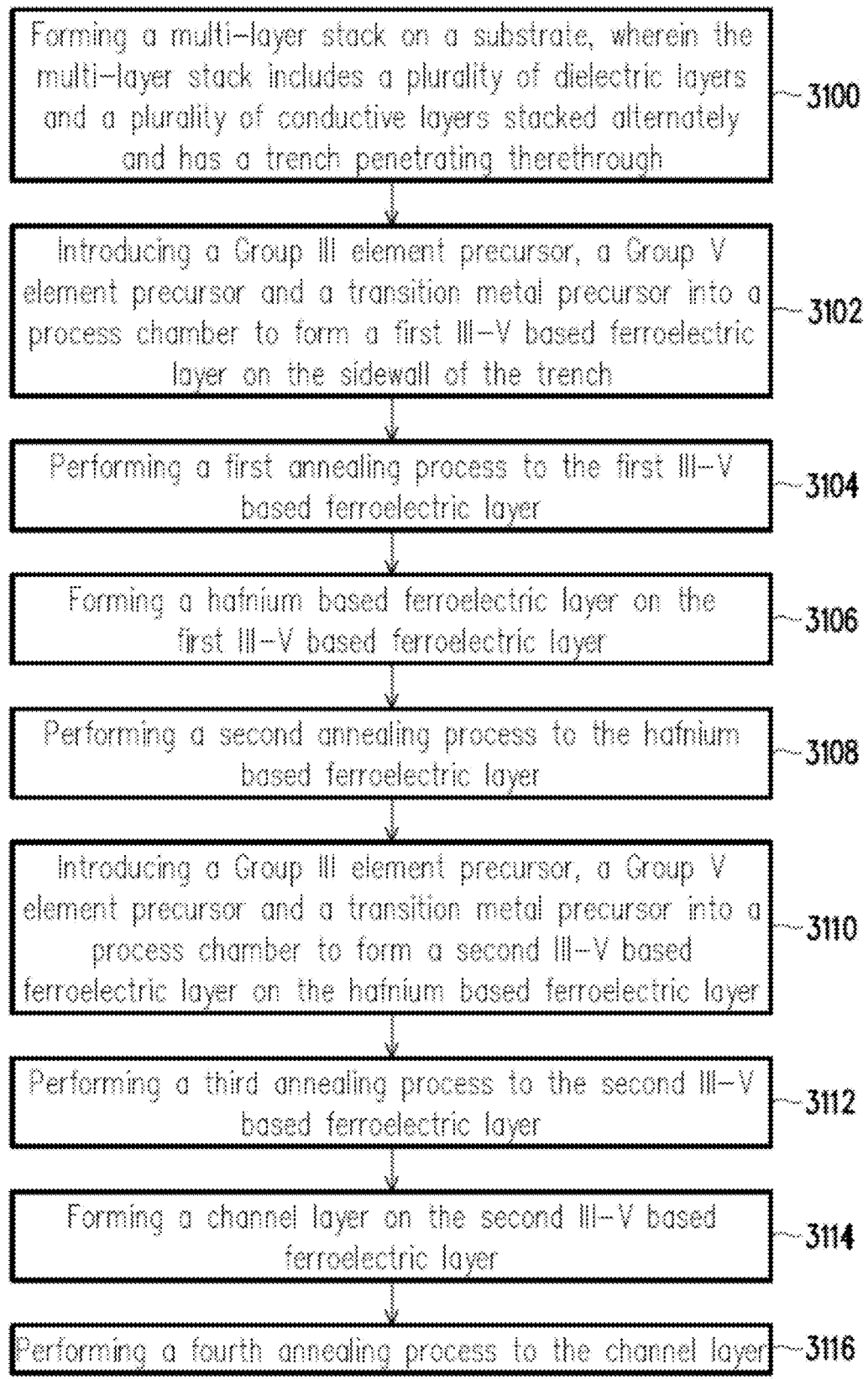
FIG. 31 illustrates a method of forming a ferroelectric layer and a channel layer of a ferroelectric memory device in accordance with other embodiments.
Figure 32A:
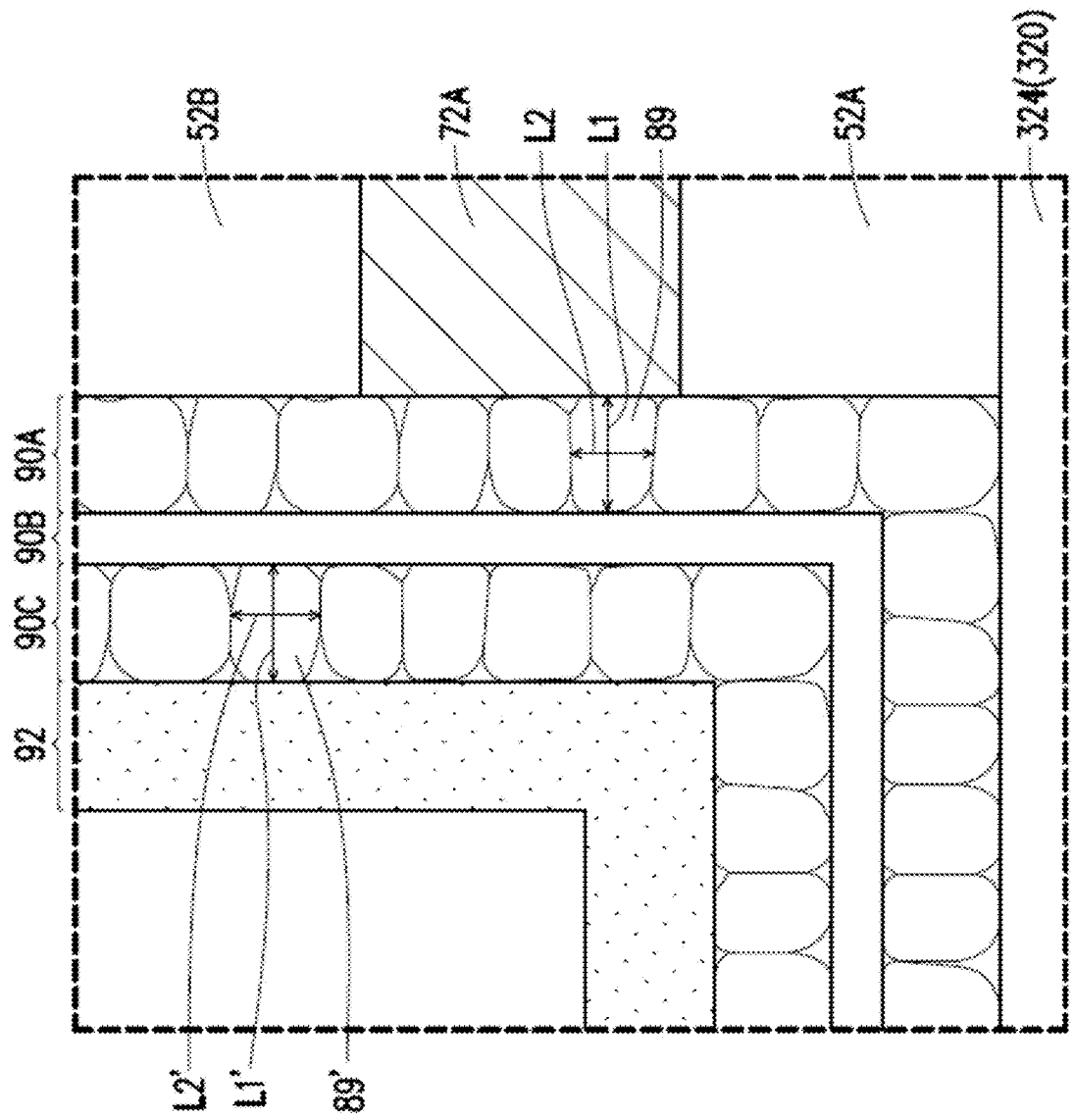
FIGS. 32A, 32B and 32C illustrate local enlarged views of a ferroelectric memory device in accordance with some embodiments.
Figure 32B:
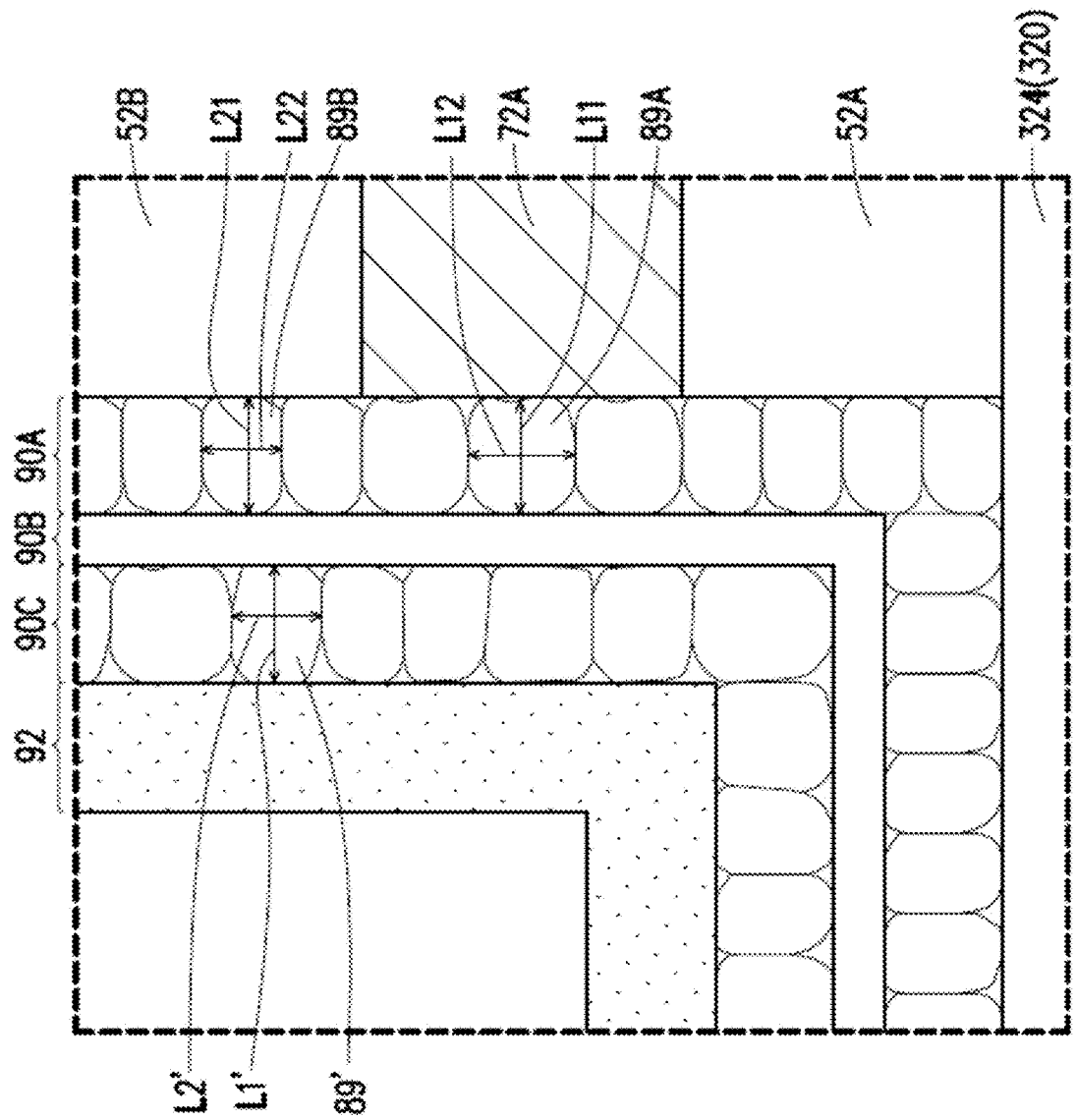

FIG. 31 illustrates a method of forming a ferroelectric layer and a channel layer of a ferroelectric memory device in accordance with other embodiments. FIGS. 32A, 32B and 33C illustrate local enlarged views of a ferroelectric memory device in accordance with some embodiments. FIG. 33A to FIG. 33C are similar to FIG. 20C to FIG. 20E, and the difference between them lies in that, the III-V based ferroelectric layer 90 in each of FIG. 33A to FIG. 33C has a multi-layer structure while the III-V based ferroelectric layer 90 in each of FIG. 20C to FIG. 20E is a single-layer structure. The difference between them is illustrated below, and the similarity is not iterated herein.

At act 3100, a multi-layer stack on a substrate, wherein the multi-layer stack includes a plurality of dielectric layers and a plurality of conductive layers stacked alternately and has a trench penetrating therethrough. FIG. 14 to FIG. 17B illustrate varying views corresponding to some embodiments of act 3100.

At act 3102, a Group III element precursor, a Group V element precursor and a transition metal precursor are introduced into a process chamber to form a first III-V based ferroelectric layer on the sidewall of the trench. FIG. 18A to FIG. 18B illustrate varying views corresponding to some embodiments of act 3102.

At act 3104, a first annealing process is performed to the first III-V based ferroelectric layer. In some embodiments, the temperature range of the first annealing process ranges from about 250° C. to about 400° C. in an $O_2$, $N_2$ or $NH_3$ ambient, so as to achieve a desired crystalline lattice structure for the first III-V based ferroelectric layer. FIG. 19A to FIG. 19E illustrate varying views corresponding to some embodiments of act 3104.

Figure 32C:
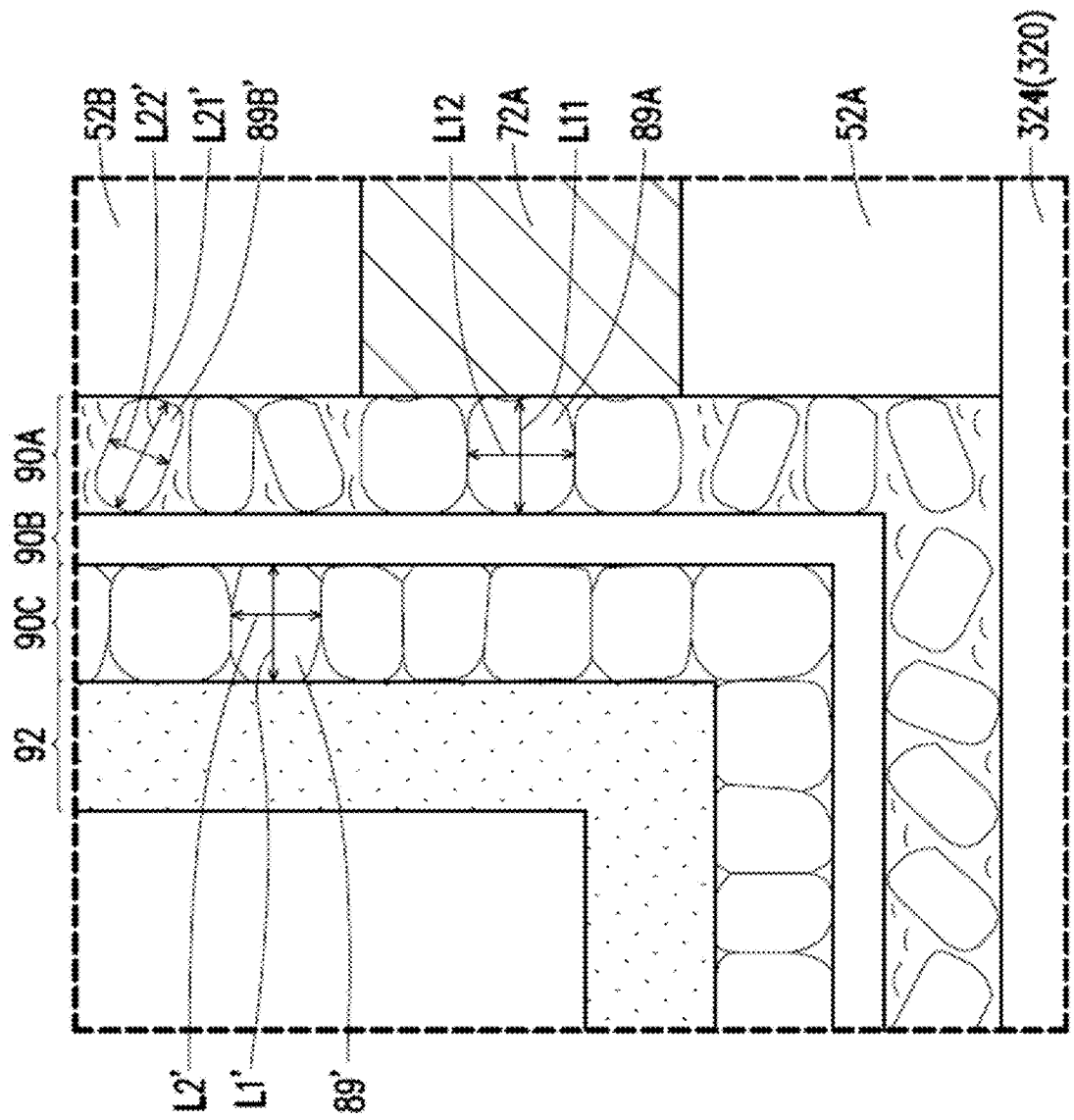

FIG. 32A to FIG. 32C illustrate varying views corresponding to some embodiments of act 3102 and act 3104, in which the III-V based ferroelectric layer 90A is formed in a manner similar to that described in FIG. 18A to FIG. 19E.

At act 3106, a hafnium based ferroelectric layer is formed on the first III-V based ferroelectric layer. FIG. 32A to FIG. 32C illustrate varying views corresponding to some embodiments of act 3106. In some embodiments, the hafnium based ferroelectric layer 90B may be deposited by CVD, PVD, ALD, PECVD, or the like. The hafnium based ferroelectric layer 90B may extend along sidewall and bottom surface of the first III-V based ferroelectric layer 90A. In some embodiments, the hafnium based ferroelectric layer 90B includes hafnium oxide, hafnium zirconium oxide, silicon-doped hafnium oxide, or the like. In some embodiments, the hafnium based ferroelectric layer 90B may include hafnium erbium oxide ($Hf_{1-x}Er_xO$), hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium zirconium oxide ($Hf_{1-x}Zr_xO$, HZO), hafnium titanium oxide ($Hf_{1-x}Ti_xO$), hafnium tantalum oxide ($Hf_{1-x}Ta_xO$), or the like. Other materials may be used to replace the hafnium based ferroelectric layer 90. Other materials include barium titanium oxide ($BaTiO_3$), lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$) or the like.

At act 3108, a second annealing process is performed to the hafnium based ferroelectric layer. In some embodiments, the temperature range of the second annealing process ranges from about 250° C. to about 400° C.), so as to achieve a desired crystalline lattice structure for the hafnium based ferroelectric layer 90B.

At act 3110, a Group III element precursor, a Group V element precursor and a transition metal precursor are introduced into a process chamber to form a second III-V based ferroelectric layer on the hafnium based ferroelectric layer. The second III-V based ferroelectric layer may be formed with a method similar to that of the first III-V based ferroelectric layer.

At act 3112, a third annealing process is performed to the second III-V based ferroelectric layer. In some embodiments, the temperature range of the third annealing process ranges from about 250° C. to about 400° C. in an $O_2$, $N_2$ or $NH_3$ ambient, so as to achieve a desired crystalline lattice structure for the III-V based ferroelectric layer.

FIG. 32A to FIG. 32C illustrate varying views corresponding to some embodiments of act 3110 and act 3112, in which the III-V based ferroelectric layer 90C is formed in a manner similar to that described in FIG. 18 to FIG. 19E.

In some embodiments, as shown in FIG. 32A to FIG. 32C, the grain size of the columnar-like grains 89' in the III-V based ferroelectric layer 90C may be different from the grain size of the columnar-like grains 89/89A/89B/89B' because the contacting materials are different when the grains are grown. In some embodiments, the columnar-like grains 89' in the III-V based ferroelectric layer 90C contacting the hafnium based ferroelectric layer 90B have a long-axis length L1' and a short-axis length L2' across (e.g., perpendicular to) the long-axis length L1'. In some embodiments, the long-axis length L1' ranges from about 10 to 100 nm, and the short-axis length L2' ranges from about 5 to 20 nm. In some embodiments, the long-axis length L1' is between the long-axis length L11 and the long-axis length L21/L21'.

At act 3114, a channel layer is formed on the second III-V based ferroelectric layer. FIG. 20A to FIG. 20E illustrate varying views corresponding to some embodiments of act 3114.

At act 3116, a fourth annealing process is performed to the channel layer. In some embodiments, the temperature range of the fourth annealing process ranges from about 350° C. to about 400° C. in an oxygen containing ambient, so as to activate the charge carriers of the channel layer 92. FIG. 20A to FIG. 20E illustrate varying views corresponding to some embodiments of act 3116.

Although the embodiments of FIGS. 1 through 32C illustrate a particular pattern for the conductive pillars 106 and 108, other configurations are also possible. For example, in these embodiments, the conductive pillars 106 and 108 have a staggered pattern. However, in other embodiments, the conductive pillars 106 and 108 in a same row of the array are all aligned with each other, as shown in the ferroelectric memory 200A of FIG. 33.

The structures of the ferroelectric memory devices of the disclosure are described below with reference to FIG. 1A to FIG. 33.

In some embodiments, a ferroelectric memory device 200/200A includes a multi-layer stack 58, a channel layer 92 and a III-V based ferroelectric layer 90. The multi-layer stack 58 is disposed on a substrate 50 and includes a plurality of conductive layers (e.g., conductive lines 72) and a plurality of dielectric layers 52 stacked alternately. The channel layer 92 penetrates through the plurality of conductive layers (e.g., conductive lines 72) and the plurality of dielectric layers 52 of the multi-layer stack. The III-V based ferroelectric layer 90 is disposed between the channel layer 92 and each of the plurality of conductive layers (e.g., conductive lines 72) and the plurality of dielectric layers 52 of the multi-layer stack 58. The III-V based ferroelectric layer 90 includes at least one element selected from Group III elements, at least one element selected from Group V elements, and at least one element selected from transition metal elements.

In some embodiments, the at least one element selected from transition metal elements accounts for about 10-40 at % of the III-V based ferroelectric layer. In some embodiments, the III-V based ferroelectric layer 90 includes AlScN, AlYN, GaScN, InScN or a combination thereof. In some embodiments, the III-V based ferroelectric layer 90 is a hafnium-free ferroelectric layer.

In some embodiments, the III-V based ferroelectric layer 90 is a single-layer structure, as shown in FIGS. 20C to 20E. In other embodiments, the III-V based ferroelectric layer 90 is a multi-layer structure including a III-V based material (e.g., III-V based ferroelectric layer 90A) contacting the conductive layers (e.g., conductive lines 72) and another non III-V layer (e.g., hafnium based ferroelectric layer 90B) separated from the plurality of conductive layers. For example, the III-V based ferroelectric layer 90 includes two III-V based materials (e.g., III-V based ferroelectric layers 90A and 90C) and one non III-V layer (e.g., hafnium based ferroelectric layer 90B) between the two III-V based materials, as shown in FIGS. 32A to 32C. In some embodiments, the non III-V layer or hafnium based ferroelectric layer 90B includes HfZrO, HfAlO, HfLaO, HfCeO, HfO, HfGdO, HfSiO or a combination thereof. In some embodiments, the III-V based ferroelectric layer 90 may have a super-lattice structure including multiple III-V based ferroelectric layers and multiple hafnium based ferroelectric layers stacked alternately, and the outermost layers of the super-lattice structure are III-V based ferroelectric layers. In some embodiments, the ferroelectric structure including both the III-V based ferroelectric layer and the hafnium based ferroelectric layer is beneficial to obtain the reliable read-write performance and minimize the leakage issue.

In some embodiments, a ferroelectric memory device 200/200A includes a multi-layer stack 58, a plurality of dielectric pillars (e.g., dielectric materials 98), a channel layer 92 and a ferroelectric layer 90. The multi-layer stack 58 is disposed on a substrate 50 and includes a plurality of gate electrode layers (e.g., conductive lines 72) and a plurality of dielectric layers 72 stacked alternately. The plurality of dielectric pillars (e.g., dielectric materials 98) are disposed on the substrate 50 and penetrate through the multi-layer stack 58. The channel layer 92 is disposed between the multi-layer stack 58 and each of the dielectric pillars (e.g., dielectric materials 98). The ferroelectric layer 90 is disposed between the channel layer 92 and the multi-layer stack 58. In some embodiments, the ferroelectric layer 90 includes at least one element selected from Group III elements, at least one element selected from Group V elements, and at least one element selected from transition metal elements. In some embodiments, the ferroelectric layer 90 includes AlScN, AlYN, GaScN, InScN or a combination thereof.

In some embodiments, portions of the ferroelectric layer 90 contacting the plurality of gate electrode layers (e.g., conductive lines 72) have first columnar-like grains (e.g., columnar-like grains 89/89A) with a long-axis direction perpendicular to a contacting surface of each of the plurality of gate electrode layers (e.g., conductive lines 72), as shown in FIGS. 20C-20E and 32A-32C.

In some embodiments, portions of the ferroelectric layer 90 contacting the plurality of dielectric layers 52 have second columnar-like grains (e.g., columnar-like grains 89/89B) with a second long-axis direction perpendicular to a contacting surface of each of the plurality of dielectric layers 52, as shown in FIGS. 20C-20D and 32A-32B.

In some embodiments, portions of the ferroelectric layer 90 contacting the plurality of dielectric layers 52 have second columnar-like grains (e.g., columnar-like grains 89B') with a second long-axis direction non-perpendicular to a contacting surface of each of the plurality of dielectric layers 52, as shown in FIGS. 20E and 32C.

In some embodiments, the portions of the ferroelectric layer 90 contacting the plurality of gate electrode layers have a first grain dimension (e.g., short-axis length L11), portions of the ferroelectric layer contacting the plurality of dielectric layers have a second grain dimension (e.g., short-axis length L21/L21') different from the first grain dimension, as shown in FIGS. 20D-20E and 32B-32C. In some embodiments, the second grain dimension is less than the first grain dimension. For example, the first grain dimension is 5-20 nm, and the second grain dimension is less than 1-5 nm. However, the disclosure is not limited thereto. The second grain dimension may be greater than the first grain dimension when the chamber parameters are appropriately adjusted.

In some embodiments, portions of the ferroelectric layer 90 contacting the channel layer 92 have third columnar-like grains (e.g., columnar-like grains 89/89'/89A/89B) with a third long-axis direction perpendicular to a contacting surface of the channel layer 92, as shown in FIGS. 20D-20E and 32B-32C.

In some embodiments, the ferroelectric memory device 200/200A further includes a plurality of conductive pillars 106 and 108 disposed on the substrate 50 and penetrating through the multi-layer stack 58. In some embodiments, each of the plurality of dielectric pillars (e.g., dielectric materials 98) has two conductive pillars 106 and 108 disposed at two ends thereof.

Figure 33:
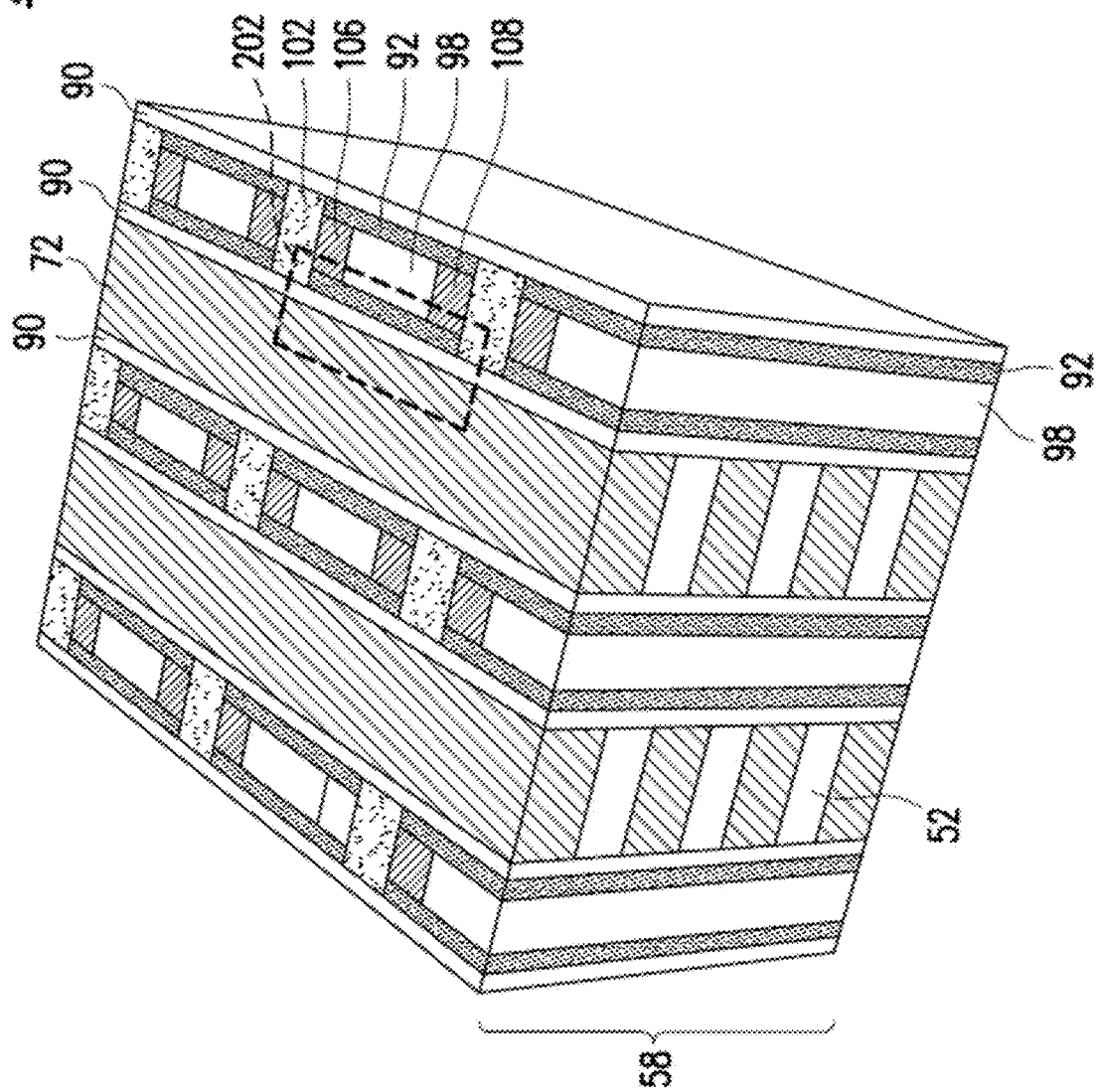
FIG. 33 illustrates a simplified perspective view of a ferroelectric memory device in accordance with some embodiments.

In some embodiments, the dielectric pillars (e.g., dielectric materials 98) are in a staggered arrangement. Specifically, the dielectric pillars of adjacent columns are arranged in a staggered manner, as shown in FIG. 29A. However, the disclosure is not limited thereto. In some embodiments, the dielectric pillars (e.g., dielectric materials 98) of adjacent columns are arranged in a regular array and aligned to each other, as shown in FIG. 33.

In some embodiments of the disclosure, the III-V based ferroelectric layer is disposed between the channel layer (e.g., oxide semiconductor layer) and each of the conductive layers (e.g., metal layer). Such III-V based ferroelectric material can exhibit square-like P-E loop and therefore minimize the write-disturb issue. Besides, the columnar-like polycrystalline grains in the III-V based ferroelectric layer have a long-axis direction perpendicular to the conductive layers, so as to enhance endurance and retention and therefore improve the device performance.

In the above embodiments, the ferroelectric memory device is formed by a "staircase first process" in which the staircase structure is formed before the memory cells are formed. However, the disclosure is not limited thereto. In other embodiments, the ferroelectric memory device may be formed by a "staircase last process" in which the staircase structure is formed after the memory cells are formed.

In the above embodiments, the gate electrodes (e.g., word lines) are formed by depositing sacrificial dielectric layers followed by replacing sacrificial dielectric layers with conductive layers. However, the disclosure is not limited thereto. In other embodiments, the gate electrodes (e.g., word lines) may be formed in the first stage without the replacement step as needed.

Many variations of the above examples are contemplated by the present disclosure. It is understood that different embodiments may have different advantages, and that no particular advantage is necessarily required of all embodiments.

In accordance with some embodiments of the present disclosure, a ferroelectric memory device includes a multi-layer stack, a channel layer and a III-V based ferroelectric layer. The multi-layer stack is disposed on a substrate and includes a plurality of conductive layers and a plurality of dielectric layers stacked alternately. The channel layer penetrates through the plurality of conductive layers and the plurality of dielectric layers of the multi-layer stack. The III-V based ferroelectric layer is disposed between the channel layer and the multi-layer stack, and includes at least one element selected from Group III elements, at least one element selected from Group V elements, and at least one element selected from transition metal elements.

In accordance with alternative embodiments of the present disclosure, a ferroelectric memory device includes a multi-layer stack, a plurality of dielectric pillars, a channel layer and a ferroelectric layer. The multi-layer stack is disposed on a substrate and includes a plurality of gate electrode layers and a plurality of dielectric layers stacked alternately. The plurality of dielectric pillars are disposed on the substrate and penetrate through the multi-layer stack. The channel layer is disposed between the multi-layer stack and each of the dielectric pillars. The ferroelectric layer is disposed between the channel layer and the multi-layer stack, and portions of the ferroelectric layer contacting the plurality of gate electrode layers have first columnar-like grains with a long-axis direction perpendicular to a contacting surface of each of the plurality of gate electrode layers.

In accordance with yet alternative embodiments of the present disclosure, a method of forming a ferroelectric memory device includes following operations. A multi-layer stack is formed on a substrate, and the multi-layer stack includes a plurality of dielectric layers and a plurality of conductive layers stacked alternately and has a trench penetrating therethrough. A Group III element precursor, a Group V element precursor and a transition metal precursor are introduced into a process chamber to form a III-V based ferroelectric layer on the sidewall of the trench. A channel layer is formed on the III-V based ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric memory device, comprising:
   a multi-layer stack disposed on a substrate and comprising a plurality of conductive layers and a plurality of dielectric layers stacked alternately;
   a channel layer penetrating through the plurality of conductive layers and the plurality of dielectric layers of the multi-layer stack; and
   a III-V based ferroelectric layer disposed between the channel layer and the multi-layer stack, and comprising at least one element selected from Group III elements, at least one element selected from Group V elements, and at least one element selected from transition metal elements.

2. The ferroelectric memory device of claim 1, wherein the at least one element selected from transition metal elements accounts for 10-40 at % (atomic percent) of the III-V based ferroelectric layer.

3. The ferroelectric memory device of claim 1, wherein the III-V based ferroelectric layer comprises AlScN, AlYN, GaScN, or InScN.

4. The ferroelectric memory device of claim 1, wherein the III-V based ferroelectric layer further comprises a hafnium based dielectric material.

5. The ferroelectric memory device of claim 4, wherein the III-V based ferroelectric layer comprises a plurality of crystalline grains that are arranged onto one another in a column.

6. The ferroelectric memory device of claim 1, wherein the III-V based ferroelectric layer continuously extends past multiple conductive layers of the plurality of conductive layers.

7. The ferroelectric memory device of claim 1, wherein the III-V based ferroelectric layer is a single-layer structure.

8. The ferroelectric memory device of claim 1, wherein the III-V based ferroelectric layer is a multi-layer structure comprising two III-V based materials and one non III-V layer between the two III-V based materials.

9. A ferroelectric memory device, comprising:
   a multi-layer stack disposed on a substrate and comprising a plurality of gate electrode layers and a plurality of dielectric layers stacked alternately;
   a plurality of dielectric pillars disposed on the substrate and penetrating through the multi-layer stack;
   a channel layer disposed between the multi-layer stack and each of the plurality of dielectric pillars; and
   a ferroelectric layer disposed between the channel layer and the multi-layer stack, wherein portions of the ferroelectric layer contacting the plurality of gate electrode layers have first columnar-like grains with a long-axis direction perpendicular to a contacting surface of each of the plurality of gate electrode layers.

10. The ferroelectric memory device of claim 9, wherein the ferroelectric layer comprises at least one element selected from Group III elements, at least one element selected from Group V elements, and at least one element selected from transition metal elements.

11. The ferroelectric memory device of claim 9, wherein the ferroelectric layer comprises AlScN, AlYN, GaScN, InScN, or a combination thereof.

12. The ferroelectric memory device of claim 9, wherein portions of the ferroelectric layer contacting the plurality of dielectric layers have second columnar-like grains with a second long-axis direction perpendicular to a contacting surface of each of the plurality of dielectric layers.

13. The ferroelectric memory device of claim 9, wherein portions of the ferroelectric layer contacting the plurality of dielectric layers have second columnar-like grains with a second long-axis direction non-perpendicular to a contacting surface of each of the plurality of dielectric layers.

14. The ferroelectric memory device of claim 9, wherein the portions of the ferroelectric layer contacting the plurality of gate electrode layers have a first grain dimension, portions of the ferroelectric layer contacting the plurality of dielectric layers have a second grain dimension different from the first grain dimension.

15. The ferroelectric memory device of claim 14, wherein the second grain dimension is less than the first grain dimension.

16. The ferroelectric memory device of claim 14, wherein the first grain dimension is 5-20 nm, and the second grain dimension is less than 1-5 nm.

17. The ferroelectric memory device of claim 9, wherein portions of the ferroelectric layer contacting the channel layer have third columnar-like grains with a third long-axis direction perpendicular to a contacting surface of the channel layer.

18. A ferroelectric memory device, comprising:
   a plurality of conductive layers and a plurality of dielectric layers alternately stacked over a substrate;
   a ferroelectric layer disposed along sidewalls of the plurality of conductive layers and the plurality of dielectric layers, wherein the ferroelectric layer comprises a Group III element, a Group V element, and a transition metal;
   a channel layer arranged on a sidewall of the ferroelectric layer facing away from the plurality of conductive layers; and a conductive material arranged on a sidewall of the channel layer, the channel layer separating the conductive material from the ferroelectric layer.

19. The ferroelectric memory device of claim 18, further comprising:
   a dielectric material having a first sidewall contacting the channel layer and an adjacent second sidewall contacting the conductive material; and
   an isolation pillar contacting sidewalls of the conductive material and the channel layer, wherein the isolation pillar extends through the channel layer to contact the ferroelectric layer.

20. The ferroelectric memory device of claim 19, wherein the ferroelectric layer covers an entirety of a sidewall of the channel layer facing the plurality of conductive layers.

* * * * *